US009837460B2

(12) United States Patent
Takeuchi et al.

(10) Patent No.: US 9,837,460 B2
(45) Date of Patent: Dec. 5, 2017

(54) SEMICONDUCTOR DEVICE AND MANUFACTURING METHOD THEREOF

(71) Applicant: Renesas Electronics Corporation, Tokyo (JP)

(72) Inventors: Yosuke Takeuchi, Tokyo (JP); Tatsuya Kunikiyo, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/363,585

(22) Filed: Nov. 29, 2016

(65) Prior Publication Data

US 2017/0186804 A1 Jun. 29, 2017

(30) Foreign Application Priority Data

Dec. 28, 2015 (JP) .................................. 2015-256599

(51) Int. Cl.
*H01L 27/146* (2006.01)
*H01L 31/11* (2006.01)

(52) U.S. Cl.
CPC .. *H01L 27/14645* (2013.01); *H01L 27/14612* (2013.01); *H01L 27/14621* (2013.01); *H01L 27/14627* (2013.01); *H01L 27/14643* (2013.01); *H01L 27/14698* (2013.01); *H01L 31/1105* (2013.01)

(58) Field of Classification Search
CPC ......................... H01L 31/1016; H01L 31/1129
See application file for complete search history.

(56) References Cited

U.S. PATENT DOCUMENTS

| 5,965,875 | A | 10/1999 | Merrill |
| 7,453,110 | B2 | 11/2008 | Hwang |
| 7,777,259 | B2 | 8/2010 | Kim |
| 7,875,916 | B2 | 1/2011 | Stevens et al. |
| 2008/0084490 | A1 | 4/2008 | Masagaki |
| 2008/0296475 | A1 | 12/2008 | Kim |

FOREIGN PATENT DOCUMENTS

| JP | 2007-180539 A | 7/2007 |
| JP | 2008-91840 A | 4/2008 |
| JP | 2008-300826 A | 12/2008 |
| JP | 2008-300835 A | 12/2008 |
| JP | 2009-510777 A | 3/2009 |

*Primary Examiner* — Cheung Lee
(74) *Attorney, Agent, or Firm* — Sughrue Mion, PLLC

(57) ABSTRACT

An improvement is achieved in the performance of a semiconductor device. A semiconductor device includes an $n^-$-type semiconductor region formed in a p-type well, an n-type semiconductor region formed closer to a main surface of a semiconductor substrate than the $n^-$-type semiconductor region, and a $p^-$-type semiconductor region formed between the $n^-$-type semiconductor region and the n-type semiconductor region. A net impurity concentration in the $n^-$-type semiconductor region is lower than a net impurity concentration in the n-type semiconductor region. A net impurity concentration in the $p^-$-type semiconductor region is lower than a net impurity concentration in the p-type well.

15 Claims, 28 Drawing Sheets

SEMICONDUCTOR DEVICE AND MANUFACTURING METHOD THEREOF

CROSS-REFERENCE TO RELATED APPLICATIONS

The disclosure of Japanese Patent Application No. 2015-256599 filed on Dec. 28, 2015 including the specification, drawings and abstract is incorporated herein by reference in its entirety.

BACKGROUND

The present invention relates to a semiconductor device and a manufacturing method thereof which can be used appropriately for, e.g., a semiconductor device including a solid-state image sensing element and a manufacturing method thereof.

As a solid-state image sensing element (hereinafter referred to simply as an image sensing element) used in a digital camera or the like, a CMOS (Complementary Metal Oxide Semiconductor) image sensor using a CMOS has been intensively developed. The CMOS image sensor has a plurality of pixels which are arranged in a matrix pattern and each of which detects light. In each of the plurality of pixels, a photoelectric conversion element such as a photodiode which detects light and generates charges is formed. A photodiode PD is a pn-junction diode and includes, e.g., a plurality of n-type or p-type impurity regions, i.e., semiconductor regions.

U.S. Pat. No. 5,965,875 (Patent Document 1) discloses a technique in which, in an active pixel cell imaging array, an N-type region is formed over a P-type silicon substrate, a P-type region is formed over the N-type region, and an N-type region is further formed over the P-type region. Japanese Unexamined Patent Publication No. 2007-180539 (Patent Document 2) discloses a technique in which a CMOS image sensor includes a blue photodiode region and a red photodiode region having a given gap between itself and the blue photodiode region and formed deeper than the blue photodiode region. Japanese Unexamined Patent Publication No. 2008-300835 (Patent Document 3) discloses a technique in which, in a vertical CMOS image sensor, a plurality of photodiodes are vertically formed to a predetermined depth in a substrate.

Japanese Unexamined Patent Publication No. 2008-91840 (Patent Document 4) discloses a technique in which, in a solid-state image sensing device in which a plurality of pixels each having a photodiode and a transistor which reads the charges obtained by the photodiode are arranged to form an image sensing region, an independent first-conductivity-type region separated from the photodiode and the transistor is provided. Japanese Translation of PCT Application No. 2009-510777 (Patent Document 5) discloses a technique in which an image sensor has a first-conductivity-type first layer extending over an entire image region and a second-conductivity-type second layer, the first layer is present between a substrate and the second layer, and a plurality of photodetectors are disposed in the second layer so as to be adjacent to the first layer. Japanese Unexamined Patent Publication No. 2008-300826 (Patent Document 6) discloses a technique in which a multi-well CMOS image sensor has a plurality of photodiodes formed vertically in a predetermined region of a substrate.

RELATED ART DOCUMENTS

Patent Documents

[Patent Document 1] U.S. Pat. No. 5,965,875
[Patent Document 2] Japanese Unexamined Patent Publication No. 2007-180539
[Patent Document 3] Japanese Unexamined Patent Publication No. 2008-300835
[Patent Document 4] Japanese Unexamined Patent Publication No. 2008-91840
[Patent Document 5] Japanese Translation of PCT Application No. 2009-510777
[Patent Document 6] Japanese Unexamined Patent Publication No. 2008-300826

SUMMARY

As a photodiode in a semiconductor device including such a CMOS image sensor, a photodiode can be considered which has an n-type semiconductor region formed to extend from the portion of a p-type well which is closer to the main surface of a semiconductor substrate, i.e., shallower portion of the p-type well to the portion of the p-type well which is further away from the main surface of the semiconductor substrate, i.e., deeper portion of the p-type well. This allows, even when light is incident on the portion of the p-type well which is further away from the main surface, the efficiency with which the incident light is absorbed by the photodiode and electrons are generated by photoelectric conversion, i.e., so-called internal quantum efficiency to be increased. However, when the incident light is incident on the portion of the p-type well which is further away from the main surface, a charge transfer efficiency cannot be increased, which degrades the performance of the semiconductor device including the photoelectric conversion element.

Other problems and novel features of the present invention will become apparent from a statement in the present specification and the accompanying drawings.

According to an embodiment, a semiconductor device includes a second semiconductor region having a second conductivity type and formed in a first semiconductor region having a first conductivity type, a third semiconductor region having the second conductivity type and formed closer to a main surface of a semiconductor substrate than the second semiconductor region, and a fourth semiconductor region having the first conductivity type and formed between the second and third semiconductor regions. The first, second, third, and fourth semiconductor regions form a photodiode. A net impurity concentration in the second semiconductor region is lower than a net impurity concentration in the third semiconductor region. A net impurity concentration in the fourth semiconductor region is lower than a net impurity concentration in the first semiconductor region.

According to another embodiment, a method of manufacturing a semiconductor device includes the steps of forming a second semiconductor region having a second conductivity type in a first semiconductor region having a first conductivity type, forming a third semiconductor region having the second conductivity type at a position closer to a main surface of a semiconductor substrate than the second semiconductor region, and forming a fourth semiconductor region having the first conductivity type between the second and third semiconductor regions. The first, second, third, and fourth semiconductor regions form a photodiode. A net impurity concentration in the second semiconductor region is lower than a net impurity concentration in the third semiconductor region. A net impurity concentration in the fourth semiconductor region is lower than a net impurity concentration in the first semiconductor region.

According to the embodiment, the performance of the semiconductor device can be improved.

DETAILED DESCRIPTION

Figure 1:
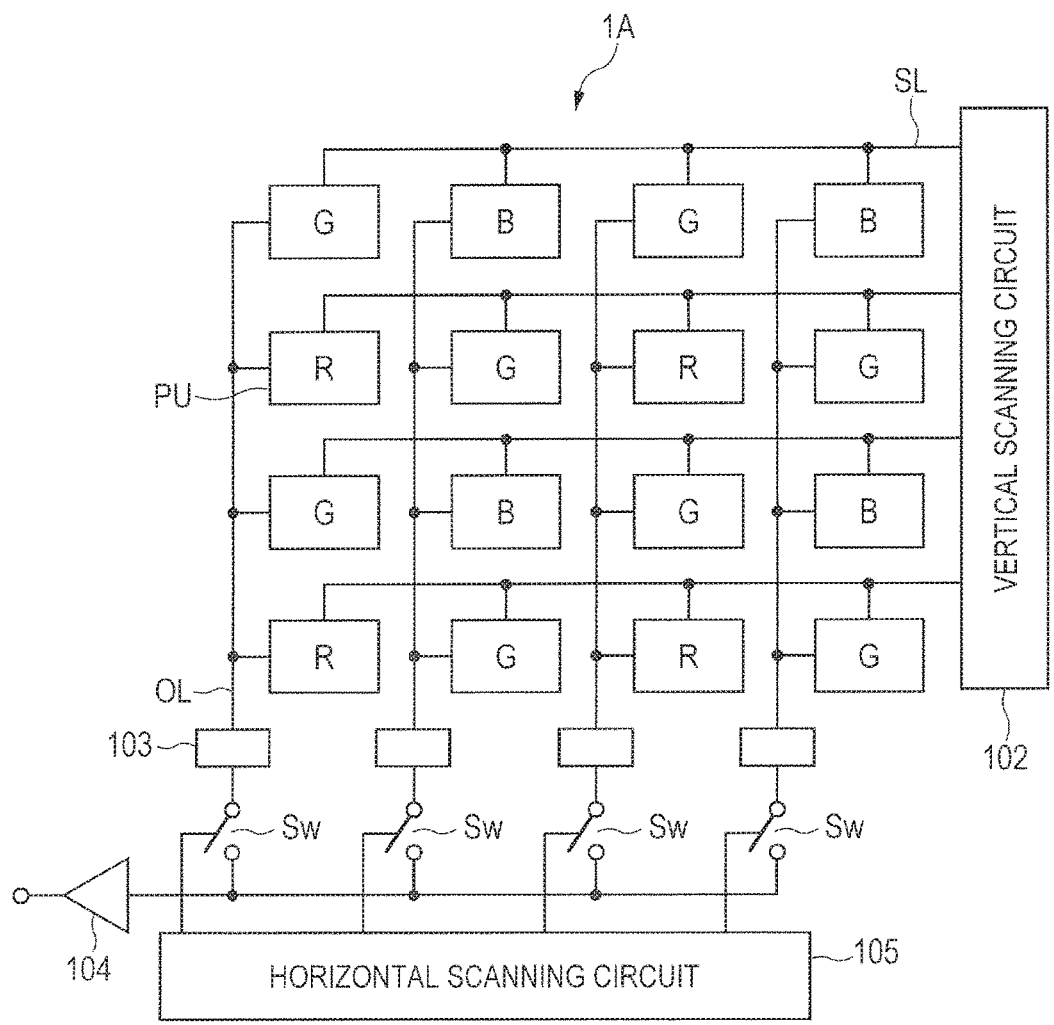
FIG. 1 is a circuit block diagram showing an example of a configuration of a semiconductor device in Embodiment 1.

In the following embodiments, if necessary for the sake of convenience, each of the embodiments will be described by being divided into a plurality of sections or embodiments. However, they are by no means irrelevant to each other unless particularly explicitly described otherwise, but are in relations such that one of the sections or embodiments is a modification, details, supplementary explanation, and so forth of part or the whole of the others.

Also, in the following embodiments, when the number and the like (including the number, numerical value, amount, range, and the like) of elements are referred to, they are not limited to specific numbers unless particularly explicitly described otherwise or unless they are obviously limited to specific numbers in principle. The number and the like of the elements may be not less than or not more than specific numbers.

Also, in the following embodiments, it goes without saying that the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in the following embodiments, the shapes and the like are assumed to include those substantially proximate or similar thereto and the like unless particularly explicitly described otherwise or unless it can be considered that they obviously do not in principle. The same shall apply in regard to the foregoing numerical value and range.

The following will describe the representative embodiments in detail on the basis of the drawings. Note that, throughout all the drawings for illustrating the embodiments, members having the same functions are designated by the same reference numerals, and a repeated description thereof is omitted. In the following embodiments, a description of the same or like parts will not be repeated in principle unless particularly necessary.

In the drawings used in the embodiments, hatching may be omitted even in a cross section for improved clarity of illustration, while even a plan view may be hatched for improved clarity of illustration.

In a cross-sectional view and a plan view, the sizes of individual portions do not correspond to those in a real device. For improved clarity of illustration, a specific portion may be shown in a relatively large size. Even when a plan view and a cross-sectional view correspond to each other, individual portions may be shown in varied sizes.

Note that, when a range is shown as "A to B" in the following embodiments, it is assumed that the range of not less than A and not more than B is shown thereby unless particularly explicitly described otherwise.

(Embodiment 1)

Referring to the drawings, a detailed description will be given of a structure of a semiconductor device in Embodiment 1 and a manufacturing process thereof. In Embodiment 1, a description will be given of an example in which a semiconductor device includes a CMOS image sensor.

<Configuration of Semiconductor Device>

Figure 2:
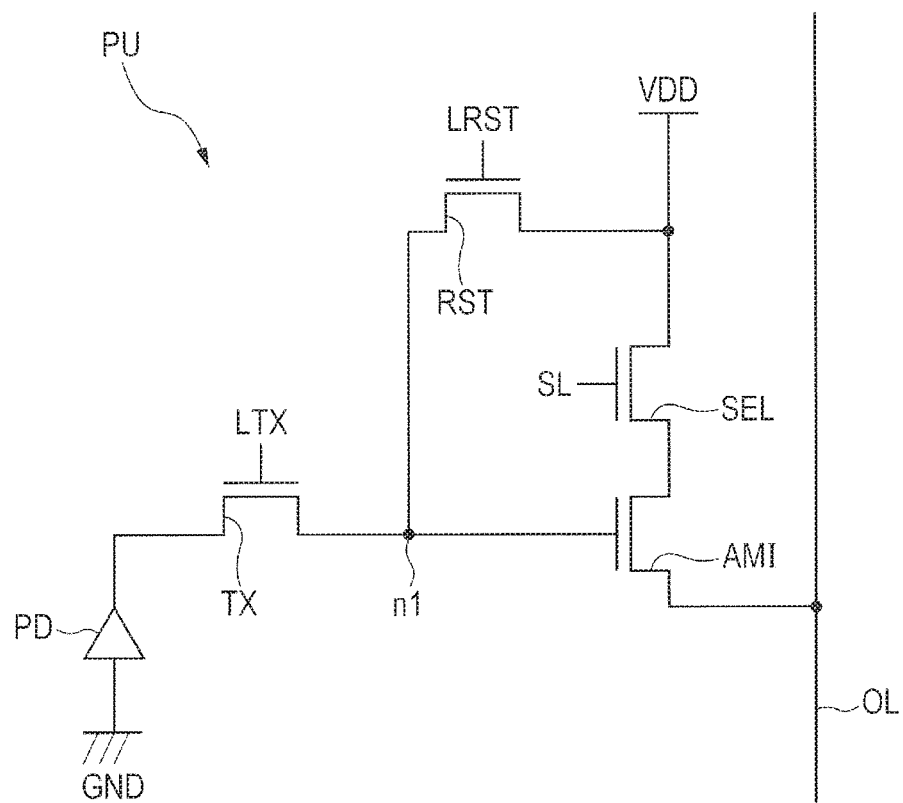
FIG. 2 is a circuit diagram showing an example of a configuration of a pixel.

FIG. 1 is a circuit block diagram showing an example of a configuration of the semiconductor device in Embodiment 1. FIG. 2 is a circuit diagram showing an example of a configuration of a pixel. Note that, in FIG. 1, 16 pixels arranged in the form of an array of 4 rows and 4 columns are shown, but the number of pixels actually used in an electronic device such as a camera may be several millions.

In a pixel region 1A shown in FIG. 1, a plurality of pixels PU are arranged in the form of an array. Around the pixels PU, drive circuits such as a vertical scanning circuit 102 and a horizontal scanning circuit 105 are disposed. That is, the semiconductor device in Embodiment 1 has a pixel array in which the plurality of pixels PU are arranged in the form of an array.

The pixels PU are disposed at respective points of intersection of selection lines SL and output lines OL. The selection lines SL are coupled to the vertical scanning circuit 102. The output lines OL are coupled to respective column circuits 103. The column circuits 103 are coupled to an output amplifier 104 via switches Sw. Each of the switches Sw is coupled to the horizontal scanning circuit 105 and controlled by the horizontal scanning circuit 105.

For example, an electric signal read from the pixel PU selected by the vertical scanning circuit 102 and the horizontal scanning circuit 105 is output via the output line OL and the output amplifier 104.

For example, as shown in FIG. 2, each of the pixels PU includes a photodiode PD and fourth MOSFETs. Each of the MOSFETs is of an n-channel type. The fourth MOSFETs are a reset transistor RST, a transfer transistor TX, a selection transistor SEL, and an amplification transistor AMI. The transfer transistor TX transfers charges generated by the photodiode PD. In addition to these transistors, another transistor or an element such as a capacitive element may also be included in the pixel PU. As a form in which these transistors are coupled to each other, various modifications can be used. MOSFET is the acronym of Metal Oxide Semiconductor Field Effect Transistor, which may be shown also as MISFET (Metal Insulator Semiconductor Field Effect Transistor). Also, FET is the acronym of Field Effect Transistor.

Note that, in the example shown in FIG. 1, a plurality of pixel groups each including the four pixels PU arranged in two rows and two columns are arranged in the form of an array. Each of the plurality of pixel groups includes one red (R) pixel PU, two green (G) pixels PU, and one blue (B) pixel PU. An arrangement of the four pixels PU including the one red (R) pixel PU, the two green (G) pixels PU, and the one blue (B) pixel that are thus arranged in two rows and two columns is referred to as a Bayer arrangement.

In the circuit example shown in FIG. 2, in each of the pixels PU, between a ground potential GND and a node n1, the photodiode PD and the transfer transistor TX are coupled in series to each other. Between the node n1 and a power supply potential VDD, the reset transistor RST is coupled. The power supply potential VDD is the potential of a power supply potential line. Between the power supply potential VDD and the output line OL, the selection transistor SEL and the amplification transistor AMI are coupled in series to each other. The gate electrode of the amplification transistor AMI is coupled to the node n1. The gate electrode of the reset transistor RST is coupled to a reset line LRST. The gate electrode of the selection transistor SEL is coupled to the selection line SL. The gate electrode of the transfer transistor TX is coupled to a transfer line LTX.

The photodiode PD generates charges by photoelectric conversion. The transfer transistor RX transfers the charges generated by the photodiode PD. The amplification transistor AMI amplifies a signal in accordance with the charges transferred by the transfer transistor TX. The selection transistor SEL selects the pixel PU including the photodiode PD and the transfer transistor TX. In other words, the selection transistor SEL selects the amplification transistor AMI. The reset transistor RST removes the charges from the photodiode PD.

For example, the transfer line LTX and the reset line LRST are raised to a "H" level to bring the transfer transistor TX and the reset transistor RST into an ON state. As a result, the charges are removed from the photodiode PD so that the photodiode PD is depleted. Then, the transfer transistor TX is brought into an OFF state.

Then, when, e.g., a shutter such as, e.g., the mechanical shutter of an electronic device such as a camera is opened, charges are generated from incident light in the photodiode and stored while the shutter is open. That is, the photodiode PD receives the incident light to generate charges. In other words, the photodiode receives the incident light and converts the received light to charges.

Then, after the shutter is closed, the reset line LRST is lowered to a "L" level to bring the reset transistor RST into the OFF state. In addition, the selection line SL and the transfer line LTX are raised to the "H" level to bring the selection transistor SEL and the transfer transistor TX into the ON state. Thus, the charges generated by the photodiode PD are transferred to the end portion (floating diffusion FD shown in FIG. 3 described later) of the transfer transistors TX which is coupled to the node n1. At this time, the signal to the floating diffusion FD, i.e., potential changes to a value corresponding to the charges transferred from photodiode PD. The value of the signal is amplified by the amplification transistor AMI to appear on the output line OL. The signal on the output line OL, i.e., potential serves as an electric signal (received light signal) to be read as an output signal from the output amplifier 104 via the column circuit 103 and the switch Sw.

Figure 3:
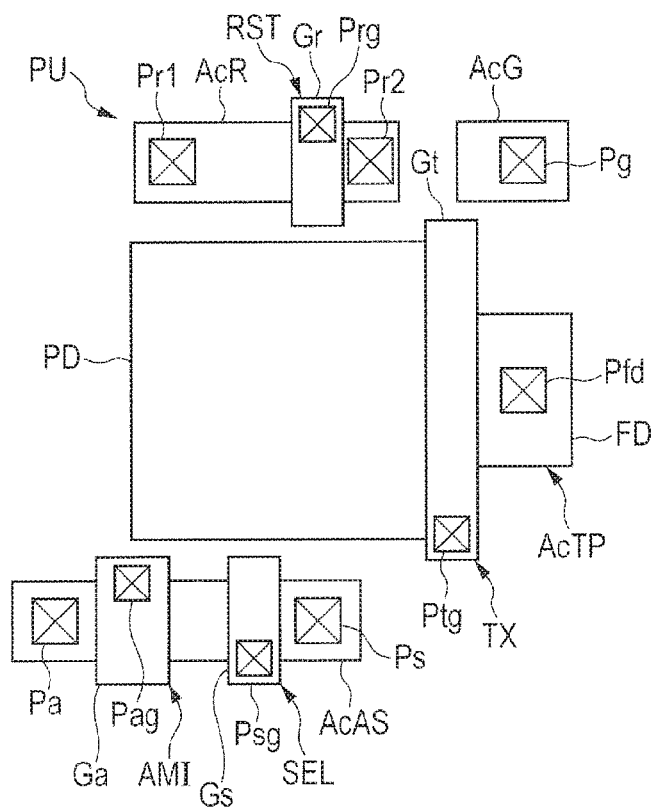
FIG. 3 is a plan view showing a configuration of a semiconductor device in Embodiment 1.

FIG. 3 is a plan view showing a configuration of the semiconductor device in Embodiment 1.

As shown in FIG. 3, each of the pixels PU in the semiconductor device in Embodiment 1 has an active region AcTP where the photodiode PD and the transfer transistor TX are disposed and an active region AcR where the reset transistor RST is disposed. The pixel PU also has an active region AcAS where the selection transistor SEL and the amplification transistor AMI are disposed and an active region AcG where a plug Pg coupled to the ground potential GND (see FIG. 2) is disposed.

In the active region AcR, a gate electrode Gr is disposed. Over source/drain regions on both sides thereof, plugs Pr1 and Pr2 are respectively disposed. The gate electrode Gr and the source/drain regions form the reset transistor RST.

In the active region AcTP, a gate electrode Gt is disposed. On one of both sides of the gate electrode Gt in plan view, the photodiode PD is disposed. On the other of both sides of the gate electrode Gt in plan view, the floating diffusion FD having the function of a charge storage portion or a floating diffusion layer is disposed. The photodiode PD is a pn junction diode and includes, e.g., a plurality of n-type or p-type impurity regions, i.e. semiconductor regions. The floating diffusion FD is formed of, e.g., an n-type impurity region, i.e., a semiconductor region. Over the floating diffusion FD, a plug Pfd is disposed.

Note that, in the present specification, the wording "in plan view" is used when an object is viewed from a direction perpendicular to a main surface $1a$ (see FIG. 5 described later) of a semiconductor substrate 1S.

In the active region AcAS, a gate electrode Ga and a gate electrode Gs are disposed. Over the end portion of the active region AcAS which is closer to the gate electrode Ga, a plug Pa is disposed. Over the end portion of the active region AcAS which is closer to the gate electrode Gs, a plug Ps is disposed. On both sides of each of the gate electrodes Ga and Gs, source/drain regions are provided. The gate electrodes Ga and Gs and the source/drain regions form the selection transistor SEL and the amplification transistor AMI which are coupled in series to each other.

Over the active region AcG, the plug Pg is disposed. The plug Pg is coupled to the ground potential GND (see FIG. 2). Accordingly, the active region AcG is a power supply region for applying the ground potential GND to a well region in the semiconductor substrate.

The foregoing plugs Pr1, Pr2, Pg, Pfd, Pa, and Ps are coupled to each other via a plurality of wiring layers (e.g., wires M1 to M3 shown in FIG. 5 described later). Also, the respective plugs Prg, Ptg, Pag, and Psg over the gate electrodes Gr, Gt, Ga, and Gs are coupled to each other via the plurality of wiring layers (e.g., wires M1 to M3 shown in FIG. 5 described later). Thus, the circuit shown in FIG. 1 can be configured.

Around the pixel region 1A (see FIG. 1), a peripheral circuit region (the illustration thereof is omitted) may also be provided and, in the peripheral circuit region, a logic transistor may also be disposed. The logic transistor includes an N-type MOSFET (NMOSFET) using electrons as carriers and a P-type MOSFET using holes as carriers. In the peripheral circuit region, a gate electrode is disposed over an active region and, on both sides of the gate electrodes and in the active region, source/drain regions are formed. Over the source/drain regions, plugs are disposed.

<Element Structure in Pixel Region>

Figure 4:
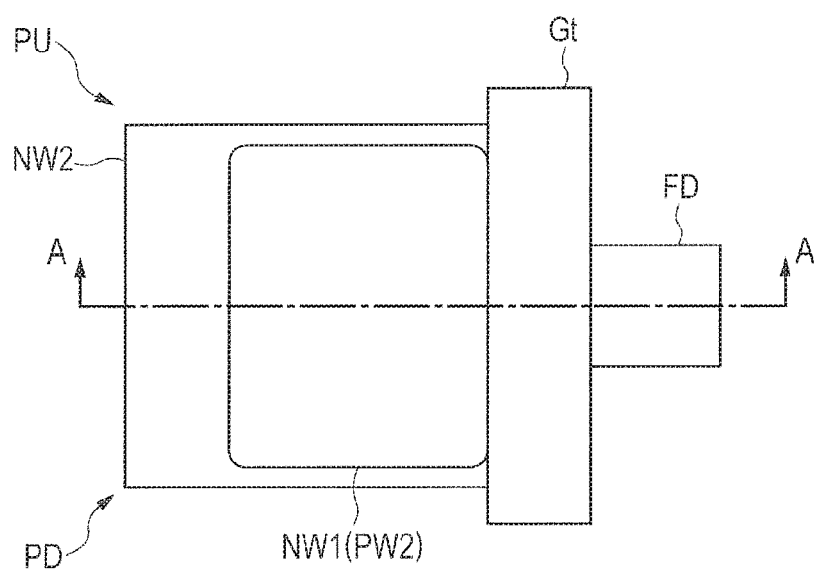
FIG. 4 is a plan view showing the configuration of the semiconductor device in Embodiment 1.

Next, a description will be given of an element structure in the pixel region. FIG. 4 is a plan view showing a configuration of the semiconductor device in Embodiment 1. FIGS. 5 and 6 are cross-sectional views each showing a configuration of the semiconductor device in Embodiment 1. Each of FIGS. 5 and 6 corresponds to a cross section along the line A-A in FIG. 4. Note that FIGS. 4 and 5 show the element structure in the pixel region 1A (see FIG. 1) (the same applies also to the following cross-sectional views each showing the configuration of the semiconductor device). In FIG. 6, the illustration of the portion of FIG. 5 which is located above the photodiode PD and the transfer diode TX and of the portion of FIG. 5 which is located below a p-type well PW1 is omitted.

Figure 5:
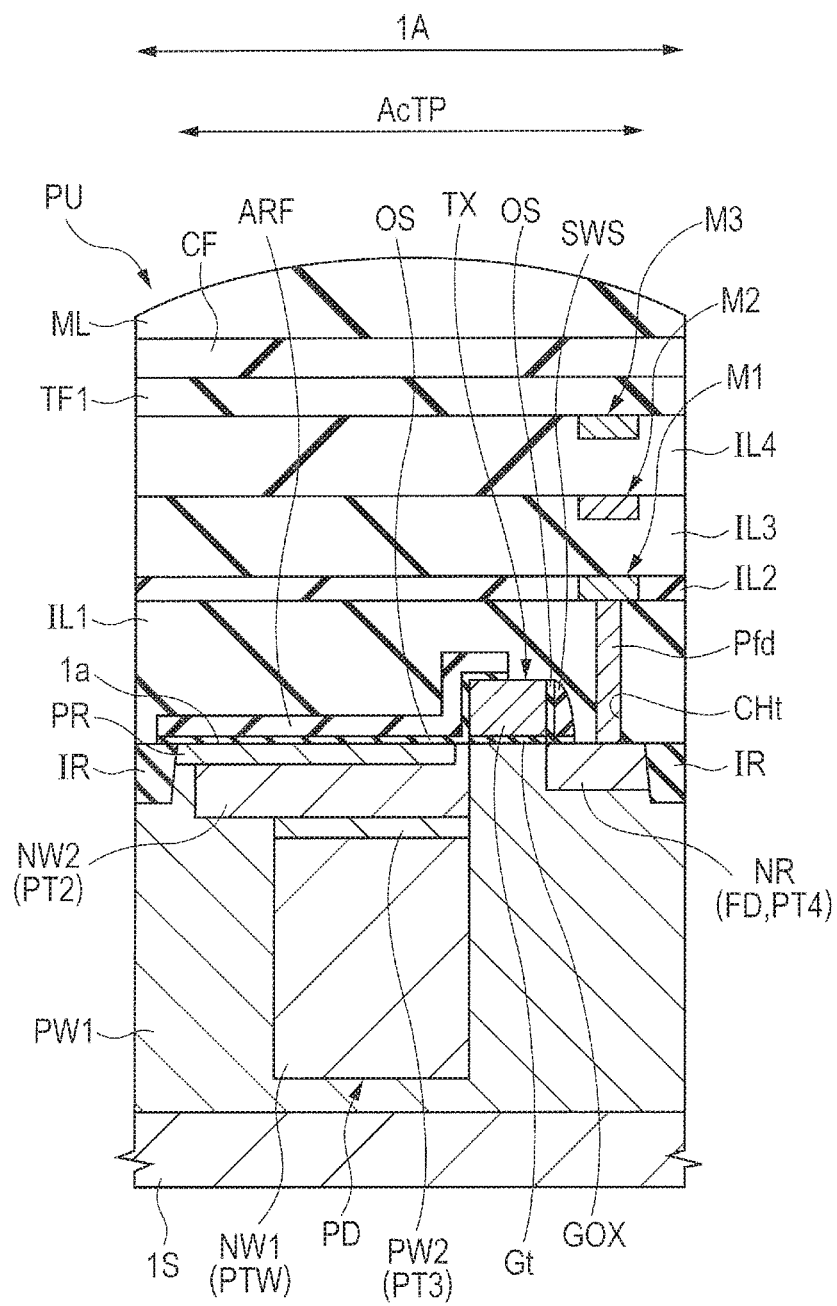
FIG. 5 is a cross-sectional view showing the configuration of the semiconductor device in Embodiment 1.
Figure 6:
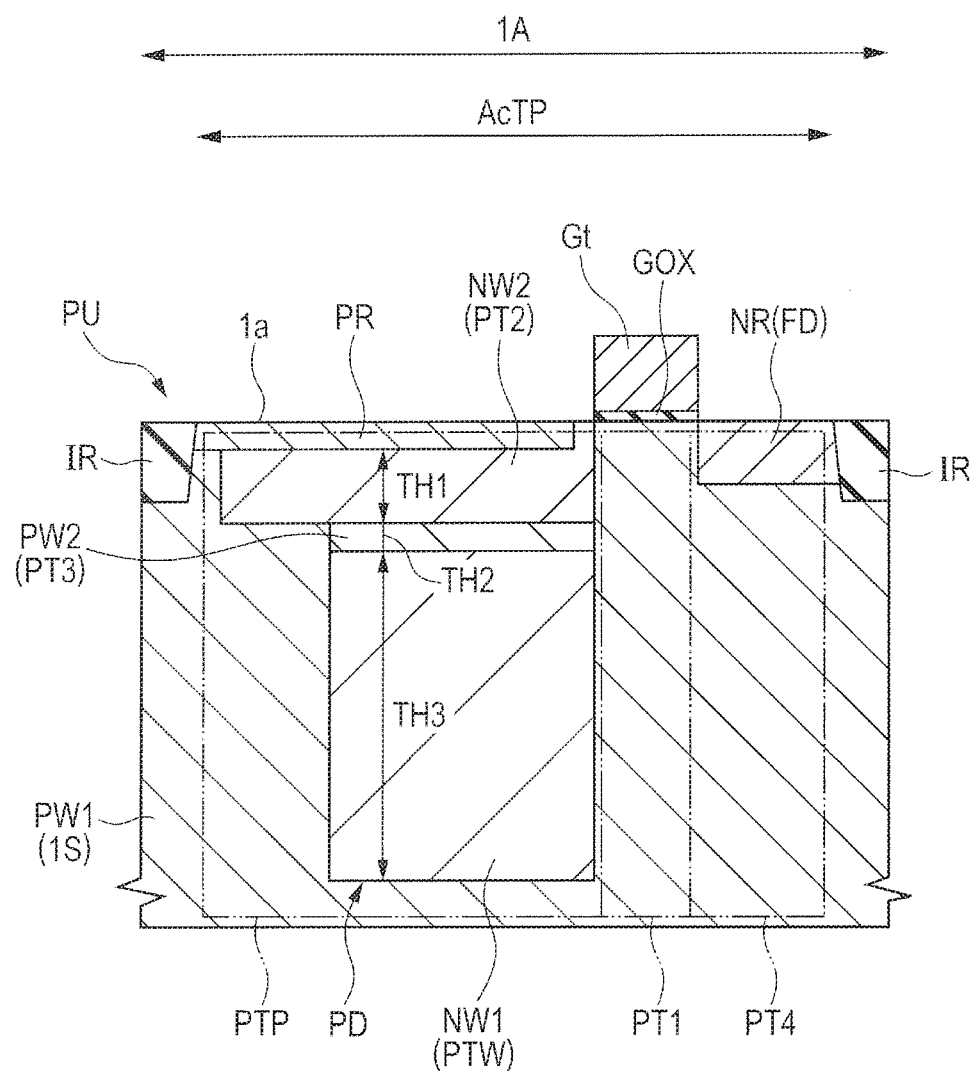
FIG. 6 is a cross-sectional view showing the configuration of the semiconductor device in Embodiment 1.

As shown in FIGS. 5 and 6, the semiconductor device in Embodiment 1 includes the semiconductor substrate 1S and the active region AcTP as the semiconductor region formed in the pixel region 1A as a local region of the semiconductor substrate 1S which is closer to the main surface $1a$. In the active region AcTP, the pixel PU is formed. That is, the semiconductor device in Embodiment 1 includes the pixel PU. The pixel PU has the photodiode PD as a photoelectric conversion element.

The pixel PU has the p-type well PW1, an n⁻-type semiconductor region NW1, the gate electrode Gt, an n-type semiconductor region NW2, a p⁻-type semiconductor region PW2, and a higher-concentration n-type semiconductor region NR.

As shown in FIGS. 5 and 6, in the active region AcTP of the pixel region 1A as the local region of the semiconductor substrate 1S which is closer to the main surface $1a$, the photodiode PD including the p-type well PW1, the n⁻-type semiconductor region NW1, the p⁻-type semiconductor region PW2, and the n-type semiconductor region NW2 and the transfer transistor TX are formed. Note that, in the active region of the pixel region 1A, the amplification transistor AMI, the selection transistor SEL, and the reset transistor RST which have been described using FIG. 2 may also be formed, though the illustration thereof is omitted in FIGS. 5 and 6. Also, in the active region of the peripheral circuit region as another region of the semiconductor substrate 1S which is closer to the main surface $1a$, a transistor such as a logic transistor may also be formed, though the illustration thereof is omitted in FIGS. 5 and 6.

The semiconductor substrate 1S is made of monocrystalline silicon containing an n-type impurity (donner) such as, e.g., phosphorus (P) or arsenic (As). Around the outer periphery of the active region AcTP, an isolation region IR is disposed. Thus, the exposed region of the semiconductor substrate 1S which is surrounded by the isolation region IR serves as an active region such as the active region AcTP.

In the active region AcTP of the pixel region 1A, the p-type well PW1 is formed as a semiconductor region into which a p-type impurity such as, e.g., boron (B) has been introduced. The p-type well PW1 is formed, i.e., disposed in the semiconductor substrate 1S to be closer to the main surface 1a. The conductivity type of the p-type well PW1 is a p-type, which is opposite to an n-type as the conductivity type of the semiconductor substrate 1S.

Note that having the p-type conductivity type means that majority carriers in a semiconductor are holes and having the n-type conductivity type means that majority carriers in a semiconductor are electrons.

In an inner portion PTW of the p-type well PW1, the n$^-$-type semiconductor region NW1 into which an n-type impurity such as, e.g., phosphorus (P) or arsenic (As) has been introduced is formed to be away from the main surface 1a. That is, the n$^-$-type semiconductor region NW1 is included in the p-type well PW1. The conductivity type of the n$^-$-type semiconductor region NW1 is the n-type.

Over a portion PT1 (see FIG. 6) of the p-type well PW1 which is located on a first side (right side in FIG. 5) of the n$^-$-type semiconductor region NW1 in plan view, the gate electrode Gt is formed, i.e., disposed via a gate insulating film GOX. The portion PT1 corresponds to the portion of the p-type well PW1 which is located on the first side (right side in FIG. 5) of the n$^-$-type semiconductor region NW1 in the gate length direction of the gate electrode Gt in plan view. The gate insulating film GOX is made of, e.g., a silicon dioxide film. The gate electrode Gt is made of, e.g., a polycrystalline silicon film (polysilicon film).

In a portion PT2 of the p-type well PW1 which is located closer to the main surface 1a than the n$^-$-type semiconductor region NW1, the n-type semiconductor region NW2 into which an n-type impurity such as, e.g., phosphorus (P) or arsenic (As) has been introduced is formed. That is, the n-type semiconductor region NW2 is included in the p-type well PW1 and disposed closer to the main surface 1a than the n$^-$-type semiconductor region NW1. The conductivity type of the n-type semiconductor region NW2 is the n-type.

A net impurity concentration in the n$^-$-type semiconductor region NW1 which is obtained by subtracting a p-type impurity concentration from an n-type impurity concentration is lower than a net impurity concentration in the n-type semiconductor region NW2 which is obtained by subtracting the p-type impurity concentration from the n-type impurity concentration. This allows the n$^-$-type semiconductor region NW1 to be easily depleted.

Specifically, the net impurity concentration in the n$^-$-type semiconductor region NW1 which is obtained by subtracting the p-type impurity concentration from the n-type impurity concentration can be set to, e.g., about $1 \times 10^{15}$ to $1 \times 10^{16}$ cm$^{-3}$. Also, the net impurity concentration in the n-type semiconductor region NW2 which is obtained by subtracting the p-type impurity concentration from the n-type impurity concentration can be set to, e.g., about $1 \times 10^{16}$ to $1 \times 10^{17}$ cm$^{-3}$.

In a portion PT3 of the p-type well PW1 which is located between the n$^-$-type semiconductor region NW1 and the n-type semiconductor region NW2, the p$^-$-type semiconductor region PW2 is formed. That is, the p$^-$-type semiconductor region PW2 is located between the n$^-$-type semiconductor region NW1 and the n-type semiconductor region NW2. The conductivity type of the p$^-$-type semiconductor region PW2 is the p-type. The surface of the p$^-$-type semiconductor region PW2 which is opposite to the main surface 1a is in contact with the n$^-$-type semiconductor region NW1. The surface of the p$^-$-type semiconductor region PW2 which is closer to the main surface 1a is in contact with the n-type semiconductor region NW2.

A net impurity concentration in the p$^-$-type semiconductor region PW2 which is obtained by subtracting the n-type impurity concentration from the p-type impurity concentration is lower than a net impurity concentration in the p-type semiconductor region PW1 which is obtained by subtracting the n-type impurity concentration from the p-type impurity concentration. This reduces the likelihood of the depletion of the p-type well PW1 and increases the likelihood of the depletion of the p$^-$-type semiconductor region PW2. As described above, since the net impurity in the n$^-$-type semiconductor region NW1 is lower than the net impurity concentration in the n-type semiconductor region NW2, it is possible to continuously deplete the p$^-$-type semiconductor region PW2 and the n$^-$-type semiconductor region NW1 in a depth direction.

Specifically, the net impurity concentration in the p-type well PW1 which is obtained by subtracting the n-type impurity concentration from the p-type impurity concentration can be set to, e.g., about $1 \times 10^{16}$ to $1 \times 10^{7}$ cm$^{-3}$. Also, the net impurity concentration in the p$^-$-type well PW2 which is obtained by subtracting the n-type impurity concentration from the p-type impurity can be set to, e.g., about $1 \times 10^{15}$ to $1 \times 10^{16}$ cm$^{-3}$.

In a portion PT4 (see FIG. 6) of the p-type well PW1 which is located opposite to the n$^-$-type semiconductor region NW1 relative to the gate electrode Gt interposed therebetween in plan view, the higher-concentration n-type semiconductor region NR into which an n-type impurity such as, e.g., phosphorus (P) or arsenic (As) has been introduced is formed, i.e., disposed. Preferably, the higher-concentration n-type semiconductor region NR is formed, i.e., disposed in the upper-layer portion of the portion PT4. An n-type impurity concentration in the higher-concentration n-type semiconductor region NR is higher than the n-type impurity concentration in the n-type semiconductor region NW2.

The p-type well PW1, the n$^-$-type semiconductor region NW1, the n-type semiconductor region NW2, and the p$^-$-type semiconductor region PW2 form the photodiode PD. The photodiode PD is formed in a portion PTP (see FIG. 6) of the p-type well PW1 which is located on the side (left side in FIG. 5) of the gate electrode Gt which is opposite to the first side.

On the other hand, the gate electrode Gt and the higher-concentration n-type semiconductor region NR form the transfer transistor TX which transfers the charges generated in the photodiode PD. That is, the gate electrode Gt is the gate electrode of the transfer transistor TX. The higher-concentration n-type semiconductor region NR is the drain region of the transfer transistor TX and is also a semiconductor region as the floating diffusion FD having the function of the charge storage portion or the floating diffusion layer.

That is, in the semiconductor device in Embodiment 1, the pixel PU has the p-type well PW1, the gate electrode Gt, the n$^-$-type semiconductor region NW1, the n-type semiconductor region NW2, the p$^-$-type semiconductor region PW2, and the higher-concentration n-type semiconductor region NR.

In the main surface 1a of the n-type semiconductor region NW2, a p$^+$-type semiconductor region PR may also be formed. The p-type impurity concentration in the p$^+$-type semiconductor region PR is higher than the p-type impurity concentration in the portion of the p-type well PW1 which is other than the portion thereof where the p$^+$-type semiconductor region PR is formed. The p$^+$-type semiconductor region PR is formed to suppress the generation of electrons based on a large number of interface states formed at the top surface of the semiconductor substrate 1S. That is, in the top surface region of the semiconductor substrate 1S, under the influence of the interface states, electrons may be generated even in the absence of light illumination to cause an increase in dark current. Accordingly, by forming the p$^+$-type semiconductor region PR using holes as majority carriers in the top surface of the n-type semiconductor region NW2 using electrons as majority carriers, it is possible to suppress the generation of electrons in the absence of light illumination and suppress an increase in dark current.

At this time, the p-type well PW1, the n$^-$-type semiconductor region NW1, the n-type semiconductor region NW2, the p$^-$-type semiconductor region PW2, and the p$^+$-type semiconductor region PR form the photodiode PD. Of the p-type well PW1, the portion where the n$^-$-type semiconductor region NW1, the n-type semiconductor region NW2, the p$^-$-type semiconductor region PW2, and the p$^+$-type semiconductor region PR are formed corresponds to the portion PTP.

Note that, in the pixel region 1A, a p$^+$-type semiconductor region may also be formed so as to surround the pixel PU. The p$^+$-type semiconductor region can be formed in, e.g., the portion of the p-type well PW1 which is located under the isolation region IR. The p-type impurity concentration in the p$^+$-type semiconductor region is higher than the p-type impurity concentration in the portion of the p-type well PW1 which is other than the portion thereof where the p$^+$-type semiconductor region is formed. This can inhibit the transfer of the charges generated by photoelectric conversion as a result of the incidence of incident light on a given one of the pixels PU by the transfer transistor TX of another one of the pixels PU which is adjacent to the pixel PU, i.e., inhibit cross talk between the adjacent pixels PU.

In the top surface of the photodiode PD, i.e., in the respective top surfaces of the n-type semiconductor region NW2 and the p$^+$-type semiconductor region PR, offset spacers OS each made of, e.g., a silicon nitride film or a silicon dioxide film are formed. The offset spacers OS are formed so as to hold the surface property, i.e., interface property of the semiconductor substrate 1S excellent. Over the offset spacer OS, an antireflection film ARF made of a silicon dioxide film is formed. That is, the antireflection film ARF is formed over each of the n-type semiconductor region NW2 and the p$^+$-type semiconductor region PR via the offset spacer OS. A portion (end portion) of each of the antireflection film ARF and the offset spacer OS lies over the gate electrode Gt.

Over the side wall of the gate electrode Gt which is closer to the higher-concentration n-type semiconductor region NR, i.e., which is opposite to the photodiode PD, a sidewall spacer SWS is formed via the offset spacer OS.

As shown in FIG. 5, in the pixel region 1A, an interlayer insulating film IL1 is formed so as to cover the semiconductor substrate 1S including the gate electrode Gt and the antireflection film ARF. The plug Pfd is formed to extend through the interlayer insulating film IL1 and reach the higher-concentration n-type semiconductor region NR as the floating diffusion FD. That is, in the pixel region 1A, the interlayer insulating film IL1 is formed over the main surface 1a of the semiconductor substrate 1S so as to cover the photodiode PD via the antireflection film ARF and the offset spacers OS.

The interlayer insulating film IL1 is made of a silicon dioxide film using, e.g., TEOS (Tetra Ethyl Ortho Silicate) as a raw material. In the interlayer insulating film IL1, a contact hole CHt is formed. In the contact hole CHt, e.g., a barrier conductor film including a titanium film and a titanium nitride film formed over the titanium film and a main conductor film made of a tungsten film formed over the barrier conductor film are embedded to thus form the plug Pfd.

Note that plugs not shown in FIGS. 5 and 6 are also formed in the interlayer insulating film IL1. Also, the reset transistor RST, the selection transistor SEL, and the amplification transistor AMI have respective gate electrodes formed over the p-type well PW1 via gate insulating films and respective source/drain regions formed in the p-type well PW1 located on both sides of the gate electrodes (see FIG. 2). The selection transistor SEL and the amplification transistor AMI, which are coupled in series to each other, share one of the source/drain regions (see FIG. 2).

In the pixel region 1A, over the interlayer insulating film IL1, e.g., an interlayer insulating film IL2 is formed. In the interlayer insulating film IL2, the wires M1 are formed. The interlayer insulating film IL2 is formed of, e.g., a silicon dioxide film, but the film forming the interlayer insulating film IL2 is not limited thereto. The interlayer insulating film IL2 can also be formed of a low-dielectric-constant film having a dielectric constant lower than that of the silicon dioxide film. Examples of the low-dielectric-constant film include a carbon-containing silicon oxide (SiOC) film. The wires M1 are formed of, e.g., copper (Cu) wires and can be formed using a damascene method. Note that the wires M1 are not limited to the copper wires and can also be formed of aluminum (Al) wires.

Over the interlayer insulating film IL2 in which the wires M1 are formed, an interlayer insulating film IL3 made of, e.g., a silicon dioxide film or a low-dielectric-constant film is formed. In the interlayer insulating film IL3, the wires M2 are formed. Over the interlayer insulating film IL3 in which the wires M2 are formed, an interlayer insulating film IL4 is formed. In the interlayer insulating film IL4, the wires M3 are formed. The wires M1 to M3 form the wiring layers.

In the pixel region 1A, the wires M1 to M3 are formed so as not to two-dimensionally overlap the photodiode PD. This is intended to prevent the light incident on the photodiode PD from being blocked by the wires M1 to M3.

In the pixel region 1A, over the interlayer insulating film IL4, a color filter layer CF is formed. The color filter layer CF is a film which transmits a light beam in a specified color such as, e.g., red (R), green (G), or blue (B) and does not transmit a light beam in another color. Note that, between the color filter layer CF and the interlayer insulating film IL4, a transmission film TF1 made of, e.g., a silicon dioxide film may also be formed.

Also, in the pixel region 1A, a microlens ML as an on-chip lens is attached onto the color filter layer CF so as to overlap the photodiode PD in plan view.

In FIG. 5, when the pixel PU is illuminated with light, the incident light first passes through the microlens ML. Then, after passing through the interlayer insulating films IL4 to IL1 which are transparent to visible light, the light is incident on the antireflection film ARF. The antireflection film ARF prevents the reflection of the incident light so that the incident light is incident in a sufficient amount on the photodiode PD.

In the photodiode PD, the energy of the incident light is larger than the band gap of silicon so that the incident light is absorbed by photoelectric conversion to generate hole-electron pairs. The electrons generated at this time are stored in the n-type semiconductor region NW2. The generated electrons are stored also in the n$^-$-type semiconductor region NW1, which will be described later in detail using FIG. 12.

Then, with appropriate timing, the transfer transistor TX is turned ON. Specifically, to the gate electrode Gt of the transfer transistor TX, a voltage of not less than a threshold voltage is applied. Consequently, in the portion of the p-type well PW1 which is located under the gate electrode Gt, a channel region is formed. This provides electric conduction between the n-type semiconductor region NW2 as the source region of the transfer transistor TX and the higher-concentration n-type semiconductor region NR as the drain region of the transfer transistor TX. As a result, the electrons stored in the n-type semiconductor region NW2 pass through the channel region and reach the drain region to be retrieved from the drain region to an external circuit through the wiring layers.

<About Distribution of Potential Energy in Depth Direction>

Figure 7:
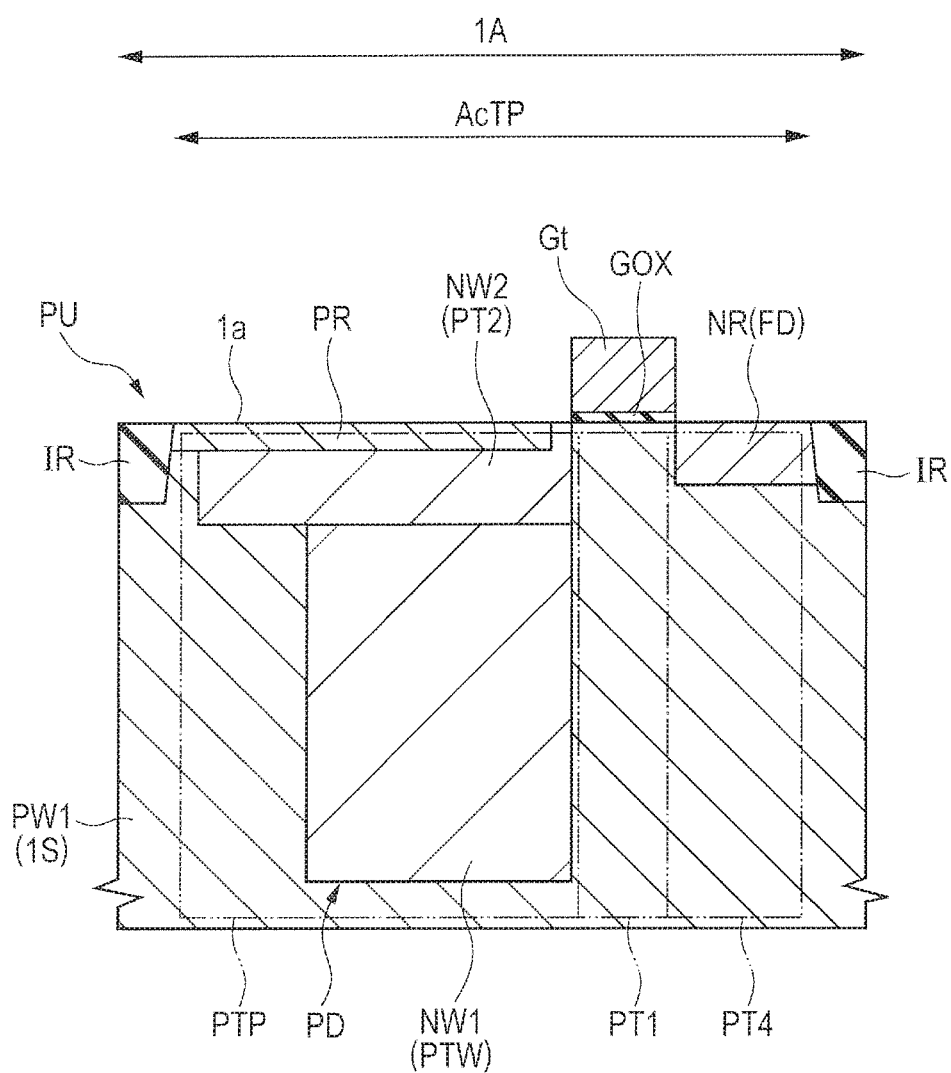
FIG. 7 is a cross-sectional view showing a configuration of a semiconductor device in a comparative example.

Next, referring to a semiconductor device in a comparative example, a description will be given of the distribution of a potential energy in the depth direction in a photodiode. FIG. 7 is a cross-sectional view showing a configuration of the semiconductor device in the comparative example. In FIG. 7, in the same manner as in FIG. 6, the illustration of the portion located above the photodiode PD and the transmission transistor TX and the portion located below the p-type well PW1 is omitted.

Note that, in the present specification, the depth direction means a direction perpendicular to the main surface 1a of the semiconductor substrate 1S.

Figure 8:
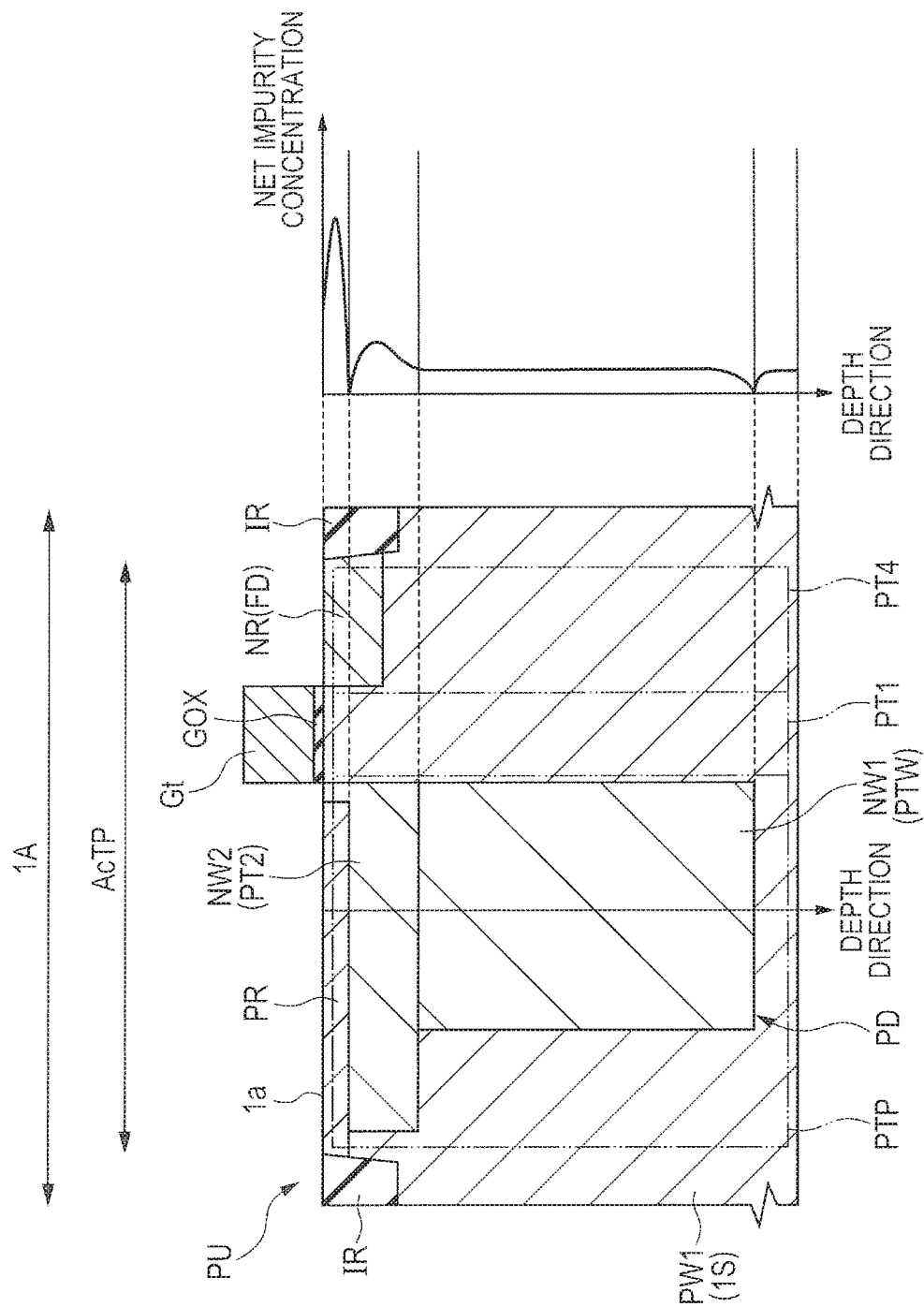
FIG. 8 is a view for illustrating a distribution of a net impurity concentration in a depth direction in a photodiode in the semiconductor device in the comparative example.
Figure 9:
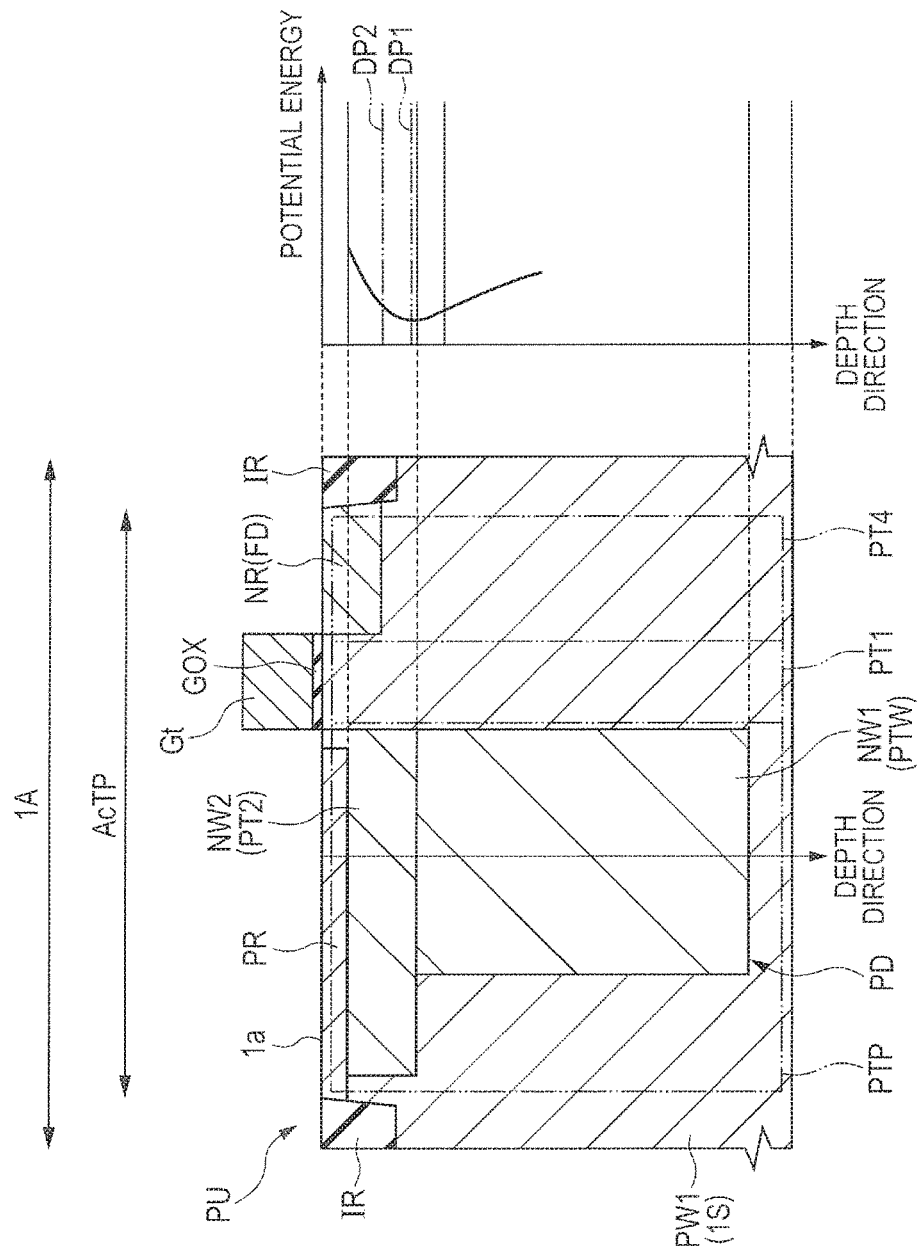
FIG. 9 is a view for illustrating the distribution of a potential energy in the depth direction in the photodiode of the semiconductor device in the comparative example.

FIG. 8 is a view for illustrating the distribution of a net impurity concentration in the depth direction in the photodiode of the semiconductor device in the comparative example. FIG. 9 is a view for illustrating the distribution of the potential energy in the depth direction in the photodiode of the semiconductor device in the comparative example. FIG. 8 shows a graph schematically showing the distribution of the net impurity concentration in the depth direction in the photodiode of the semiconductor device in the comparative example. FIG. 9 shows, in addition to the cross-sectional view shown in FIG. 7, a graph schematically showing the distribution of the potential energy in the depth direction in the photodiode of the semiconductor device in the comparative example. Note that the distribution of the potential energy shown in the schematic graph of FIG. 9 means the distribution of a conduction band energy. FIG. 9 also shows the distribution of the potential energy in the n-type semiconductor region NW2 and a portion of the n⁻-type semiconductor region NW1 of the photodiode PD.

As shown in FIG. 7, the semiconductor device in the comparative example is different from the semiconductor device in Embodiment 1 in that the p⁻-type semiconductor region PW2 (see FIG. 6) is not formed between the n⁻-type semiconductor region NW1 and the n-type semiconductor region NW2. That is, in the semiconductor device in the comparative example, the pixel PU has the p-type well PW1, the gate electrode Gt, the n⁻-type semiconductor region NW1, the n-type semiconductor region NW2, and the higher-concentration n-type semiconductor region NR, but does not include the p⁻-type semiconductor region PW2 (see FIG. 6). Consequently, the n⁻-type semiconductor region NW1 is in contact with the n-type semiconductor region NW2. Also, the p-type well PW1, the n⁻-type semiconductor region NW1, and the n-type semiconductor region NW2 form the photodiode PD. The semiconductor device in the comparative example is otherwise the same as the semiconductor device in Embodiment 1.

As shown in FIG. 7, in the semiconductor device in the comparative example, the n⁻-type semiconductor region NW1 is formed under the n-type semiconductor region NW2, i.e., formed opposite to the main surface 1a relative to the n-type semiconductor region NW2 interposed therebetween. That is, the semiconductor device in the comparative example is similar to the semiconductor device in Embodiment 1, but the photodiode PD is formed to extend from the main surface 1a of the semiconductor substrate 1S to a deeper position in the p-type well PW1 than in the case where the n⁻-type semiconductor region NW1 is not formed.

Among red (R), green (G), and blue (B) incident light beams, the red (R) incident light beam is longer in the distance from the main surface 1a of the semiconductor substrate 1S to the position reached thereby in the depth direction than the green (G) incident light beam having a wavelength shorter than the wavelength of the red (R) incident light beam. Also, the green (G) incident light beam is longer in the distance from the main surface 1a of the semiconductor substrate 1S to the position reached thereby in the depth direction than the blue (B) incident light beam having a wavelength shorter than the wavelength of the green (G) incident light beam. Consequently, particularly in the red (R) pixel PU, the incident light beam is incident on the portion of the p-type well PW1 which is further away from the main surface 1a. Accordingly, by forming the n⁻-type semiconductor region NW1 under the n-type semiconductor region NW2, the efficiency with which electrons are generated by photoelectric conversion as a result of the absorption of the incident light by the photodiode PD, i.e., so-called internal quantum efficiency can be increased.

However, in the case where the n⁻-type semiconductor region NW1 is formed under the n-type semiconductor region NW2, the efficiency with which electrons as the charges generated in the photodiode PD are transferred by the transfer transistor TX, i.e., charge transfer efficiency tends to decrease compared to that in the case where the n⁻-type semiconductor region NW1 is not formed under the n-type semiconductor region NW2. This is because, in the pixel PU, the transfer transistor TX having a MOS (Metal-Oxide-Semiconductor) structure transfers the charges generated in the photodiode PD. In other words, the portion in which the amount of the current flowing in the transfer transistor TX is controlled by applying a voltage to the gate electrode Gt is limited to the vicinity of the gate electrode Gt in the p-type well PW1. Accordingly, to increase the charge transfer efficiency, the photodiode PD is preferably formed only in the portion of the p-type well PW1 which is closer to the main surface 1a of the semiconductor substrate 1S.

To increase the charge transfer efficiency while ensuring the internal quantum efficiency even when the wavelength of the incident light is long, it can be considered to set the net impurity concentration in the n⁻-type semiconductor region NW1, which is obtained by subtracting the p-type impurity concentration from the n-type impurity concentration, lower than the net impurity concentration in the n-type semiconductor region NW2 which is obtained by subtracting the p-type impurity concentration from the n-type impurity concentration. As shown in the schematic graph of FIG. 8, in the semiconductor device in the comparative example, the net impurity concentration in the n⁻-type semiconductor region NW1 is lower than the net impurity concentration in the n-type semiconductor region NW2. Note that the schematic graph of FIG. 8 shows that the net impurity concentration in the p⁺-type semiconductor region PW is higher than the net impurity concentration in the p-type well PW1.

Note that, in the present specification, when the respective impurity concentrations in two semiconductor regions are compared to each other, it is possible to compare the respective average values of the impurity concentrations in the two semiconductor regions in the depth direction to each other. Alternatively, when the magnitude relationship between the respective maximum values of the impurity concentrations in the two semiconductor regions in the depth direction is the same as the magnitude relationship between the respective average values of the impurity concentrations in the two semiconductor regions in the depth direction, it is possible to compare the respective maximum values of the impurity concentrations in the two semiconductor regions in the depth direction to each other.

However, when the net impurity concentration in the n$^-$-type semiconductor region NW1 is lower than the net impurity concentration in the n-type semiconductor region NW2 and the n$^-$-type semiconductor region NW1 is in contact with the n-type semiconductor region NW2, the distribution of the potential energy in the n-type semiconductor region NW2 in the depth direction is modulated in contrast to that in the case where the n$^-$-type semiconductor region NW1 is not formed. Accordingly, as shown in the schematic graph of FIG. 9, in the semiconductor device in the comparative example, a depth position DP1 where the potential energy is lowest is deeper than a center position DP2 in the n-type semiconductor region NW2 in the depth direction, unlike in the case where the n$^-$-type semiconductor region NW1 is not formed. The depth position DP1 where the potential energy is lowest is closer to the n$^-$-type semiconductor region NW1 than in the case where the n$^-$-type semiconductor region NW1 is not formed. Also, the potential energy at the depth position DP1 is lower than in the case where the n$^-$-type semiconductor region NW1 is not formed. As a result, in the semiconductor device in the comparative example, the efficiency of charge transfer from the n-type semiconductor region NW2 to the floating diffusion FD is lower than in the case where the n$^-$-type semiconductor region NW1 is not formed.

That is, the semiconductor device in the comparative example includes the n$^-$-type semiconductor region NW1 formed in the p-type well PW1 and the n-type semiconductor region NW2 formed closer to the main surface 1a than the n$^-$-type semiconductor region NW1. However, between the n-type semiconductor region NW2 and the n$^-$-type semiconductor region NW1, the p$^-$-type semiconductor region PW2 (see FIG. 6) is not formed. In other words, in the semiconductor device in the comparative example, the photodiode PD has the p-type well PW1, the n-type semiconductor region NW2 formed in the p-type well PW1, and the n$^-$-type semiconductor region NW1 formed under the n-type semiconductor region NW2 but, between the n-type semiconductor region NW2 and the n$^-$-type semiconductor region NW1, the p$^-$-type semiconductor region PW2 is not formed. Also, as described above, the net impurity concentration in the n$^-$-type semiconductor region NW1 is lower than the net impurity concentration in the n-type semiconductor region NW2.

In the semiconductor device in the comparative example thus configured, the distribution of the potential energy in the depth direction is modulated and the depth position DP1 where the potential energy is lowest is deeper than the center position DP2 in the n-type semiconductor region NW2 in the depth direction. Accordingly, in the semiconductor device in the comparative example, when incident light is incident on the portion of the p-type well PW1 which is further away from the main surface 1a, it is impossible to increase the charge transfer efficiency, while ensuring the internal quantum effect, resulting in the degradation of the performance of the semiconductor device including the photoelectric conversion element.

A consideration will be given herein to the case where the n$^-$-type semiconductor region NW1 and the n-type semiconductor region NW2 are separated from each other by the p-type well PW1 and a net impurity concentration in the portion of the p-type well PW1 which is located between the n$^-$-type semiconductor region NW1 and the n-type semiconductor region NW2 is generally equal to a net impurity concentration in the other portion of the p-type well PW1. In such a case, the distribution of the potential energy in the depth direction has a potential barrier in the portion of the p-type well PW1 which is located between the n$^-$-type semiconductor region NW1 and the n-type semiconductor region NW2, and the potential barrier is high. Accordingly, even when a positive voltage is applied to the gate electrode Gt of the transfer transistor TX, the charges in the n$^-$-type semiconductor region NW1 cannot be moved into the n-type semiconductor region NW2. As a result, the charges remain in the n$^-$-type semiconductor region NW1.

A consideration will be given also to the case where, to prevent a detection sensitivity from being degraded by the transmission of incident light by the color filter layer, a plurality of photodiodes which absorb incident light beams having different wavelengths and generate charges by photoelectric conversion are stacked in the depth direction. In such a case, it is possible to increase the internal quantum efficiency when the incident light is incident on the portion of the p-type well which is further away from the main surface of the semiconductor substrate. However, in such a case, the incident light beam having a given wavelength generates charges in each of the plurality of photodiodes stacked in the pixel and causes color mixture. This reduces an effective detection sensitivity.

<Main Characteristic Features and Effects of Embodiment 1>

On the other hand, the semiconductor device in Embodiment 1 includes the n$^-$-type semiconductor region NW1 formed in the p-type well PW1, the n-type semiconductor region NW2 formed closer to the main surface 1a than the n$^-$-type semiconductor region NW1, and the p$^-$-type semiconductor region PW2 formed between the n$^-$-type semiconductor region NW1 and the n-type semiconductor region NW2. In other words, in the semiconductor device in Embodiment 1, the photodiode PD has the n$^-$-type semiconductor region NW1 formed in the p-type well PW1, the n-type semiconductor region NW2 formed closer to the main surface 1a than the n$^-$-type semiconductor region NW1, and the p$^-$-type semiconductor region PW2 formed between the n$^-$-type semiconductor region NW1 and the n-type semiconductor region NW2. The net impurity concentration in the n$^-$-type semiconductor region NW1 is lower than the net impurity concentration in the n-type semiconductor region NW2 and the net impurity concentration in the p$^-$-type semiconductor region PW2 is lower than the net impurity concentration in the p-type well PW1.

Figure 10:
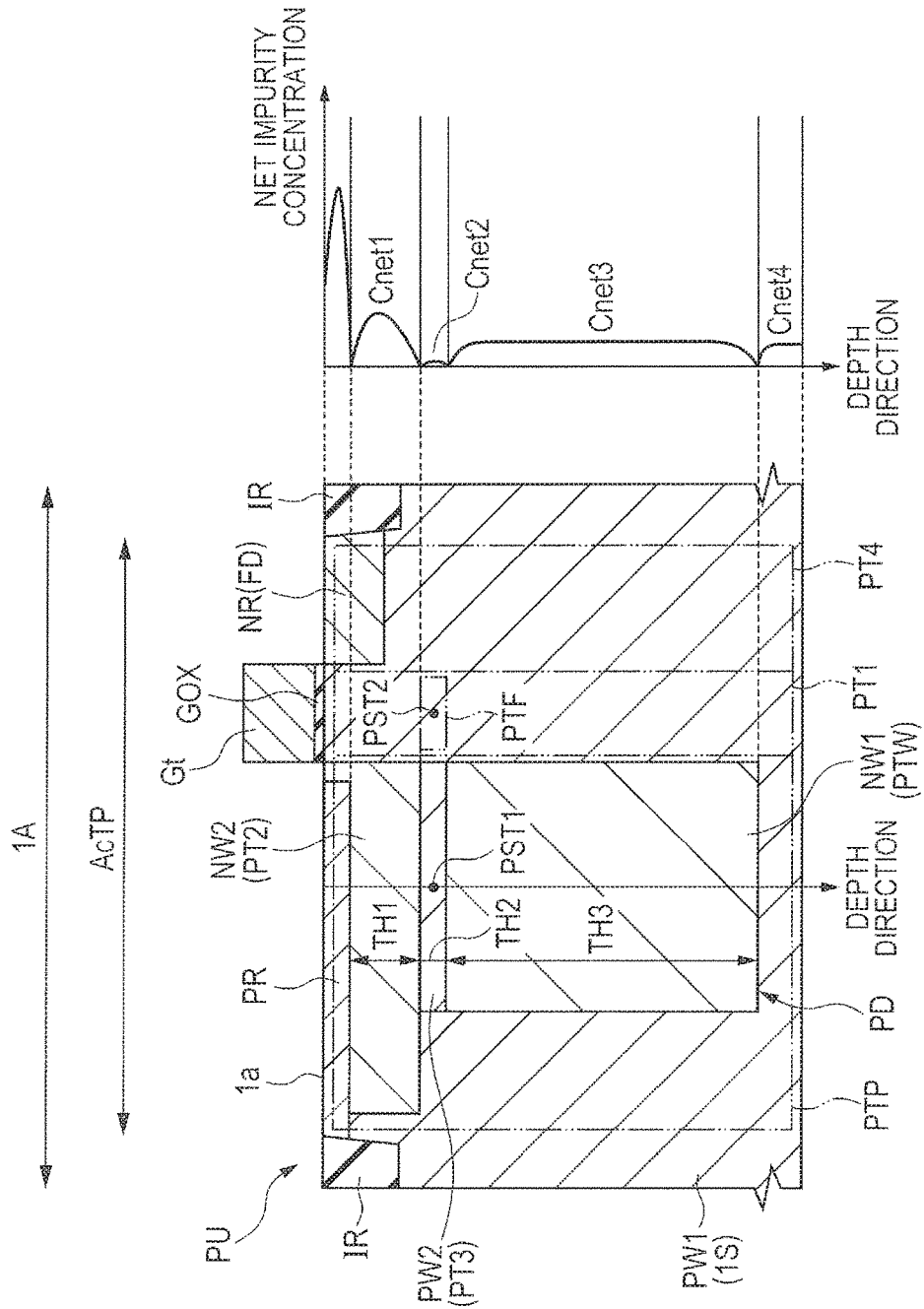
FIG. 10 is a view for illustrating a distribution of a net impurity concentration in a depth direction in a photodiode in the semiconductor device in Embodiment 1.
Figure 11:
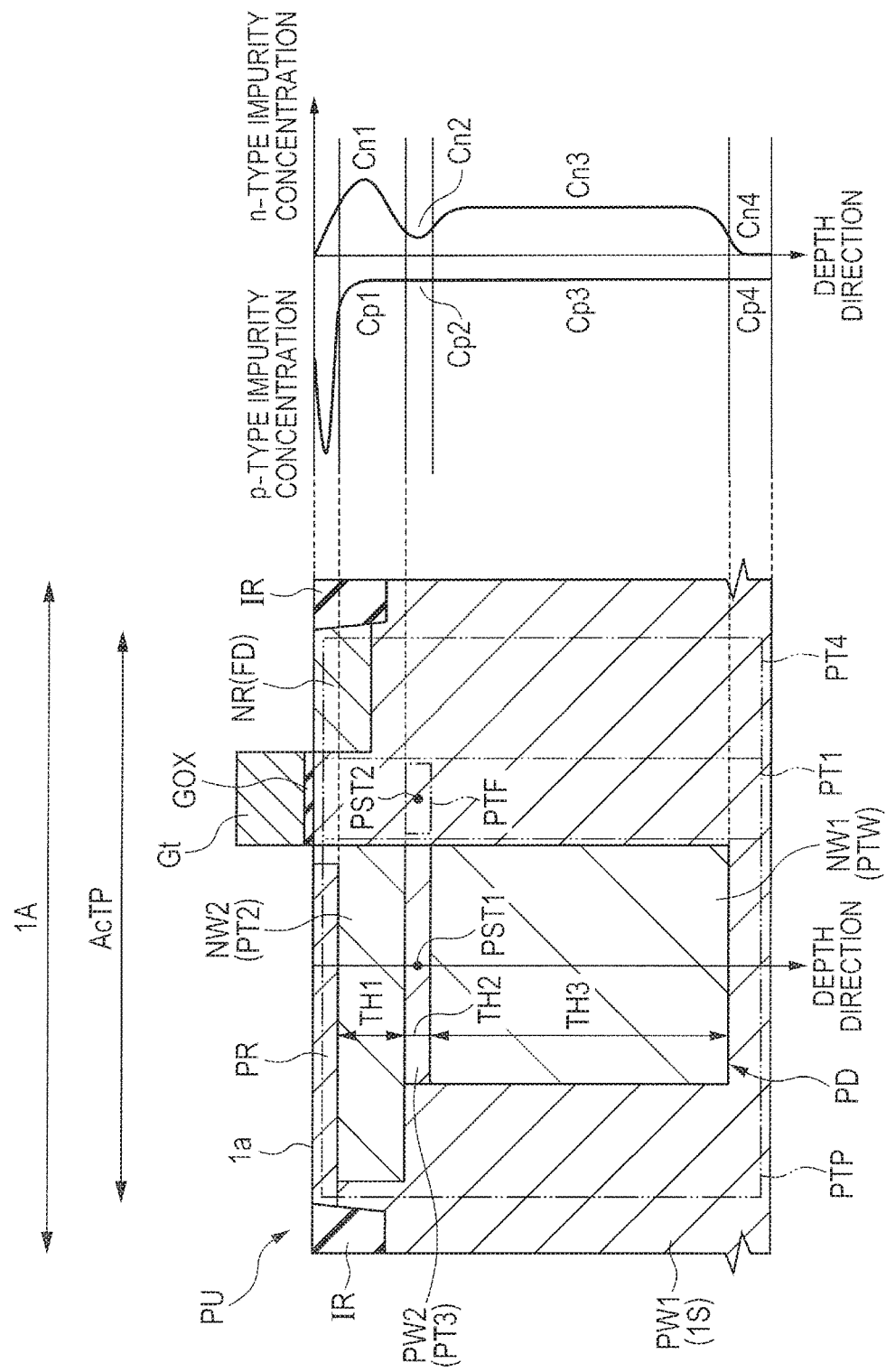
FIG. 11 is a view for illustrating respective distributions of p-type and n-type impurity concentrations in the depth direction in the photodiode of the semiconductor device in Embodiment 1.
Figure 12:
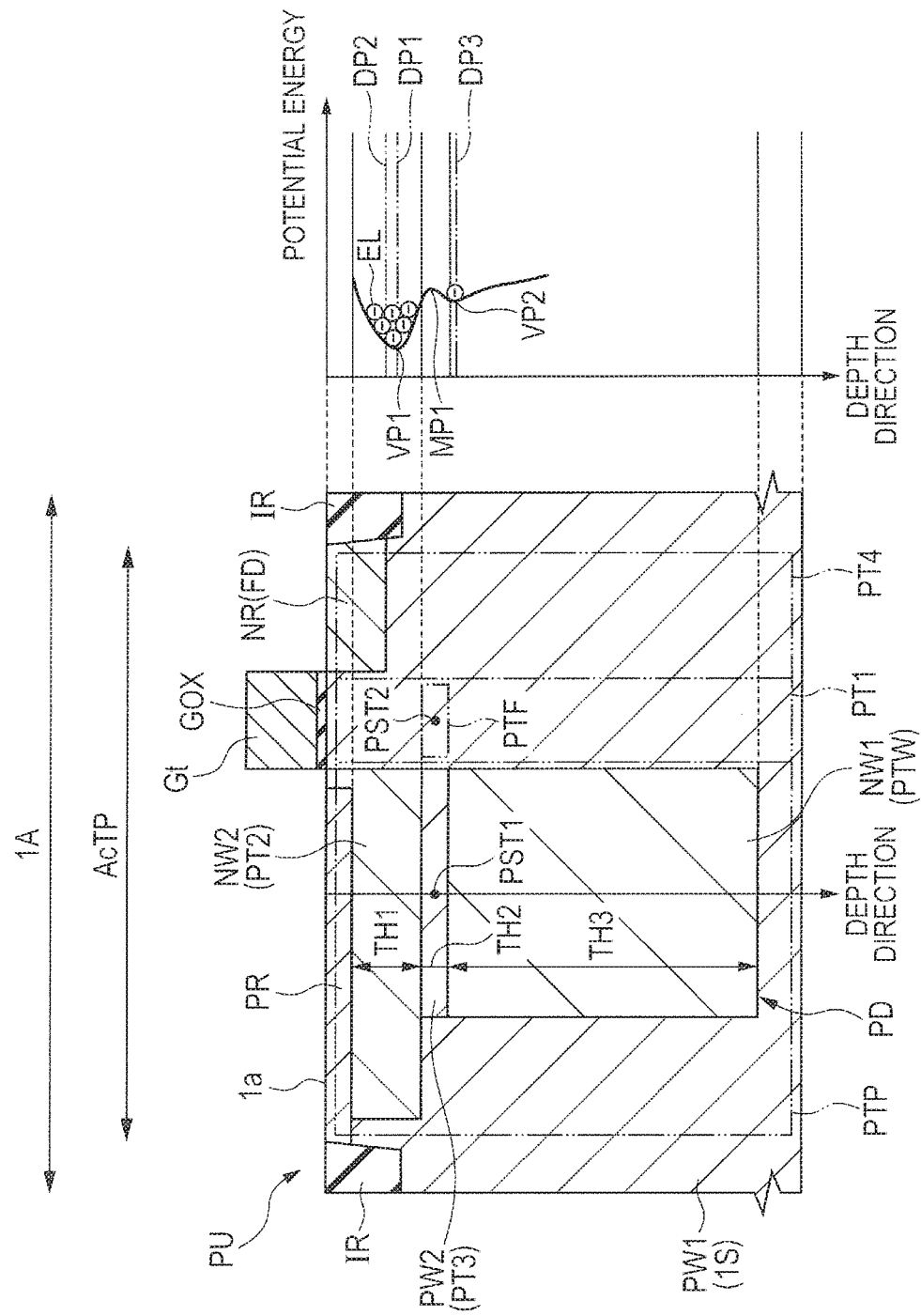
FIG. 12 is a view for illustrating a distribution of a potential energy in the depth direction in the photodiode of the semiconductor device in Embodiment 1.

FIG. 10 is a view for illustrating the distribution of the net impurity concentration in the depth direction in the photodiode of the semiconductor device in Embodiment 1. FIG. 11 is a view for illustrating the distributions of the p-type and n-type impurity concentrations in the depth direction in the photodiode of the semiconductor device in Embodiment 1. FIG. 12 is a view for illustrating the distribution of the potential energy in the depth direction in the photodiode of the semiconductor device in Embodiment 1. FIG. 10 shows a graph schematically showing the distribution of the net impurity concentration in the depth direction in the photodiode of the semiconductor device in Embodiment 1. FIG. 11 shows a graph schematically showing the distributions of the p-type and n-type impurity concentrations in the depth direction in the photodiode of the semiconductor device in Embodiment 1. FIG. 12 shows a graph schematically showing the distribution of the potential energy in the depth direction in the photodiode of the semiconductor device in Embodiment 1. Note that the distribution of the potential energy shown in the schematic graph of FIG. 12 means the distribution of the conduction band energy. FIG. 12 also shows the distribution of the potential energy in the n-type semiconductor region NW2 and a portion of the n⁻-type semiconductor region NW1 of the photodiode PD.

As shown in FIG. 6, in the semiconductor device in Embodiment 1, the n⁻-type semiconductor region NW1 is formed under the n-type semiconductor region NW2, i.e., formed opposite to the main surface 1a relative to the n-type semiconductor region NW2 interposed therebetween. That is, the semiconductor device in Embodiment 1 is the same as the semiconductor device in the comparative example, but the photodiode PD is formed to extend to a position in the p-type well PW1 which is at a larger depth from the main surface 1a of the semiconductor device 1S than in the case where the n⁻-type semiconductor region NW1 is not formed.

Accordingly, particularly in the red (R) pixel PU, by forming the n⁻-type semiconductor region NW1 under the n-type semiconductor region NW2, it is possible to increase the efficiency with which incident light is incident on the photodiode PD and electrons are generated by photoelectric conversion, i.e., so-called internal quantum efficiency.

As shown in the schematic graph of FIG. 10, in the semiconductor device in Embodiment 1, the net impurity concentration in the n⁻-type semiconductor region NW1 is lower than the net impurity concentration in the n-type semiconductor region NW2. This is intended to increase the internal quantum efficiency even when the wavelength of incident light is long.

As shown in the schematic graph of FIG. 11, it is assumed that the p-type impurity concentration in the n-type semiconductor region NW2 is Cp1 and the n-type impurity concentration in the n-type semiconductor region NW2 is Cn1. On the other hand, as shown in the schematic graph of FIG. 10, it is assumed that the net impurity concentration in the n-type semiconductor region NW2 is Cnet1. At this time, Cnet1 is given by the following Expression (1):

$$Cnet1=|Cp1-Cn1|=Cn1-Cp1 \qquad (1).$$

As also shown in the schematic graph of FIG. 11, it is assumed that the p-type impurity concentration in the p⁻-type semiconductor region PW2 is Cp2 and the n-type impurity concentration in the p⁻-type semiconductor region PW2 is Cn2. On the other hand, as shown in the schematic graph of FIG. 10, it is assumed that the net impurity concentration in the p⁻-type semiconductor region PW2 is Cnet2. At this time, Cnet2 is given by the following expression (2):

$$Cnet2=|Cp2-Cn2|=Cp2-Cn2 \qquad (2).$$

Note that, as the impurity concentration in the p⁻-type semiconductor region PW2, an impurity concentration at a position PST1 located at the middle of the p⁻-type semiconductor region PW2 in the gate length direction of the gate electrode Gt and located at the middle of the p⁻-type semiconductor region PW2 in the depth direction can be used.

As also shown in the schematic graph of FIG. 11, it is assumed that the p-type impurity concentration in the n⁻-type semiconductor region NW1 is Cp3 and the n-type impurity concentration in the n⁻-type semiconductor region NW1 is Cn3. On the other hand, as shown in the schematic graph of FIG. 10, it is assumed that the net impurity concentration in the n⁻-type semiconductor region NW1 is Cnet3. At this time, Cnet3 is given by the following expression (3):

$$Cnet3=|Cp3-Cn3|=Cn3-Cp3 \qquad (3).$$

As also shown in the schematic graph of FIG. 11, it is assumed that the p-type impurity concentration in the p-type well PW1 is Cp4 and the n-type impurity concentration in the p-type well PW1 is Cn4. On the other hand, as shown in the schematic graph of FIG. 10, it is assumed that the net impurity concentration in the p-type well PW1 is Cnet4. At this time, Cnet4 is given by the following expression (4):

$$Cnet4=|Cp4-Cn4|=Cp4-Cn4 \qquad (4).$$

Note that an impurity concentration in the p-type well PW1 is an impurity concentration in the portion of the p-type well PW1 which is sufficiently away from each of the n⁻-type semiconductor region NW1, the n-type semiconductor region NW2, the p⁻-type semiconductor region PW2, the higher-concentration n-type semiconductor region NR, and the p⁺-type semiconductor region P. As such an impurity concentration in the p-type well PW1, as shown in the schematic graphs of FIGS. 10 and 11, an impurity concentration in the portion of the p-type well PW1 which is located opposite to the n-type semiconductor region NW2 relative to the n⁻-type semiconductor region NW1 interposed therebetween can be used.

Alternatively, as the impurity concentration in the p-type well PW1, an impurity concentration in a portion PTF of the p-type well PW1 which is located under the gate electrode Gt, i.e., faces the gate electrode Gt in a direction perpendicular to the main surface and faces the p⁻-type semiconductor region PW2 in the gate length direction of the gate electrode Gt can be used preferably. More preferably, as the impurity concentration in the p-type well PW1, an impurity concentration at a position PST2 which is located at the same position as a middle position in the gate electrode Gt in the gate length direction and is located at the same position as the position PST1 in the depth direction can be used.

As shown in the schematic graph of FIG. 11, the p-type impurity concentration Cp1 in the n-type semiconductor region NW2, the p-type impurity concentration Cp2 in the p⁻-type semiconductor region PW2, the p-type impurity concentration Cp3 in the n⁻-type semiconductor region NW1, and the p-type impurity concentration Cp4 in the p-type well PW1 are generally equal. On the other hand, the n-type impurity concentration Cn1 in the n-type semiconductor region NW2, the n-type impurity concentration Cn2 in the p⁻-type semiconductor region PW2, the n-type impurity concentration Cn3 in the n⁻-type semiconductor region NW1, and the n-type impurity concentration Cn4 in the p-type well PW1 have the relationships given by Cn4<Cn2<Cn3<Cn1 therebetween. Also, the p-type impurity concentrations Cp1, Cp2, Cp3 and CP4 and the n-type impurity concentrations Cn1, Cn2, Cn3, and Cn4 have the relationships given by Cp1<Cn1, Cn2<Cp2, Cp3<Cn3, and Cn4<Cp4 therebetween.

Accordingly, when Expressions (1) and (3) shown above are used, as shown in the schematic graph of FIG. 10, the net impurity concentration Cnet1 in the n-type semiconductor region NW2 and the net impurity concentration Cnet3 in the n⁻-type semiconductor region NW1 have the relationship given by Cnet3<Cnet1 therebetween. Also, when Expressions (2) and (4) shown above are used, as shown in the schematic graph of FIG. 10, the net impurity concentration Cnet2 in the p⁻-type semiconductor region PW2 and the net impurity concentration Cnet4 in the p-type well PW1 have the relationship given by Cnet2<Cnet4 therebetween. Note that the schematic graph in FIG. 11 shows that the net impurity concentration in the p⁻-type semiconductor region PR is higher than the net impurity concentration in the p-type well PW1.

In the semiconductor device in Embodiment 1, between the n⁻-type semiconductor region NW1 and the n-type semiconductor region NW2, the p⁻-type semiconductor region PW2 is formed and the n⁻-type semiconductor region NW1 is not in contact with the n-type semiconductor region NW2. In such a case, as shown in the schematic graph of FIG. 12, the distribution of the potential energy in the depth direction has a peak portion MP1 as a potential barrier in the p⁻-type semiconductor region PW2.

As described above, when the n⁻-type semiconductor region NW1 and the n-type semiconductor region NW2 are separated by the p-type well PW1, the distribution of the potential energy in the depth direction has a large potential barrier in the portion of the p-type well PW1 which is located between the n⁻-type semiconductor region NW1 and the n-type semiconductor region NW2. In such a case, even when a positive voltage is applied to the gate electrode Gt of the transfer transistor TX, the charges in the n⁻-type semiconductor region NW1 cannot be moved into the n-type semiconductor region NW2.

However, in the semiconductor device in Embodiment 1, the net impurity concentration in the p⁻-type semiconductor region PW2 is lower than the net impurity concentration in the p-type well PW1. In such a case, the distribution of the potential energy in the depth direction has the peak portion MP1 as the potential barrier in the p⁻-type semiconductor region PW2, but the height of the potential barrier at the peak portion MP1 is lower than in the case where the net impurity concentration in the p⁻-type semiconductor region PW2 is generally equal to the net impurity concentration in the p-type well PW1. As can also be seen from the potential energy in the schematic graph of FIG. 12 which is lower at a position closer to the main surface 1a in the upper portion of the n⁻-type semiconductor region NW1, the n⁻-type semiconductor region NW1 is depleted. Also, the potential energy at the depth position DP1 where the potential energy is lowest in the n-type semiconductor region NW2 is lower than the potential energy at a depth position DP3 where the potential energy is lowest in the n⁻-type semiconductor region NW1.

Thus, in the semiconductor device in Embodiment 1, the potential barrier at the peak portion PW2 is not so high. This can easily move electrons in the n⁻-type semiconductor region NW1 into the n-type semiconductor region NW2. Accordingly, as shown in the schematic graph of FIG. 12, a majority of electrons EL resulting from photoelectric conversion in the n⁻-type semiconductor region NW1 are stored in a valley portion VP1 in the distribution of the potential energy located at the depth position DP1. On the other hand, some of the remaining electrons EL resulting from the photoelectric conversion in the n⁻-type semiconductor region NW1 are stored in a valley portion VP2 in the distribution of the potential energy located in the portion of the n⁻-type semiconductor region NW1 which is closer to the p⁻-type semiconductor region PW2.

When a positive voltage is applied to the gate electrode Gt of the transfer transistor TX, the overall potential energy decreases and the valley portion VP2 in the distribution of the potential energy and the peak portion MP1 as the potential barrier disappear so that only the valley portion VP1 in the distribution of the potential energy remains. At this time, the electrons EL in the n-type semiconductor region NW2 are transferred to the floating diffusion FD. Into the valley portion VP1 which is vacant as a result of the transfer of the electrons into the floating diffusion FD, the electrons EL move from the n⁻-type semiconductor region NW1. The electrons EL that have moved into the n⁻-type semiconductor region NW1 are transferred to the floating diffusion FD As also shown in the schematic graph of FIG. 12, in the semiconductor device in Embodiment 1, the distribution of the potential energy in the depth direction, which is less likely to be modulated than in the case where n⁻-type semiconductor region NW1 is not formed, is less likely to be modulated than in the semiconductor device in the comparative example. Also, the distance between the depth position DP1 where the potential energy is lowest and the middle position DP2 of the n-type semiconductor region NW2 in the depth direction is smaller than in the semiconductor device in the comparative example. In addition, the distance by which the depth position DP1 where the potential energy is lowest gets closer to the n⁻-type semiconductor region NW1 than in the case where the n⁻-type semiconductor region NW1 is not formed is shorter than in the semiconductor device in the comparative example. Also, the amount by which the potential energy at the depth position DP1 is smaller than in the case where the n⁻-type semiconductor region NW1 is not formed is smaller than in the semiconductor device in the comparative example. Accordingly, in the semiconductor device in Embodiment 1, the efficiency of charge transfer from the n-type semiconductor region NW2 to the floating diffusion FD is higher than in the semiconductor device in the comparative example.

Thus, in the semiconductor device in Embodiment 1, even when incident light is incident on the portion of the p-type well PW1 which is further away from the main surface 1a, it is possible to increase the charge transfer efficiency, while ensuring the internal quantum efficiency. This allows an improvement in the performance of the semiconductor device including the photoelectric conversion element.

Note that, to reduce the height of the potential barrier at the peak portion MP1 compared to that in the case where the net impurity concentration in the p⁻-type semiconductor region PW2 is generally equal to the net impurity concentration in the p-type well PW1, a semiconductor region in an intrinsic state may also be formed, instead of the p⁻-type semiconductor region PW2, between the n⁻-type semiconductor region NW1 and the n-type semiconductor region NW2. The intrinsic state means a state where an effective carrier density is less than $1 \times 10^{15}$ cm$^{-3}$ and means a state where, e.g., the net impurity concentration as the difference between the p-type impurity concentration and the n-type impurity concentration is less than $1 \times 10^{15}$ cm$^{-3}$.

It is assumed that a thickness of the n-type semiconductor region NW2 in the depth direction is a thickness TH1, a thickness of the p⁻-type semiconductor region PW2 in the depth direction is a thickness TH2, and a thickness of the n⁻-type semiconductor region NW1 in the depth direction is a thickness TH3. At this time, the thickness TH1 of the n-type semiconductor region NW2 is preferably smaller than the thickness TH3 of the n⁻-type semiconductor region NW1 and the thickness TH2 of the p⁻-type semiconductor region PW2 is smaller than the thickness TH1 of the n-type semiconductor region NW2.

Specifically, the thickness TH1 can be set to, e.g., about 0.1 to 0.3 µm, the thickness TH2 can be set to, e.g., about 0.05 to 0.15 µm, and the thickness TH3 can be set to, e.g., about 1.5 to 3 µm.

In terms of ensuring the internal quantum efficiency even when incident light is incident on the portion of the p-type well PW1 which is further away from the main surface 1a, i.e., in terms of ensuring the internal quantum efficiency even when the red (R) incident light beam is incident thereon, the thickness TH3 of the n⁻-type semiconductor region NW1 is preferably largest among the thicknesses TH1, TH2, and TH3. Also, in terms of ensuring the internal quantum efficiency even when incident light is incident on the portion of the p-type well PW1 which is closer to the main surface 1a, i.e., in terms of ensuring the internal quantum efficiency even when the blue (B) incident light beam is incident thereon, the thickness TH1 of the n-type semiconductor region NW2 is preferably rather large, though not as large as the thickness T3.

On the other hand, in terms of preventing the potential energy in the n-type semiconductor region NW2 from being modulated by forming a potential barrier which is not so high between the n-type semiconductor region NW2 and the n⁻-type semiconductor region NW1, the thickness TH2 of the p⁻-type semiconductor region PW2 is preferably smallest among the thicknesses TH1, TH2, and TH3. Accordingly, the thicknesses TH1, TH2, and TH3 preferably have relationships given by TH2<TH1<TH3 shown above therebetween.

Preferably, the p⁻-type semiconductor region PW2 contains an n-type impurity and the p-type well PW1 contains an n-type impurity at a concentration lower than the n-type impurity concentration in the p⁻-type semiconductor region PW2 or contains no n-type impurity. Since the p⁻-type semiconductor region PW2 contains a p-type impurity and an n-type impurity, it is possible to extremely reduce the net impurity concentration which is obtained by subtracting the n-type impurity concentration from the p-type impurity concentration. This allows the net impurity in the p⁻-type semiconductor region PW2 to be precisely controlled to have an extremely low value.

Preferably, the p⁻-type semiconductor region PW2 is in contact with the p-type well PW1. Consequently, in the vicinity of the portion of the p⁻-type semiconductor region which is in contact with the p-type well PW1, the n⁻-type semiconductor region NW1 and the n-type semiconductor region NW2 are completely separated from each other by the p⁻-type semiconductor region. This further enhances the effect of easily moving the charges in the n⁻-type semiconductor region NW1 into the n-type semiconductor region NW2.

Preferably, the n⁻-type semiconductor region NW1 and the p⁻-type semiconductor region PW2 face the portion of the n-type semiconductor region NW2 which is closer to the gate electrode Gt in plan view. Accordingly, in plan view, the n⁻-type semiconductor region NW1 gets closer to the gate electrode Gt to increase the charge transfer efficiency when the charges generated in the n⁻-type semiconductor region NW1 are transferred to the floating diffusion FD.

In accordance with the techniques described above in Patent Documents 1 to 3, a plurality of photodiodes are stacked in the depth direction in the one photoelectric conversion element. Between the two n-type semiconductor regions disposed to be spaced apart from each other in the depth direction, the p-type semiconductor region is formed. However, in Patent Documents 1 to 3 described above, it is not mentioned that the net impurity concentration in the p⁻-type semiconductor region formed between the n-type semiconductor region and the n⁻-type semiconductor region formed thereunder is lower than the net impurity concentration in the p-type well.

In accordance with the technique described above in Patent Document 4, an independent first-conductivity-type region separated from the photodiode is provided at a position deeper than that of the photodiode. However, in accordance with the technique described above in Patent Document 4, the independent first-conductivity-type region is for allowing an intended property improvement to be achieved by selectively determining the potential to be imparted to the independent first-conductivity-type region and does not affect the internal quantum efficiency of the photodiode PD. Also, in Patent Document 4 described above, it is not mentioned that the net impurity concentration in the p⁻-type semiconductor region formed between the n-type semiconductor region and the n⁻-type semiconductor region formed thereunder is lower than the net impurity concentration in the p-type well.

In accordance with the technique described above in Patent Document 5, a first layer having an n-type conductivity type spans an entire image region, while a second layer having a p-type conductivity type is disposed so as to be adjacent to the first layer in a vertical direction. However, in Patent Document 5 described above, it is not mentioned that the net impurity concentration in the p⁻-type semiconductor region formed between the n-type semiconductor region and the n⁻-type semiconductor region formed thereunder is lower than the net impurity concentration in the p-type well.

In accordance with the technique described above in Patent Document 6, in the photodiode region, from the top surface of a substrate, five p-type doped layers and four n-type doped layers are alternately formed so that electrons and holes are separated from each other. Accordingly, in accordance with the technique described above in Patent Document 6, it is necessary to form an n⁺-type wall communicating with the four n-type doped layers to serve as a movement path for electrons. However, when the width of the n⁺-type wall decreases at a middle position thereof in the depth direction, charges cannot be moved from the portion of the photodiode region which is deeper than the middle position. Also, in Patent Document 6 described above, it is not mentioned that the net impurity concentration in the p⁻-type semiconductor region formed between the n-type semiconductor region and the p⁻-type semiconductor region formed thereunder is lower than the net impurity concentration in the p-type well.

<Modification of Embodiment 1>

Figure 13:
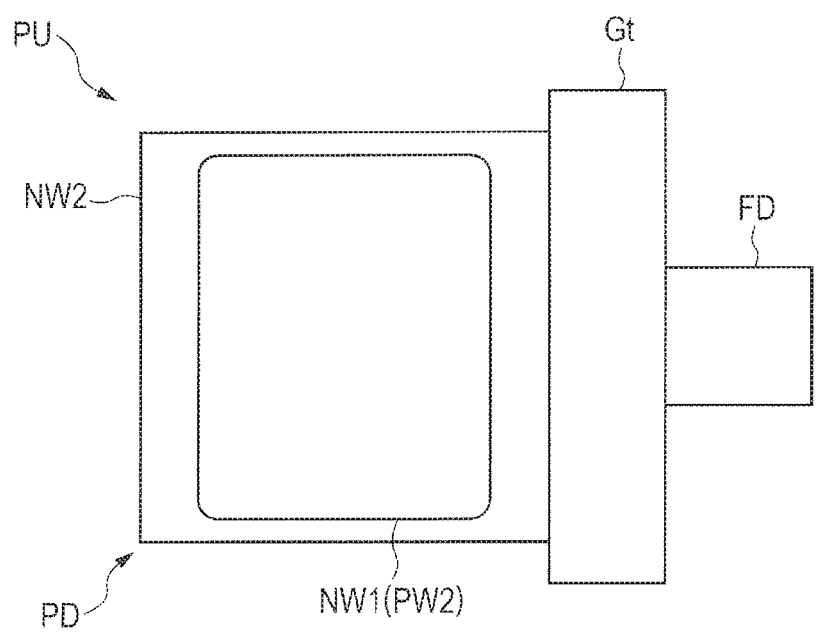
FIG. 13 is a plan view showing a configuration of a semiconductor device in a modification of Embodiment 1.

FIG. 13 is a plan view showing a configuration of a semiconductor device in a modification of Embodiment 1.

As shown in FIG. 13, in the semiconductor device in the present modification, the n⁻-type semiconductor region NW1 faces the middle portion of the n-type semiconductor region NW2 in the gate length direction of the gate electrode Gt. This increases the ratio of the portion of the incident light incident on the pixel PU which is incident on the n⁻-type semiconductor region NW1 to the whole incident light incident on the pixel PU. Accordingly, the charge transfer efficiency when the charges generated in the n⁻-type semiconductor region NW1 are transferred to the floating diffusion FD decreases compared to that in Embodiment 1. However, even when incident light is incident on the portion of the p-type well PW1 which is further away from the main surface 1a (see FIG. 5) of the semiconductor substrate 1S, the internal quantum efficiency can be increased.

<Method of Manufacturing Semiconductor Device>

Figure 14:
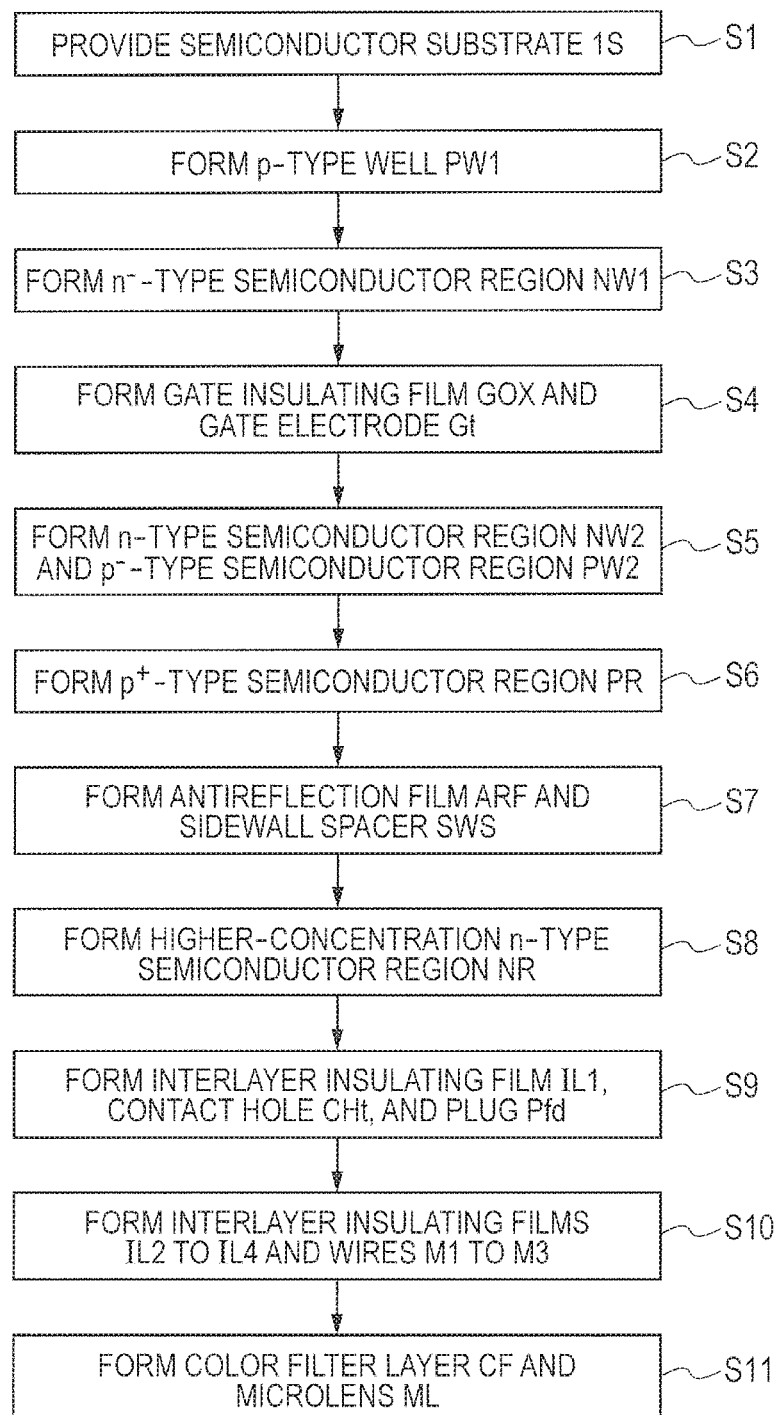
FIG. 14 is a manufacturing process flow chart showing a part of a manufacturing process of the semiconductor device in Embodiment 1.

Next, a description will be given of a method of manufacturing the semiconductor device in Embodiment 1. FIG. 14 is a manufacturing process flow chart showing a part of the manufacturing process of the semiconductor device in Embodiment 1. FIGS. 15 to 24 are cross-sectional views showing the manufacturing process of the semiconductor device in Embodiment 1. Note that each of the cross-sectional views of FIGS. 15 to 24 corresponds to a cross section along the line A-A in FIG. 4.

Figure 25:
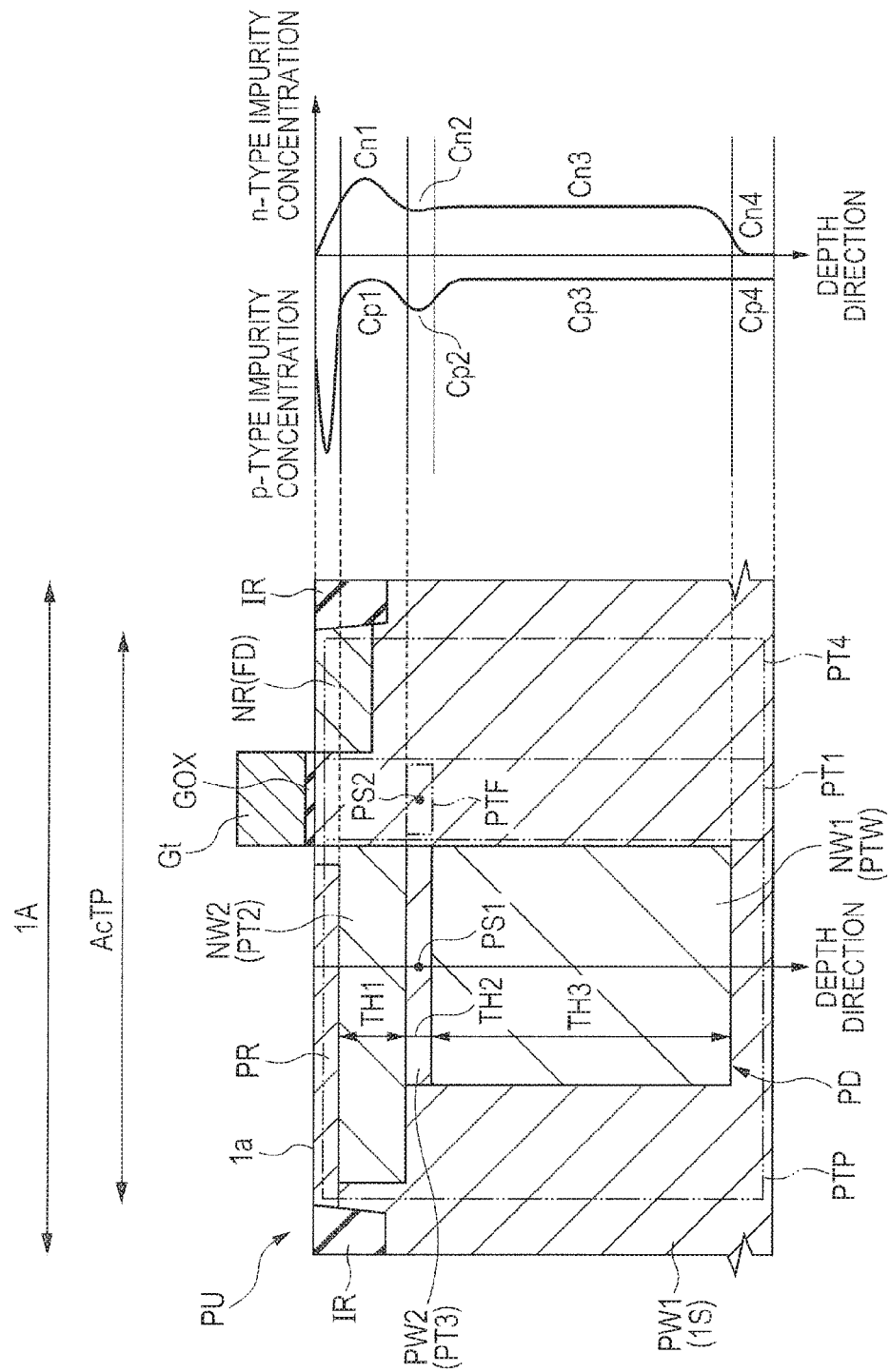
FIG. 25 is a view for illustrating the respective distributions of the p-type and n-type impurity concentrations in the depth direction in the photodiode of the semiconductor device in Embodiment 1.
Figure 26:
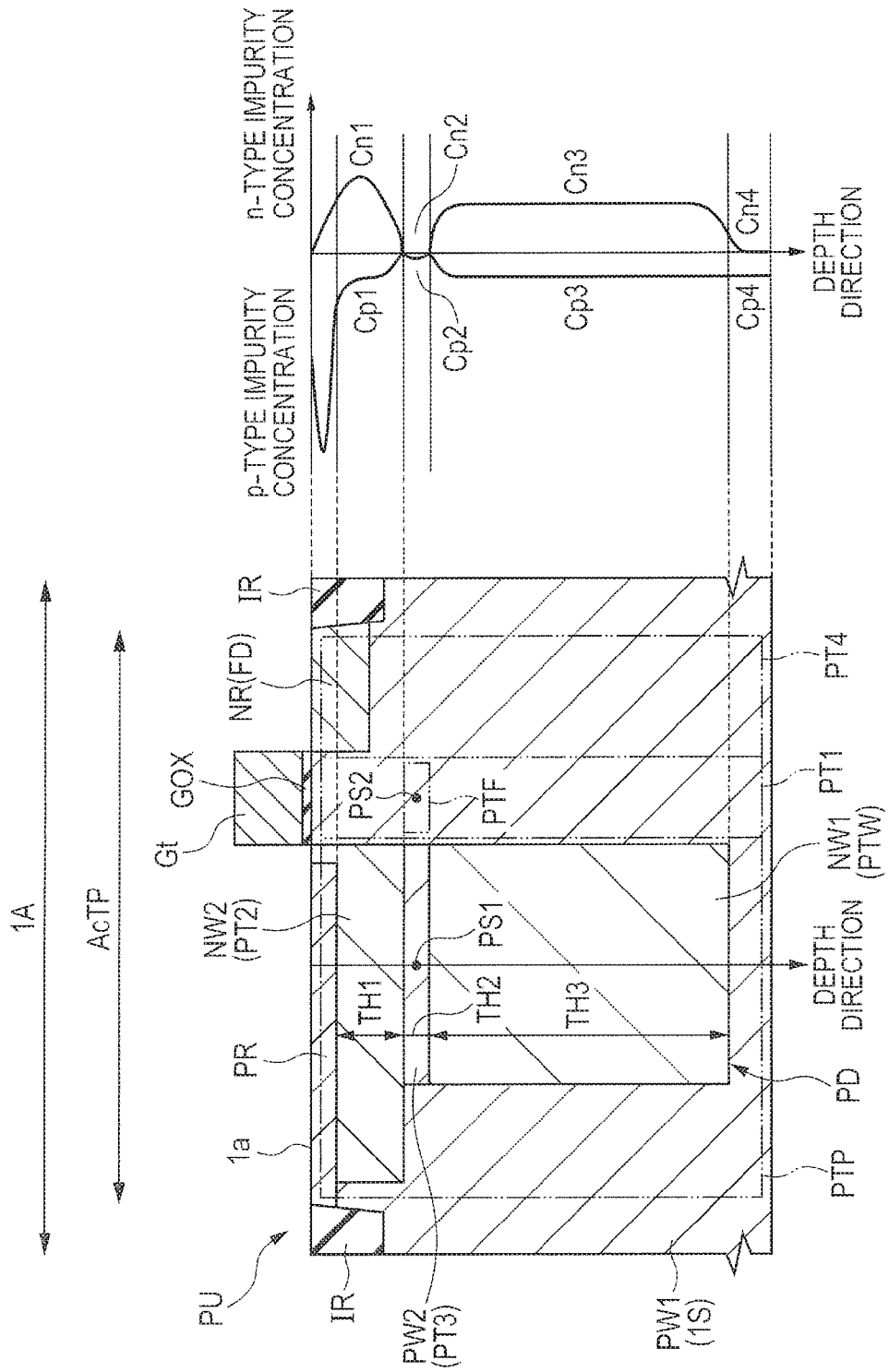
FIG. 26 is a view for illustrating the respective distributions of the p-type and n-type impurity concentrations in the depth direction in the photodiode of the semiconductor device in Embodiment 1.

FIGS. 25 and 26 are views for illustrating the respective distributions of the p-type and n-type impurity concentrations in the depth direction in the photodiode of the semiconductor device in Embodiment 1. FIGS. 25 and 26 show graphs schematically showing, in addition to the cross section shown in FIG. 6, the respective distributions of the p- and n-type impurity concentrations in the depth direction in the photodiode of the semiconductor device in Embodiment 1.

Figure 15:
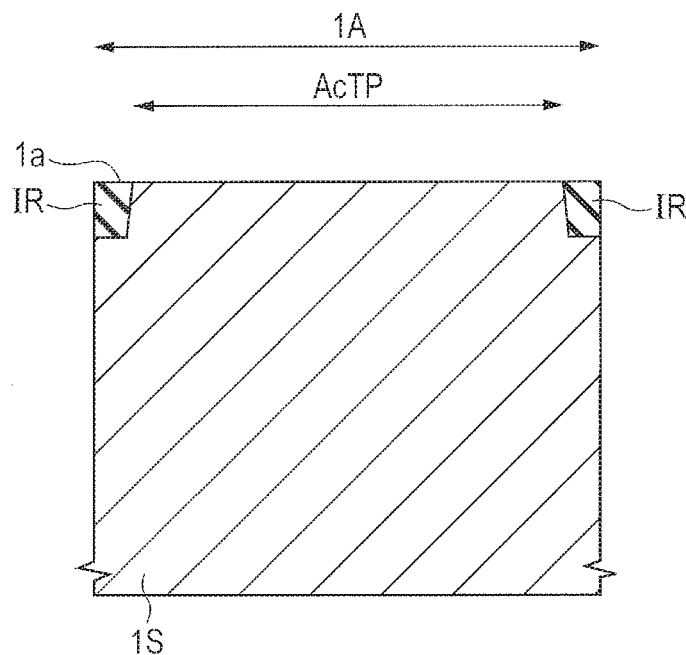
FIG. 15 is a cross-sectional view showing the manufacturing process of the semiconductor device in Embodiment 1.

First, as shown in FIG. 15, the semiconductor substrate 1S is provided (Step S1 in FIG. 14). In Step S1, as the semiconductor substrate 1S, an n-type monocrystalline silicon substrate containing an n-type impurity such as, e.g., phosphorus (P) or arsenic (As) is provided.

Next, as shown in FIG. 15, the isolation region IR is formed in the semiconductor substrate 1S. The isolation region IR is made of an insulating member embedded in the trench in the semiconductor substrate 1S. For example, by etching the semiconductor substrate 1S using a silicon nitride (SiN) film as a mask, the isolation trench is formed in the region of the semiconductor substrate 1S which serves as an active region such as the active region AcTP. Then, an insulating film such as a silicon dioxide ($SiO_2$) film is embedded in the isolation trench to form the isolation region IR. Such an isolation method is referred to as a STI (Shallow Trench Isolation) method. By the isolation region IR, an active region such as the active region AcTP is defined, i.e., formed. The active region AcTP is formed in the pixel region 1A in the main surface 1a of the semiconductor substrate 1S.

Note that, instead of the STI method, a LOCOS (Local oxidation of silicon) method may also be used to form the isolation region. In this case, the isolation region is made of a thermal oxidation film. For example, the regions of the semiconductor substrate 1S which serve as active regions such as the active regions AcTP and AcL are each covered with a silicon nitride film and thermally oxidized. Thus, the isolation region made of an insulating member such as a silicon dioxide film is formed.

Alternatively, after the isolation trench is formed in the region of the semiconductor substrate 1S which serves as an active region such as the active region AcTP and before an insulating film such as a silicon dioxide ($SiO_2$) film is embedded therein, a p-type impurity such as, e.g., boron (B) may also be introduced into the portion of the semiconductor substrate 1S which is exposed at the bottom portion of the isolation trench. This can suppress the generation of a dark current in the portion of the p-type well PW1 described later using FIG. 16 which is located under the isolation region IR.

Figure 16:
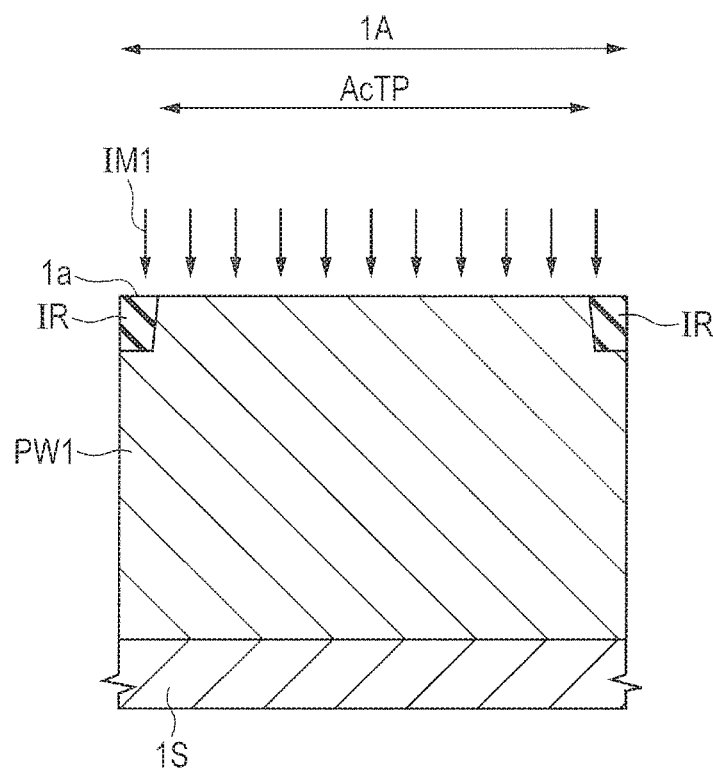
FIG. 16 is a cross-sectional view showing the manufacturing process of the semiconductor device in Embodiment 1.

Next, as shown in FIG. 16, the p-type well PW1 is formed (Step S2 in FIG. 14). In Step S2, a photolithographic technique and an ion implantation method are used to implant p-type impurity ions IM1 of, e.g., boron (B) or the like into the main surface 1a of the semiconductor substrate 1S in the active region AcTP of the pixel region 1A. Thus, in the pixel region 1A, the p-type well PW1 as the semiconductor region is formed to be closer to the main surface 1a of the semiconductor substrate 1S. The conductivity type of the p-well PW1 is the p-type, which is opposite to the n-type as the conductivity type of the semiconductor substrate 1S.

As described above, the net impurity concentration in the p-type well PW1 which is obtained by subtracting the n-type impurity concentration from the p-type impurity concentration can be controlled to, e.g., about $1 \times 10^{16}$ to $1 \times 10^{17}$ $cm^{-3}$. To form the p-type well PW1 having such a net impurity concentration, as implantation conditions when, e.g., boron (B) is ion-implanted as a p-type impurity in step S2, it is possible to set an implantation energy to, e.g., about 550 keV to 2.5 MeV and set a dose to, e.g., about $5 \times 10^{11}$ to $5 \times 10^{12}$ $cm^{-2}$. It is also possible to perform, e.g., stepwise ion implantation in a plurality of steps, while stepwise decreasing the implantation energy. This allows the impurity to be sequentially ion-implanted into the portion of the p-type well PW1 which is further away from the main surface 1a, i.e., the deeper portion and then into the portion thereof which is closer to the main surface 1a, i.e., the shallower portion, while precisely controlling the impurity concentration.

In Step S2, after the p-type impurity ions IM1 are implanted to introduce the p-type impurity, it is possible to perform activation anneal at a high temperature of, e.g., about 1000° C. and activate the p-type impurity introduced by the ion implantation.

Figure 17:
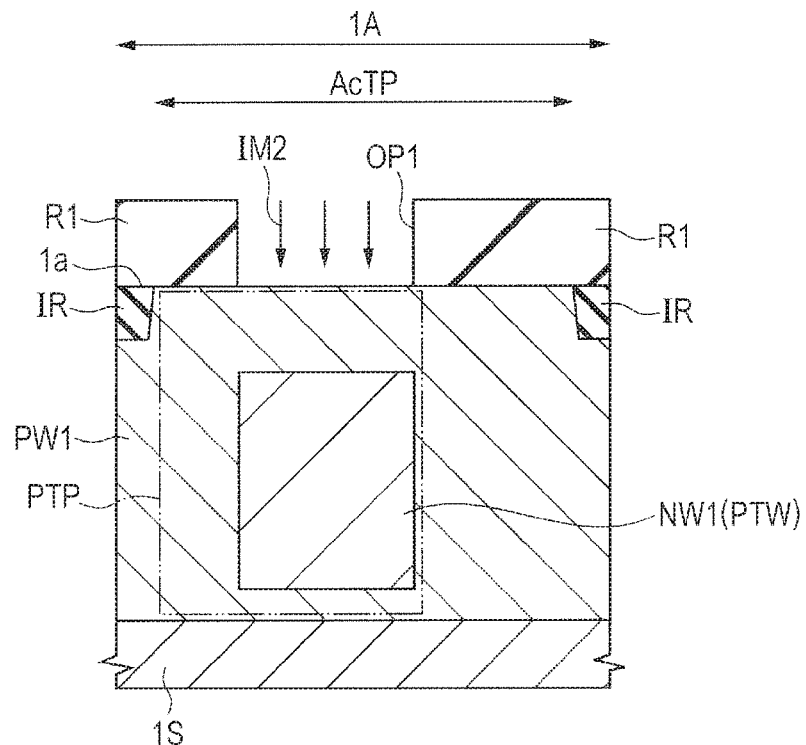
FIG. 17 is a cross-sectional view showing the manufacturing process of the semiconductor device in Embodiment 1.

Then, as shown in FIG. 17, the n⁻-type semiconductor region NW1 is formed (Step S3 in FIG. 14). In Step S3, in the portion PTW of the p-type well PW1 in the pixel region 1A, the n⁻-type semiconductor region NW1 is formed to be away from the main surface 1a by an ion implantation method.

For example, a photoresist film (resist film) R1 is formed over the semiconductor substrate 1S and exposure and development treatment are performed using a photolithographic technique to pattern the photoresist film R1.

Specifically, over the p-type well PW1, the photoresist film R1 is formed. Then, the portion of the photoresist film R1 which is located over the portion PTP of the p-type well PW1 is removed to form an opening OP1 extending through the photoresist film R1 and reaching the portion PTP. In other words, the photoresist film R1 is patterned so as to expose the portion PTP of the p-type well PW1. At this time, the portion of the p-type well PW1 which is other than the portion PTP is covered with the photoresist film R1 such that n-type impurity ions are not implanted therein.

Then, using the photoresist film R1 as a mask, n-type impurity ions IM2 of, e.g., phosphorus (P) or the like are implanted into the portion PTP of the p-type well PW1. Thus, in the inner portion PTW of the portion PTP of the p-type well PW1, the n⁻-type semiconductor region NW1 is formed. Then, the photoresist film R1 is removed. Such a process from the formation of a photoresist film to the removal thereof is referred to as patterning.

The net impurity concentration in the n⁻-type semiconductor region NW1 which is obtained by subtracting the p-type impurity concentration from the n-type impurity concentration can be set to, e.g., about $1 \times 10^{15}$ to $1 \times 10^{16}$ $cm^{-3}$. Also, implantation conditions when, e.g., phosphorus (P) is ion-implanted as an n-type impurity in Step S3 can be set such that an implantation energy is, e.g., about 300 keV to 2 MeV and a dose is, e.g., about $8 \times 10^{11}$ to $1.5 \times 10^{12}$ $cm^{-2}$.

In Step S3, after the n-type impurity ions IM2 are implanted to introduce the n-type impurity, it is possible to perform activation anneal at a high temperature of, e.g., about 1000° C. and activate the n-type impurity introduced by the ion implantation.

Note that, e.g., after Step S3 is performed and before Step S4 is performed, using a photoresist film as a mask, a p-type impurity such as, e.g., boron (B) may also be introduced into the portion surrounding the pixel PU (see FIG. 5).

Alternatively, for example, after Step S3 is performed and before Step S4 is performed, a p-type impurity such as, e.g., boron (B) may also be introduced into the shallow portion of the p-type well PW1 which is closer to the main surface 1a. In such a case, the implantation energy when, e.g., boron (B) is ion-implanted as a p-type impurity can be set lower than the implantation energy in Step S2. Specifically, the implantation energy can be set to, e.g., about 10 to 250 keV and the dose can be set to, e.g., about $5 \times 10^{11}$ to $2 \times 10^{12}$ cm$^{-2}$. It is also possible to perform, e.g., stepwise ion implantation in a plurality of steps, while stepwise decreasing the implantation energy. This allows the impurity to be sequentially ion-implanted into the portion of the p-type well PW1 which is further from the main surface 1a and then into the portion thereof which is closer to the main surface 1a, while precisely controlling the impurity concentration. Note that the step of introducing the p-type impurity into the shallower portion may also be performed when Step S2 is performed.

Figure 18:
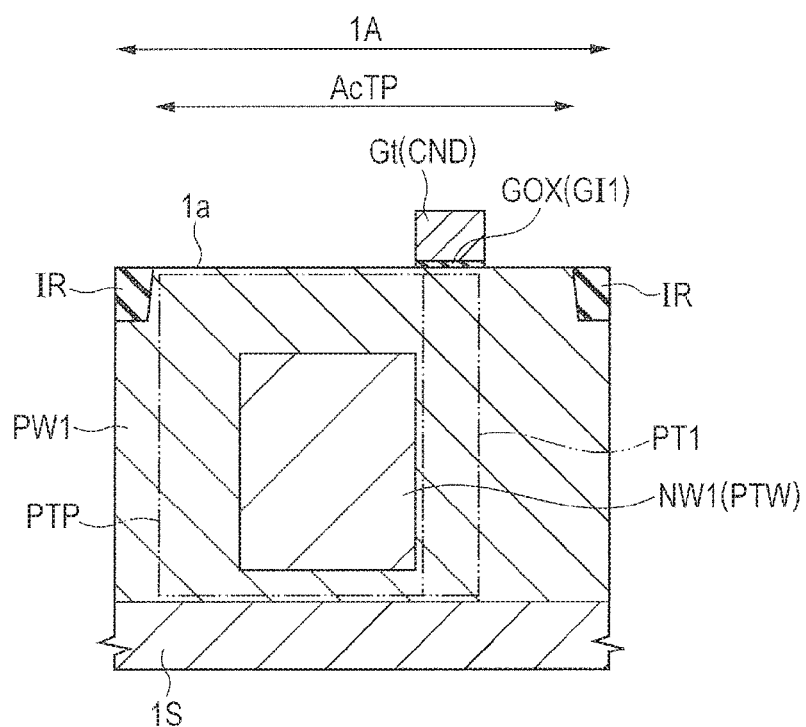
FIG. 18 is a cross-sectional view showing the manufacturing process of the semiconductor device in Embodiment 1.

Next, as shown in FIG. 18, the gate insulating film GOX and the gate electrode Gt are formed (Step S4 in FIG. 14). In Step S4, in the pixel region 1A, the gate electrode Gt is formed over the portion PT1 of the p-type well PW1 which is located on the first side (right side in FIG. 18) of the n$^-$-type semiconductor region NW1 in plan view via the gate insulating film GOX. In the p-type well PW1, the portion PT1 is located on the first side (right side in FIG. 18) of the n$^-$-type semiconductor region NW1 in the gate length direction of the gate electrode Gt in plan view.

In Step S4, by thermally oxidizing the semiconductor substrate 1S, an insulating film GI1 made of a silicon dioxide film is formed first over the main surface 1a of the p-type well PW1.

As the insulating film GI1, a silicon nitride film, a silicon oxynitride (SiON) film, or the like may also be used. Alternatively, a so-called high-dielectric-constant film such as a hafnium-based insulating film obtained by introducing lanthanum oxide into a hafnium oxide (HfO$_2$) film, i.e., a film having a dielectric constant higher than that of a silicon nitride film may also be used. Such a film can be formed using, e.g., a CVD (Chemical Vapor Deposition) method.

In Step S4, next, over the insulating film GI1, e.g., a polycrystalline silicon film is formed as a conductive film CND over the insulating film GI1 using a CVD method or the like.

In Step S4, next, the conductive film CND and the insulating film GI1 are patterned. Specifically, a photoresist film (the illustration thereof is omitted) is formed over the conductive film CND and subjected to exposure and development treatment using a photolithographic technique to be left over the region where the gate electrode Gt is to be formed. Then, using the resist film as a mask, the conductive film CND and the insulating film GI1 are etched. Thus, over the portion PT1 of the p-type well PW1, the gate electrode Gt including the conductive film CND is formed via the gate insulating film GOX including the insulating film GI1. Then, the photoresist film is removed by ashing or the like.

At this time, it may also be possible to form the gate electrode of the transistor as the logic transistor formed in the peripheral circuit region over the semiconductor substrate 1S via a gate insulating film. Alternatively, it may also be possible to form, e.g., the gate electrodes Gr, Gs, and Ga of the other transistors shown in FIG. 2, i.e., the reset transistor RST, the selection transistor SEL, and the amplification transistor AMI.

Figure 19:
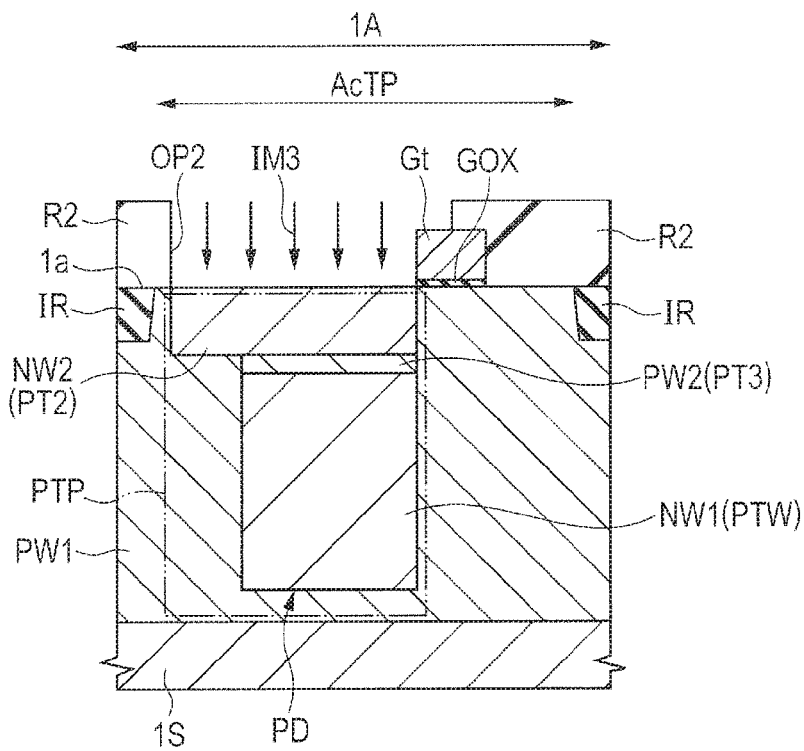
FIG. 19 is a cross-sectional view showing the manufacturing process of the semiconductor device in Embodiment 1.

Next, as shown in FIG. 19, the n-type semiconductor region NW2 and the p$^-$-type semiconductor region PW2 are formed (Step S5 in FIG. 14). In Step S5, in the portion PT2 of the p-type well PW1 which is located closer to the main surface 1a of the semiconductor substrate 1S than the n$^-$-type semiconductor region NW1 in the pixel region 1A, the n-type semiconductor region NW2 is formed.

For example, a photoresist film (resist film) R2 is formed over the semiconductor substrate 1S and subjected to exposure and development treatment using a photolithographic technique to be patterned.

Specifically, over the p-type well PW1, the photoresist film R2 is formed. Then, the portion of the photoresist film R2 which is located over the portion PTP of the p-type well PW1 is removed to form an opening OP2 extending through the photoresist film R2 and reaching the portion PTP. In other words, the photoresist film R2 is patterned so as to expose the portion PTP of the p-type well PW1. At this time, the portion of the p-type well PW1 which is other than the PTP is covered with the photoresist film R2 such that n-type impurity ions are not implanted therein.

Then, using the photoresist film R2 as a mask, n-type impurity ions IM3 of, e.g., arsenic (As) or the like are implanted into the portion PTP of the p-type well PW1. As a result, in the inner portion PT2 of the portion PTP of the p-type well PW1, the n-type semiconductor region NW2 is formed and, in the portion PT3 of the portion PTP which is located between the n$^-$-type semiconductor region NW1 and the n-type semiconductor region NW2, the p$^-$-type semiconductor region PW2 is formed. Then, the photoresist film R2 is removed.

Note that, preferably, the opening OP2 is formed so as to include the n$^-$-type semiconductor region NW1 in plan view. This allows the n-type semiconductor region NW2 to be formed so as to include the n$^-$-type semiconductor region NW1.

It is possible to set the net impurity concentration in the n-type semiconductor region NW2, which is obtained by subtracting the p-type impurity concentration from the n-type impurity concentration, to, e.g., about $1 \times 10^{16}$ to $1 \times 10^{17}$ cm$^{-3}$ and set the net impurity concentration in the p$^-$-type semiconductor region PW2, which is obtained by subtracting the n-type impurity concentration from the p-type impurity concentration, to, e.g., about $1 \times 10^{15}$ to $1 \times 10^{16}$ cm$^{-3}$. Also, implantation conditions when, e.g., arsenic (As) is ion-implanted as an n-type impurity in Step S5 can be set such that an implantation energy is, e.g., about 100 to 200 keV and a dose is, e.g., about $1 \times 10^{12}$ to $1 \times 10^{13}$ cm$^{-2}$.

Note that, as described above, the net impurity concentration in the n$^-$-type semiconductor region NW1 is lower than the net impurity concentration in the n-type semiconductor region NW2 and the net impurity concentration in the p$^-$-type semiconductor region PW2 is lower than the net impurity concentration in the p-type well PW1. As the impurity concentration in the p-type well PW1, the impurity concentration in the portion PTF (see, e.g., FIG. 10) of the p-type well PW1 which is located under the gate electrode Gt, i.e., faces the gate electrode Gt in a direction perpendicular to the main surface 1a and faces the p$^-$-type semiconductor region PW2 in the gate length direction of the gate electrode Gt can be used preferably.

In Step S5, after the n-type impurity ions IM3 are implanted to introduce the n-type impurity, it is possible to perform activation anneal at a high temperature of, e.g., about 1000° C. and activate the n-type impurity introduced by the ion implantation.

By performing Steps S3 and S5, as shown in FIG. 19, the n$^-$-type semiconductor region NW1, the p$^-$-type semiconductor region PW2, and the n-type semiconductor region NW2 are formed in the p-type well PW1. The p-type well PW1, the n$^-$-type semiconductor region NW1, the p$^-$-type semiconductor region PW2, and the n-type semiconductor region NW2 form the photodiode PD.

Preferably, in Step S2, a p-type impurity is ion-implanted into the portion PT3 and, in Step S3, an n-type impurity is ion-implanted into the PT3 such that the amount of the n-type impurity ion-implanted into the portion PT3 is smaller than the amount of the n-type impurity ion-implanted in the portion PTW. Then, in Step S5, an n-type impurity is preferably ion-implanted into the portion PT3 such that the amount of the n-type impurity ion-implanted into the PT3 is smaller than the amount of the n-type impurity ion-implanted in the portion PT2. Thus, the p$^-$-type semiconductor region PW2 is formed in the portion PT3.

As shown in FIG. 11, the distribution of the n-type impurity concentration in the portion PT3 corresponds to the flare portion of the distribution of the concentration of the n-type impurity ion-implanted in the portion PTW and corresponds to the flare portion of the distribution of the concentration of the n-type impurity ion-implanted in the portion PT2.

Accordingly, by adjusting the distribution of the n-type impurity concentration in ion-implanting an n-type impurity into the portion PTW in Step 3 and the distribution of the n-type impurity concentration in ion-implanting an n-type impurity into the portion PT2 in Step 5, the n-type impurity concentration in the p$^-$-type semiconductor region PW2 can be adjusted.

Note that the n-type semiconductor region NW2 may also have a portion overlapping the gate electrode Gt of the transfer transistor in plan view. By having the portion overlapping the gate electrode Gt of the transfer transistor in plan view, the semiconductor region NW2 is allowed to function also as the source region of the transfer transistor.

Note that Step S5 may also include the step of ion-implanting an n-type impurity into the portion PT2 and the step of ion-implanting a p-type impurity into the portion PT3. At this time, it may also be possible to ion-implant a p-type impurity into the portion PT3 in Step S2 and ion-implant an n-type impurity into the portion PT3 in Step S3 such that the amount of the n-type impurity ion-implanted in the portion PT3 is smaller than the amount of the n-type impurity ion-implanted in the portion PTW. Alternatively, in the step of ion-implanting the p-type impurity into the portion PT2 in Step S5, it may also be possible to ion-implant an n-type impurity into the portion PT3 such that the amount of the n-type impurity ion-implanted into the portion PT3 is smaller than the amount of the n-type impurity ion-implanted into the portion PT2. Still alternatively, in Step S5, it may also be possible to perform the step of ion-implanting a p-type impurity into the portion PT3. By thus performing such ion implantation, the p$^-$-type semiconductor region PW2 may also be formed in the portion PT3.

In such a case, the p-type and n-type impurity concentrations in the depth direction in the photodiode of the semiconductor device in Embodiment 1 have such distributions as shown in FIG. 25. However, it is possible to allow the net impurity concentration in the depth direction in the photodiode of the semiconductor device in Embodiment 1 to have the same distribution as that shown in FIG. 10. Accordingly, between the n$^-$-type semiconductor region NW1 and the n-type semiconductor region NW2, the p$^-$-type semiconductor region PW2 having the net impurity concentration lower than the net impurity concentration in the p-type well PW1 can easily be formed.

Note that the step of ion-implanting the p-type impurity into the portion PT3 in Step S5 may also be performed when the step of introducing the p-type impurity into the shallower portion of the p-type well PW1 which is closer to the main surface 1$a$ is performed after Step S3 is performed and before Step S4 is performed.

Alternatively, it may also be possible that a p-type impurity is not ion-implanted into the portion PT3 in Step S2, an n-type impurity is not ion-implanted into the portion PT3 in Step S3, and an n-type impurity is not ion-implanted into the portion PT3 in the step of ion-implanting the n-type impurity into the portion PT2 in Step S5. Still alternatively, the step of ion-implanting the p-type impurity into the portion PT3 in Step S5 may also be performed. By performing such ion implantation, the p$^-$-type semiconductor region PW2 may also be formed in the portion PT3.

In such a case, the p-type and n-type impurity concentrations in the depth direction in the photodiode of the semiconductor device in Embodiment 1 have such distributions as shown in FIG. 26. However, it is possible to allow the net impurity concentration in the depth direction in the photodiode of the semiconductor device in Embodiment 1 to have the same distribution as that shown in FIG. 10. Accordingly, between the n$^-$-type semiconductor region NW1 and the n-type semiconductor region NW2, the p$^-$-type semiconductor region PW2 having the net impurity concentration lower than the net impurity concentration in the p-type well PW1 can easily be formed.

Figure 20:
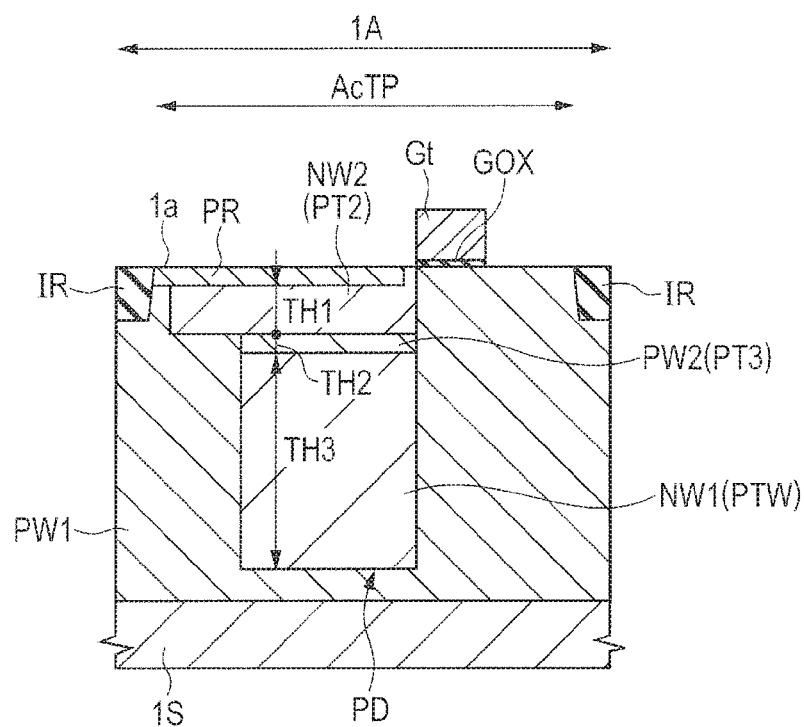
FIG. 20 is a cross-sectional view showing the manufacturing process of the semiconductor device in Embodiment 1.

Next, as shown in FIG. 20, the p$^+$-type semiconductor region PR is formed (Step S6 in FIG. 14). In Step S6, using, e.g., a photolithographic technique and an ion implantation method, p-type impurity ions of, e.g., boron (B) or the like are implanted into the main surface 1$a$ of the n-type semiconductor region NW2 in the pixel region 1A. Thus, as shown in FIG. 20, into the main surface 1$a$ of the n-type semiconductor region NW2, the p$^+$-type semiconductor region PR is formed.

The p-type impurity concentration in the p$^+$-type semiconductor region PR can be set to, e.g., about $1\times10^{18}$ to $1\times10^{19}$ cm$^{-3}$. Also, in Step S6, as implantation conditions when, e.g., boron (B) is ion-implanted as a p-type impurity in step S6, it is possible to set an implantation energy to, e.g., 5 keV or less and set a dose to, e.g., about $1\times10^{12}$ to $2\times10^{13}$ cm$^{-2}$. Note that, by inclining the direction in which ions are implanted from a direction perpendicular to the main surface 1$a$ by, e.g., 20° to 30°, it is possible to space the p$^+$-type semiconductor region PR apart from the gate electrode Gt in plan view. It is also possible to perform, e.g., stepwise ion implantation in a plurality of steps, while stepwise increasing an inclination angle. This allows the p$^+$-type semiconductor region PR to be spaced apart from the gate electrode Gt with high positional precision.

Note that, after, e.g., Step S6 is performed and before Step S7 is performed, to adjust the threshold voltage of the transistor formed in the peripheral circuit region, extension regions, i.e., lower-concentration n-type semiconductor regions may also be formed in the respective portions of the well region formed in the peripheral circuit region which are located on both sides of the gate electrode interposed therebetween in alignment with the gate electrode, though the illustration thereof is omitted. In addition, to prevent or suppress a short-channel effect in the transistor formed in the peripheral circuit region, in the respective portions of the well region formed in the peripheral circuit region which are located on both sides of the gate electrode interposed therebetween, halo regions may also be formed so as to surround the lower-concentration semiconductor regions.

Alternatively, it may also be possible to form, e.g., the respective extension regions, i.e., lower-concentration n-type semiconductor regions of the other transistors shown in FIG. 2, i.e., the reset transistor RST, the selection transistor SEL, and the amplification transistor AMI in alignment with the respective gate electrodes of the individual transistors. Still alternatively, in the portion PT4 (see FIG. 22 described later) of the p-type well PW1, a lower-concentration n-type semiconductor region may also be formed in alignment with the gate electrode Gt.

Note that, in the state where the $p^+$-type semiconductor region PR is formed, as shown in FIG. 20, the thickness TH1 of the n-type semiconductor region NW2 is smaller than the thickness TH3 of the $n^-$-type semiconductor region NW1, while the thickness TH2 of the $p^-$-type semiconductor region PW2 is smaller than the thickness TH1 of the n-type semiconductor region NW2.

Figure 21:
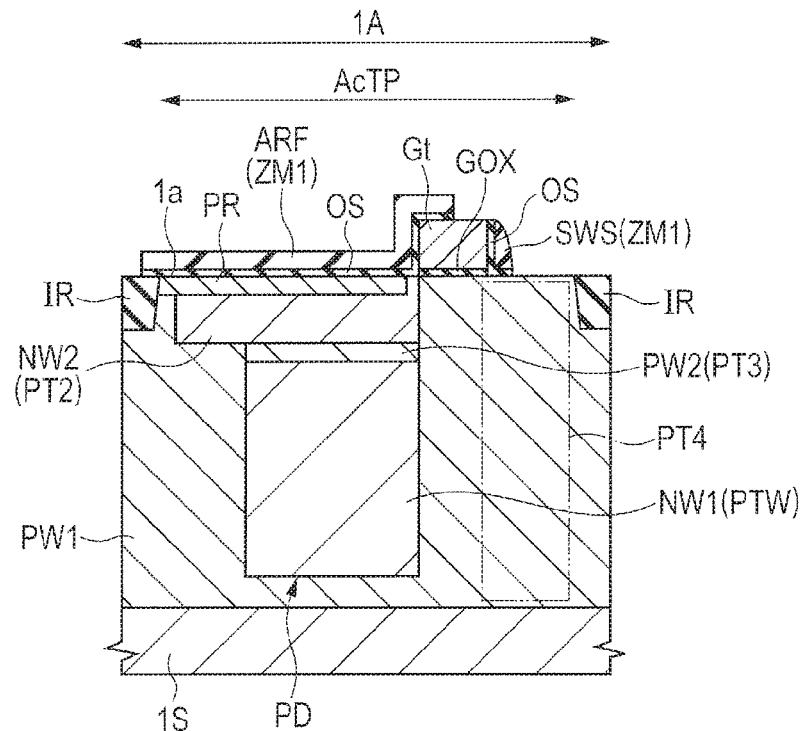
FIG. 21 is a cross-sectional view showing the manufacturing process of the semiconductor device in Embodiment 1.

Next, as shown in FIG. 21, the antireflection film ARF and the sidewall spacer SWS are formed (Step S7 in FIG. 14).

In Step S7, first, the offset spacer OS is formed so as to cover the gate electrode Gt. The offset spacer OS is made of, e.g., a silicon dioxide film.

In Step S7, next, over the main surface 1a of the semiconductor substrate 1S, an insulating film ZM1 is formed so as to cover the gate electrode Gt and the offset spacer OS. The insulating film ZM1 serves as each of an insulating film for forming the antireflection film ARF and an insulating film for forming the sidewall spacer SWS. The insulating film ZM1 is made of, e.g., a silicon nitride film.

In Step S7, next, over the insulating film ZM1 located in the region where the antireflection film ARF is formed, a photoresist pattern (the illustration thereof is omitted) is formed. The n-type semiconductor region NW2 and the $p^+$-type semiconductor region PR which are located on the source side of the gate electrode Gt are covered with the photoresist pattern not shown. On the other hand, the portion PT4 of the p-type well PW1 which is located on the drain side of the gate electrode Gt in plan view is exposed from the photoresist pattern not shown.

In Step S7, next, using the photoresist pattern not shown as a mask (etching mask), the insulating film AM1 is etched back by anisotropic dry etching such as a RIE (Reactive Ion Etching) method. At this time, by leaving the insulating film ZM1 over the side wall of the gate electrode Gt, the sidewall spacer SWS is formed and, by leaving the insulating film AM1 under the photoresist pattern not shown, the antireflection film ARF is formed. After the anisotropic dry etching, the photoresist pattern is removed.

The antireflection film ARF is formed over each of the n-type semiconductor region NW2 and the $p^+$-type semiconductor region PR via the offset spacer OS. A portion (end portion) of each of the antireflection film ARF and the offset spacer OS lies over the gate electrode Gt. As a result, of the both side walls of the gate electrode Gt, the side wall located closer to the source of the gate electrode Gt, i.e., closer to the photodiode PD is covered with the antireflection film ARF via the offset spacer OS.

On the other hand, of the both side walls of the gate electrode Gt, over the drain-side side wall, i.e., the side wall adjacent to which the floating diffusion FD is formed, the sidewall spacer SWS is formed via the offset spacer OS.

Note that, when Step S7 is performed, over the both side walls of the gate electrode of the transistor formed in the peripheral circuit region, sidewall spacers may also be formed via offset spacers. Alternatively, over the both side walls of the gate electrode of, e.g., each of the other transistors shown in FIG. 2, i.e., the reset transistor RST, the selection transistor SEL, and the amplification transistor AMI, sidewall spacers may also be formed via offset spacers.

Figure 22:
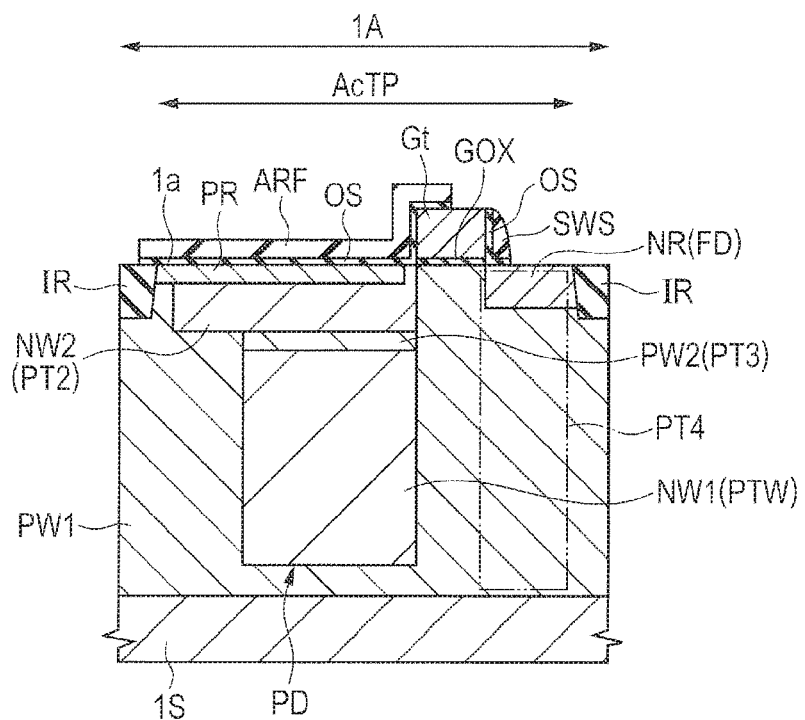
FIG. 22 is a cross-sectional view showing the manufacturing process of the semiconductor device in Embodiment 1.

Next, as shown in FIG. 22, the higher-concentration n-type semiconductor region NR is formed (Step S8 in FIG. 14).

In Step S8, in the pixel region 1A, into the portion PT4 of the p-type well PW1 which is located on the drain side of the gate electrode Gt, i.e., on the side (right side in FIG. 22) opposite to the photodiode PD relative to the gate electrode Gt interposed therebetween, n-type impurity ions of, e.g., phosphorus (P) or arsenic (As) are implanted using, e.g., the antireflection film ARF and the gate electrode Gt as a mask. Thus, in the portion PT4 of the p-type well PW1 which is located on the side opposite to the $n^-$-type semiconductor region NW1 relative to the gate electrode Gt interposed therebetween, the higher-concentration n-type semiconductor region NR is formed. The higher-concentration n-type semiconductor region NR is also the drain region of the transfer transistor TX as well as a semiconductor region which serves as the floating diffusion FD of the photodiode PD. The n-type impurity concentration in the higher-concentration n-type semiconductor region NR is higher than the n-type impurity concentration in the n-type semiconductor region NW2.

As implantation conditions when, e.g., each of phosphorus (P) and arsenic (As) is ion-implanted as the n-type impurity, an implantation energy can be set to, e.g., about 60 keV or less and a dose can be set to, e.g., about $1 \times 10^{13}$ to $3 \times 10^{15}$ cm$^{-2}$. It is also possible to perform, e.g., stepwise ion implantation in a plurality of steps, while stepwise decreasing the implantation energy and switching the type of the n-type impurity to be ion-implanted from phosphorus to arsenic. This allows the impurity to be sequentially ion-implanted into the portion of the p-type well PW1 which is further away from the main surface 1a and then into the portion thereof which is closer to the main surface 1a, while precisely controlling the impurity concentration.

As described above, in the case where the lower-concentration n-type semiconductor region is formed in the portion PT4 of the p-type well PW1 in alignment with the gate electrode Gt, the lower-concentration n-type semiconductor region and the higher-concentration n-type semiconductor region NR form the floating diffusion FD having an LDD (Lightly Doped Drain) structure.

By the foregoing process steps, in the semiconductor substrate 1S in the pixel region 1A, the photodiode PD and the transfer transistor TX are formed to be closer to the main surface 1a. The gate electrode Gt and the n-type higher-concentration n-type semiconductor region NR form the transfer transistor TX.

Note that, when Step S8 is performed, it may also be possible to form a higher-concentration n-type semiconductor region in the well region formed in the peripheral circuit region in alignment with the sidewall spacers formed over the side walls of the gate electrode, though the illustration thereof is omitted. It may also be possible for a lower-concentration n-type semiconductor region and a higher-concentration n-type semiconductor to form each of the source/drain regions having an LDD structure. Thus, in the peripheral circuit region, the transistor is formed.

Alternatively, when Step S8 is performed, it may also be possible to form respective higher-concentration n-type semiconductor regions included individually in, e.g., the other transistors shown in FIG. 2, i.e., the reset transistor RST, the selection transistor SEL, and the amplification transistor AMI in alignment with the sidewall spacers formed over the respective side walls of the gate electrodes of the transistors. It may also be possible for a lower-concentration n-type semiconductor region and a higher-concentration n-type semiconductor region to form each of the source/drain regions having a LDD structure. Thus, e.g., the other transistors shown in FIG. 2, i.e., the reset transistor RST, the selection transistor SEL, and the amplification transistor AMI are formed.

Note that, after Step S8 is performed and before Step S9 is performed, in the peripheral circuit region, respective silicide layers may also be formed over the higher-concentration n-type semiconductor region and the gate electrode. Alternatively, over the floating diffusion FD also, a silicide layer may also be formed.

Figure 23:
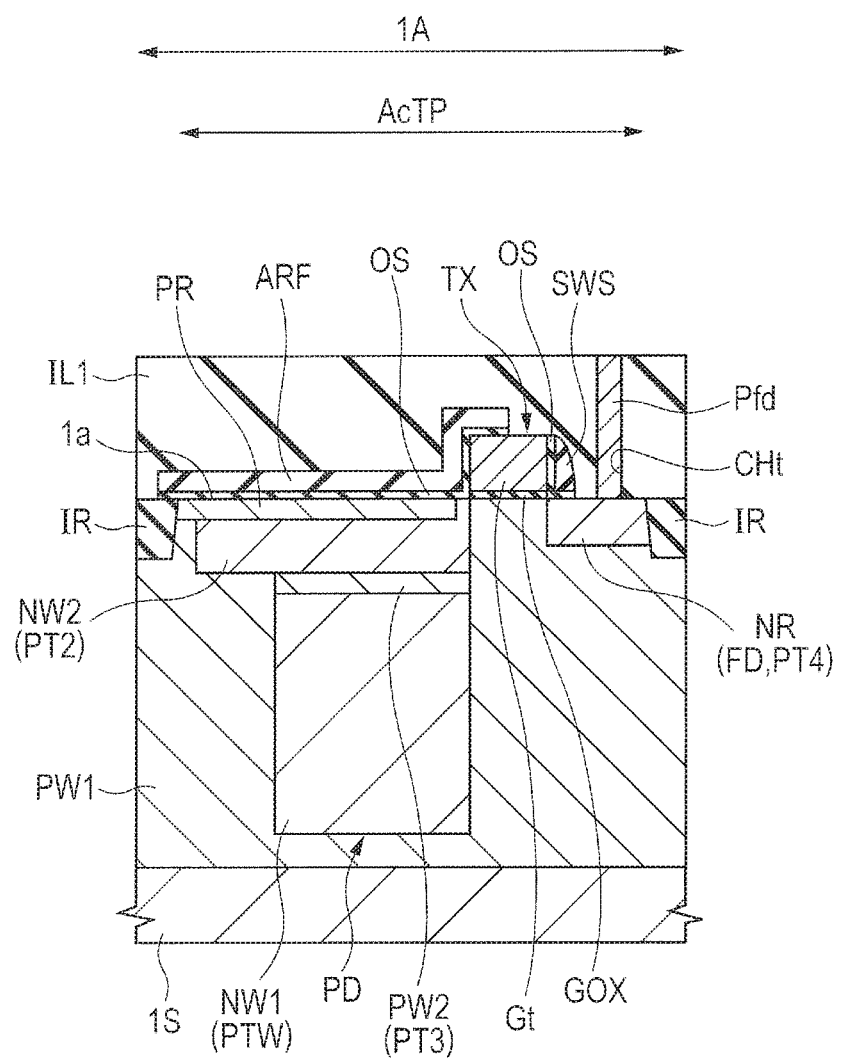
FIG. 23 is a cross-sectional view showing the manufacturing process of the semiconductor device in Embodiment 1.

Next, as shown in FIG. 23, the interlayer insulating film IL1, the contact hole CHt, and the plug Pfd are formed (Step S9 in FIG. 14).

In Step S9, first, in the pixel region 1A, over the top surface of the semiconductor substrate 1S, the interlayer insulating film IL1 is formed so as to cover the photodiode PD and the transfer transistor TX via the offset spacer OS, the antireflection film ARF, and the sidewall spacer SWS.

For example, over the semiconductor substrate 1S, a silicon dioxide film is deposited by a CVD method using a TEOS gas as a raw material gas. At this time, as necessary, the top surface of the interlayer insulating film IL1 is planarized using a CMP (Chemical Mechanical Polishing) method or the like.

At this time, in the peripheral circuit region, an interlayer insulating film may also be formed over the main surface 1a of the semiconductor substrate 1S so as to cover the transistor, though the illustration thereof is omitted. On the other hand, at this time, in the pixel region 1A, an interlayer insulating film may also be formed over the main surface 1a of the semiconductor substrate 1S so as to cover, e.g., the other transistors shown in FIG. 2, i.e., the reset transistor RST, the selection transistor SEL, and the amplification transistor AMI.

In Step S9, next, the interlayer insulating film IL1 is patterned to be formed with the contact hole CHt. Over the floating diffusion FD and the higher-concentration n-type semiconductor region NR as the drain region of the transfer transistor TX, the contact hole CHt is formed to extend through the interlayer insulating film IL1 and reach the higher-concentration n-type semiconductor region NR.

At this time, in the peripheral circuit region, respective contact holes may also be formed over the gate electrode and the source/drain regions of the transistor, though the illustration thereof is omitted. On the other hand, in the pixel region 1A, respective contact holes may also be formed over, e.g., the gate electrodes Gr, Gs, and Ga and the source/drain regions of, e.g., the other transistors shown in FIG. 2, i.e., the reset transistor RST, the selection transistor SEL, and the amplification transistor AMI. Alternatively, in the pixel region 1A, a contact hole may also be formed over the gate electrode Gt of the transfer transistor TX.

In Step S9, next, a titanium/titanium nitride film is formed over the interlayer insulating film IL1 including the bottom and side surfaces of the contact hole CHt. The titanium/ titanium nitride film is formed of a multilayer film including a titanium film and a titanium nitride film over the titanium film and can be formed using, e.g., a sputtering method. The titanium/titanium nitride film has a so-called diffusion barrier property which prevents, e.g., tungsten as the material of a film to be embedded in the subsequent step from being diffused into silicon.

Then, over the entire main surface 1a of the semiconductor substrate 1S, a tungsten film is formed so as to be embedded in the contact hole CHt. The tungsten film can be formed using, e.g., a CVD method. Then, by removing the unneeded titanium/titanium nitride film and the unneeded tungsten film which are formed over the interlayer insulating film IL1 by, e.g., a CMP method, the plug Pfd can be formed.

At this time, in the peripheral circuit region, respective plugs may also be formed over the gate electrode and the source/drain regions of the transistor, though the illustration thereof is omitted. On the other hand, in the pixel region 1A, respective plugs may also be formed over, e.g., the gate electrodes Gr, Gs, and Ga and the source/drain regions of, e.g., the other transistors shown in FIG. 2, i.e., the reset transistor RST, the selection transistor SEL, and the amplification transistor AMI. Alternatively, in the pixel region 1A, a plug may also be formed over the gate electrode Gt of the transfer transistor TX.

Figure 24:
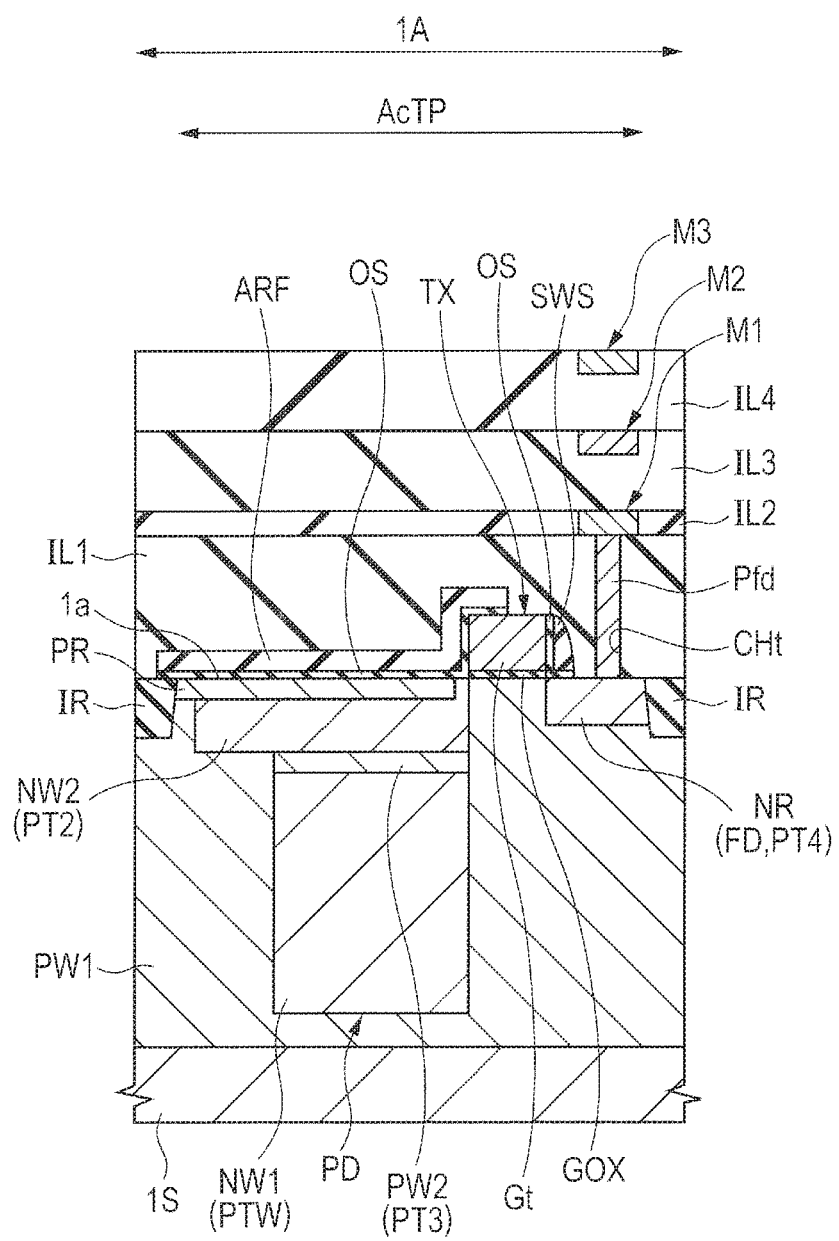
FIG. 24 is a cross-sectional view showing the manufacturing process of the semiconductor device in Embodiment 1.

Next, as shown in FIG. 24, the interlayer insulating films IL2 to IL4 and the wires M1 to M3 are formed (Step S10 in FIG. 14).

In Step S10, first, in the pixel region 1A, a multilayer film including a silicon nitride film and an overlying silicon dioxide film is formed as the interlayer insulating film IL2 over the interlayer insulating film IL1 by a CVD method or the like. Then, by patterning the multilayer film, wire trenches are formed.

In Step S10, next, over the interlayer insulating film IL2 including the inner portions of the wire trenches, a multilayer film including a tantalum (Ta) film and an overlying tantalum nitride (TaN) film is deposited as a barrier film by a sputtering method or the like. Then, over the barrier film, a thin copper film is deposited as a seed film (the illustration thereof is omitted) over the barrier film by a sputtering method or the like and a copper film is deposited over the seed film by an electrolytic plating method. Then, the unneeded barrier film, the unneeded seed film, and the unneeded copper film which are located over the interlayer insulating film IL2 are removed by a CMP method or the like. By thus embedding the barrier film, the seed film, and the copper film in each of the wire trenches, the wires M1 can be formed (single damascene method). Note that, in FIG. 24, each of the wires M1 including the barrier film, the seed film, and the copper film is integrally shown.

In Step S10, next, in the same manner as in the formation of the interlayer insulating film IL2 and the wires M1, the interlayer insulating film IL3 is formed over the interlayer insulating film IL2 in which the wires M1 are formed and the wires M2 are formed in the interlayer insulating film IL3. Over the interlayer insulating film IL3 in which the wires M2 are formed, the interlayer insulating film IL4 is formed and, in the interlayer insulating film IL4, the wires M3 are formed.

Next, as shown in FIG. 5, the color filter layer CF and the microlens ML are formed (Step S11 in FIG. 14).

In Step S11, first, in the pixel region 1A, the color filter layer CF is formed over the interlayer insulating film IL4. The color filter layer CF is a film which transmits light in a specific color such as, e.g., red (R), green (G), or blue (B) and does not transmit light in another color. Note that, between the color filter layer CF and the interlayer insulating film IL4, a light transmissive film TF1 made of, e.g., a silicon dioxide film may also be formed.

In Step S11, next, onto the color filter layer CF, the microlens ML as an on-chip lens is attached so as to overlap the photodiode PD in plan view.

By the foregoing process steps, the semiconductor device in Embodiment 1 can be manufactured.

(Embodiment 2)

In Embodiment 2, a description will be given of various examples in which the two-dimensional location of the n$^-$-type semiconductor region NW1 is varied in the semiconductor device in Embodiment 1.

A configuration of the semiconductor device in Embodiment 2 can be the same as the configuration of the semiconductor device in Embodiment 1 described using FIGS. 1 to 3, 5, and 6 except for the two-dimensional location of the n$^-$-type semiconductor region NW1, i.e., the two-dimensional location of the photodiode PD. Accordingly, a description thereof is omitted.

<Two-Dimensional Location of Photodiode>

Figure 27:
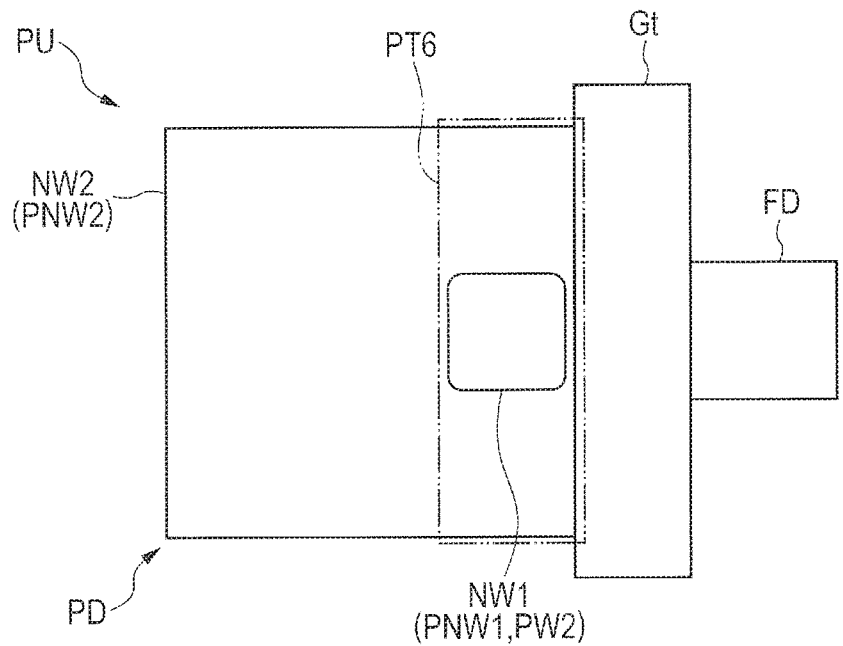
FIG. 27 is a plan view showing a configuration of a semiconductor device in Embodiment 2.

FIG. 27 is a plan view showing the configuration of the semiconductor device in Embodiment 2.

As shown in FIG. 27, in the semiconductor device in Embodiment 2, the n$^-$-type semiconductor region NW1 is included in the n-type semiconductor region NW2 in plan view. That is, the n-type semiconductor region NW2 includes a portion PNW1 and a portion PNW2 adjacent to the portion PNW1 in plan view, while the n$^-$-type semiconductor region NW1 is formed in the portion of the p-type well PW1 which is located under the portion PNW1 and is not formed in the portion thereof which is located under the portion PNW2.

When the n$^-$-type semiconductor region NW1 is formed by performing, e.g., Step S3 in FIG. 14 using an ion implantation method, a point defect occurs in the portion PTP (see FIG. 6) of the p-type well PW1 or an extremely small amount of contaminant is ion-implanted from an ion implantation device into the portion PTP. Such a point defect or contaminant increases a dark current or white spots. The dark current is a phenomenon in which a current flows even in the absence of light illumination. When the dark current increases, it is determined that there is light illumination even in the absence of light illumination, which causes erroneous lighting. As a result, white spots are formed to cause the degradation of a displayed image.

On the other hand, in the semiconductor device in Embodiment 2, the n$^-$-type semiconductor region NW1 is not formed in the portion of the p-type well PW1 which is located under the portion PNW2 of the n-type semiconductor region NW2. Consequently, in the portion of the p-type well PW1 which is located under the portion PNW2 of the n-type semiconductor region NW2, it is impossible to increase the internal quantum efficiency, but is possible to prevent or suppress increases in dark current and white spots.

In the semiconductor device in Embodiment 1 also, as shown in FIG. 4, the n$^-$-type semiconductor region NW1 is included in the n-type semiconductor region NW2 in plan view. However, in Embodiment 2, the area of the one n$^-$-type semiconductor region NW1 is significantly smaller than the area of the n-type semiconductor region NW2. As will be easily understood from a comparison with FIG. 35 described later, in the example shown in FIG. 27, the area of the one n$^-$-type semiconductor region NW1 is smaller than, e.g., one-ninth of the area of the n-type semiconductor region NW2. The n$^-$-type semiconductor region NW1, i.e., the portion PNW1 of the n-type semiconductor region NW2 having the smaller area results in an increase in the area of the portion PNW2 of the n-type semiconductor region NW2. This enhances the effect of preventing or suppressing increases in dark current and white spots.

Also, in the example shown in FIG. 27, the n$^-$-type semiconductor region NW1 and the p$^-$-type semiconductor region PW2 face a portion PT6 of the n-type semiconductor region NW2 which is closer to the gate electrode Gt in plan view. As a result, the n$^-$-type semiconductor region NW1 is closer to the gate electrode Gt in pan view. This increases the charge transfer efficiency when the charges generated in the n$^-$-type semiconductor region NW1 are transferred to the floating diffusion FD.

<First Modification of Embodiment 2>

Figure 28:
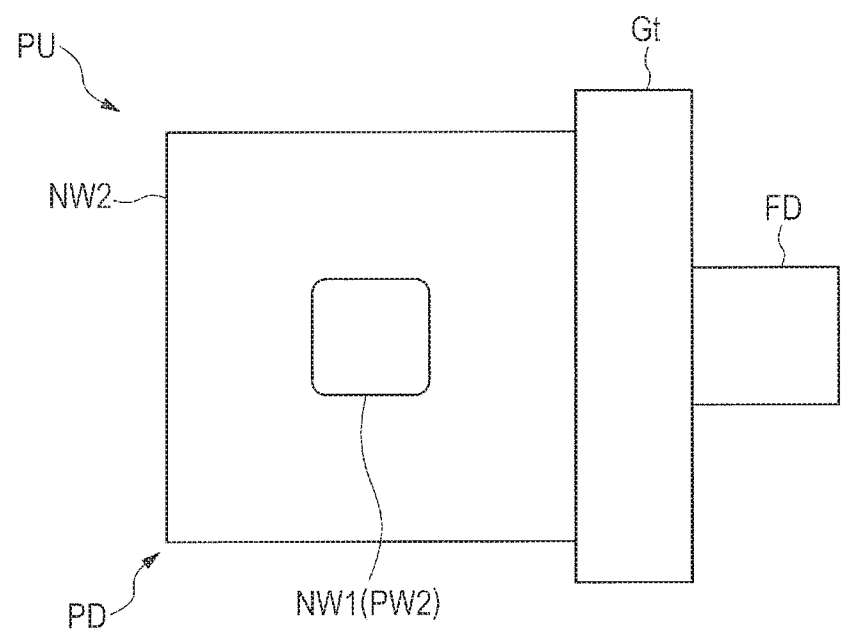
FIG. 28 is a plan view showing a configuration of a semiconductor device in a first modification of Embodiment 2.

FIG. 28 is a plan view showing a configuration of a semiconductor device in a first modification of Embodiment 2.

As shown in FIG. 28, in the semiconductor device in the present first modification, the n$^-$-type semiconductor region NW1 and the p$^-$-type semiconductor region PW2 face the middle portion of the n-type semiconductor region NW2 in the gate length direction of the gate electrode Gt in plan view. This increases the ratio of the portion of the incident light incident on the pixel PU which is incident on the n$^-$-type semiconductor region NW1 to the whole incident light incident on the pixel PU. Accordingly, the charge transfer efficiency when the charges generated in the n$^-$-type semiconductor region NW1 are transferred to the floating diffusion FD decreases compared to that in Embodiment 2. However, even when incident light is incident on the portion of the p-type well PW1 which is further away from the main surface 1a, the internal quantum efficiency can be increased.

<Second Modification of Embodiment 2>

Figure 29:
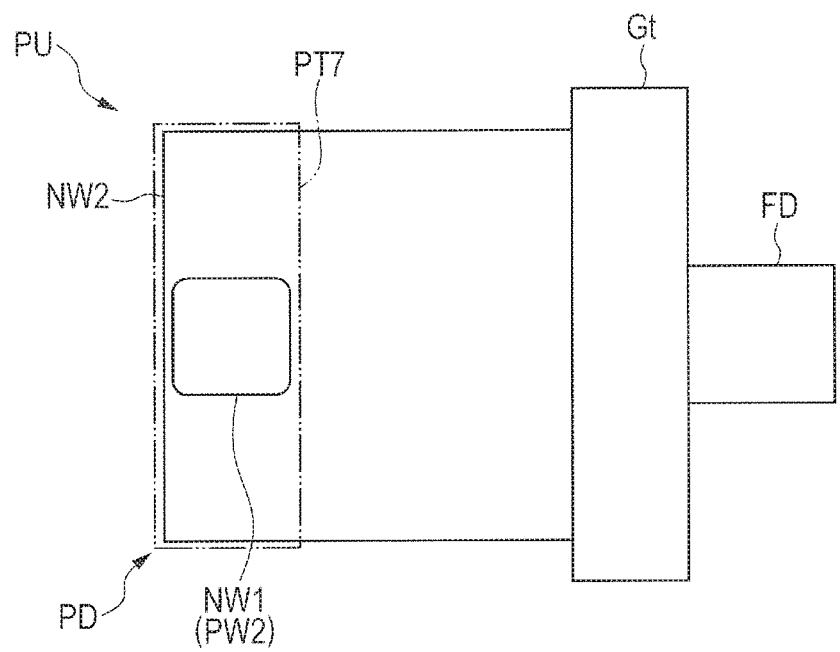
FIG. 29 is a plan view showing a configuration of a semiconductor device in a second modification of Embodiment 2.

FIG. 29 is a plan view showing a configuration of a semiconductor device in a second modification of Embodiment 2.

As shown in FIG. 29, in the semiconductor device in the present second modification, the n$^-$-type semiconductor region NW1 and the p$^-$-type semiconductor region PW2 face a portion PT7 of the n-type semiconductor region NW2 which is opposite to the gate electrode Gt in plan view.

The potential energy in a plane extending through the n$^-$-type semiconductor region NW1 in parallel relation with the main surface 1a (see FIG. 6) has a distribution having a peak portion in the p-type well PW1 and a valley portion in the n$^-$-type semiconductor region NW1. Accordingly, the n$^-$-type semiconductor region NW1 attracts the charges generated in another photodiode PD adjacent to the photodiode PD including the n$^-$-type semiconductor region NW1. In such a case, a cross talk may occur between the adjacent pixels PU.

On the other hand, in the case where the n$^-$-type semiconductor region NW1 is disposed so as to face the portion of the n-type semiconductor region NW2 which is opposite to the gate electrode Gt in plan view as in the present second modification, the n$^-$-type semiconductor region NW1 can retract the charges attracted by the photodiode PD which is adjacent thereto and located opposite to the gate electrode Gt relative to the n-type semiconductor region NW2 interposed therebetween. Accordingly, the charge transfer efficiency when the charges generated in the n$^-$-type semiconductor region NW1 are transferred to the floating diffusion FD decreases compared to that in Embodiment 2. However, it is possible to suppress the cross talk with the pixel PU which is adjacent to the n$^-$-type semiconductor region NW1 and located opposite to the gate electrode Gt relative to the n-type semiconductor region NW2 interposed therebetween.

<Third Modification of Embodiment 2>

Figure 30:
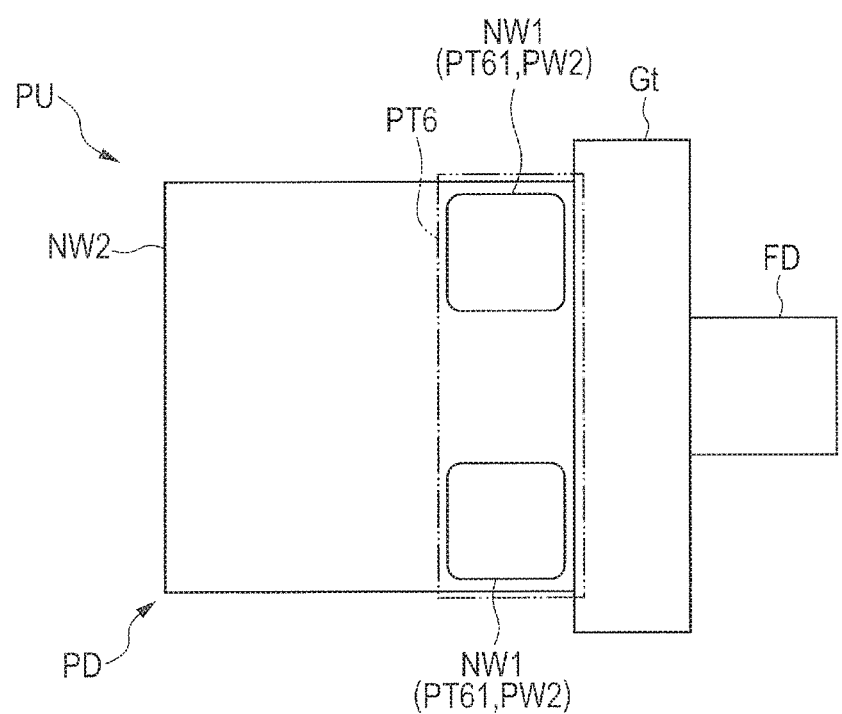
FIG. 30 is a plan view showing a configuration of a semiconductor device in a third modification of Embodiment 2.

FIG. 30 is a plan view showing a configuration of a semiconductor device in a third modification of Embodiment 2.

As shown in FIG. 30, the semiconductor device in the present third modification includes a plurality of the n⁻-type semiconductor regions NW1 and a plurality of the p⁻-type semiconductor regions PW2. The plurality of n⁻-type semiconductor regions NW1 are formed in the p-type well PW1 to be spaced apart from each other in plan view. The plurality of p⁻-type semiconductor regions PW2 are formed respectively in the plurality of portions PT3 (see FIG. 6) of the p-type well PW1 which are located between the n-type semiconductor region NW2 and the plurality of n⁻-type semiconductor regions NW1. The n-type semiconductor region NW2 is formed in the portion PT2 (see FIG. 6) of the p-type well PW1 which is located closer to the main surface 1a (see FIG. 6) than the plurality of n⁻-type semiconductor regions NW1. The plurality of n⁻-type semiconductor regions NW1 are included in the n-type semiconductor region NW2 in plan view.

The potential energy in a plane extending through the plurality of n⁻-type semiconductor regions NW1 in parallel relation with the main surface 1a has a distribution having a peak portion in the p-type well PW1 and respective valley portions in the plurality of n⁻-type semiconductor regions NW1. Accordingly, charges are generated by photoelectric conversion in the portion of the p-type well PW1 which is interposed between the two adjacent n⁻-type semiconductor regions NW1 to flow into either of the two n⁻-type semiconductor regions NW1. The charges are then allowed to move into the n-type semiconductor region NW2 along the inclination of the potential energy in the depth direction.

In the example shown in FIG. 30, the semiconductor device in the present third modification has the two n⁻-type semiconductor regions NW1 and the two p⁻-type semiconductor regions PW2. The two n⁻-type semiconductor regions NW1 face two respective portions PT61 of the portion PT6 of the n-type semiconductor region NW2 which is closer to the gate electrode Gt. The two portions PT61 are located on both ends of the portion PT6 in the gate width direction of the gate electrode Gt. This can increase the charge transfer efficiency when the charges generated in the n⁻-type semiconductor regions NW1 are transferred to the floating diffusion FD compared to that in Embodiment 2 and suppress the cross talk with the pixel PU adjacent to the n-type semiconductor region NW2 in the gate width direction of the gate electrode Gt.

<Fourth Modification of Embodiment 2>

Figure 31:
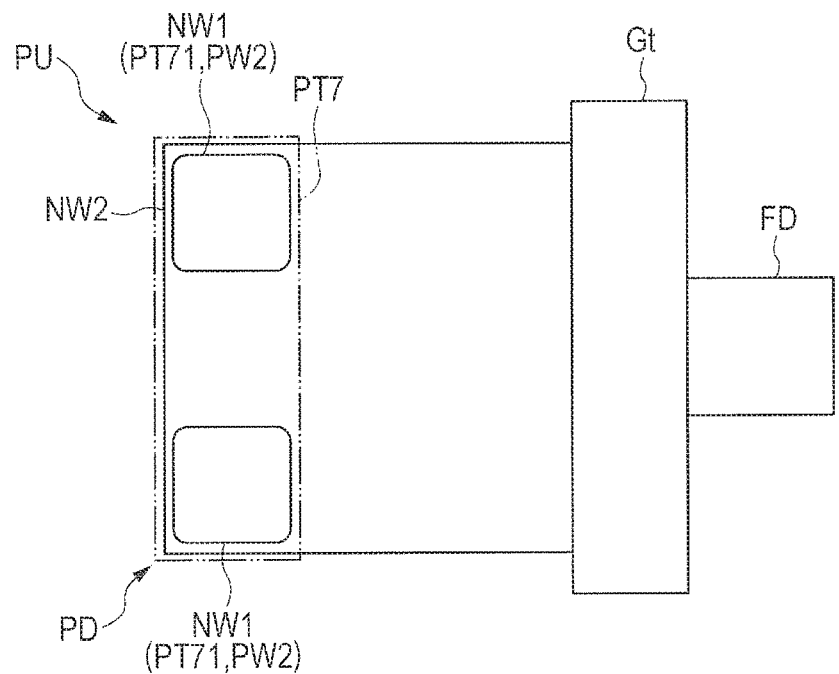
FIG. 31 is a plan view showing a configuration of a semiconductor device in a fourth modification of Embodiment 2.

FIG. 31 is a plan view showing a configuration of a semiconductor device in a forth modification of Embodiment 2.

As shown in FIG. 31, the semiconductor device in the fourth modification also includes the two n⁻-type semiconductor regions NW1 and the two p⁻-type semiconductor regions PW2, similarly to the semiconductor device in the third modification of Embodiment 1.

However, in the semiconductor device in the present fourth modification, unlike in the semiconductor device in the third modification of Embodiment 1, the two n⁻-type semiconductor regions NW1 face two respective portions PT71 of the portion PT7 of the n-type semiconductor region NW2 which is opposite to the gate electrode Gt. The two portions PT71 are located on both ends of the portion PT7 in the gate width direction of the gate electrode Gt. This reduces the charge transfer efficiency with which the charges generated in the n⁻-type semiconductor regions NW1 are transferred compared to that in Embodiment 2, but can suppress the cross talk with the adjacent pixel PU which is located opposite to the gate electrode Gt relative to the n-type semiconductor region NW2 interposed therebetween and with the pixel PU adjacent to the n-type semiconductor region NW2 in the gate width direction of the gate electrode Gt.

<Fifth Modification of Embodiment 5>

Figure 32:
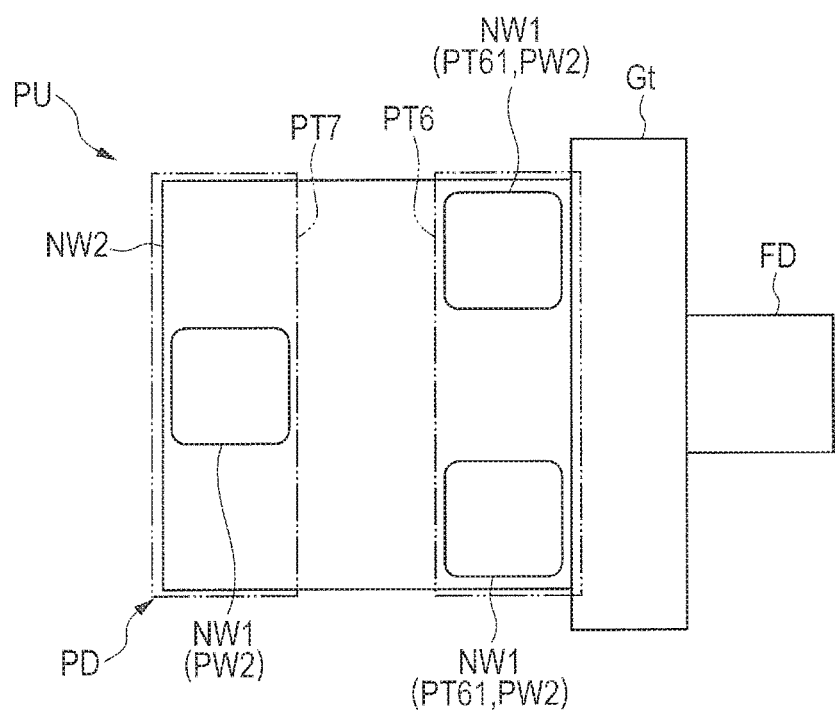
FIG. 32 is a plan view showing a configuration of a semiconductor device in a fifth modification of Embodiment 2.

FIG. 32 is a plan view showing a configuration of a semiconductor device in a fifth modification of Embodiment 2.

As shown in FIG. 32, the semiconductor device in the present fifth modification includes the three n⁻-type semiconductor regions NW1 and the three p⁻-type semiconductor regions PW2.

The semiconductor device in the present fifth modification includes, in addition to the one n⁻-type semiconductor region NW1 included in the semiconductor device (see FIG. 29) in the second modification of Embodiment 2, the two n⁻-type semiconductor regions NW1 included in the semiconductor device (see FIG. 30) in the third modification of Embodiment 2. Accordingly, in the present fifth modification, it is possible to increase the charge transfer efficiency with which the charges generated in the n⁻-type semiconductor regions NW1 are transferred compared to that in Embodiment 2 and suppress the cross talk with the adjacent pixel PU which is located opposite to the gate electrode Gt relative to the n-type semiconductor region NW2 interposed therebetween and with the pixel PU adjacent to the n-type semiconductor region NW2 in the gate width direction of the gate electrode Gt.

<Sixth Modification of Embodiment 2>

Figure 33:
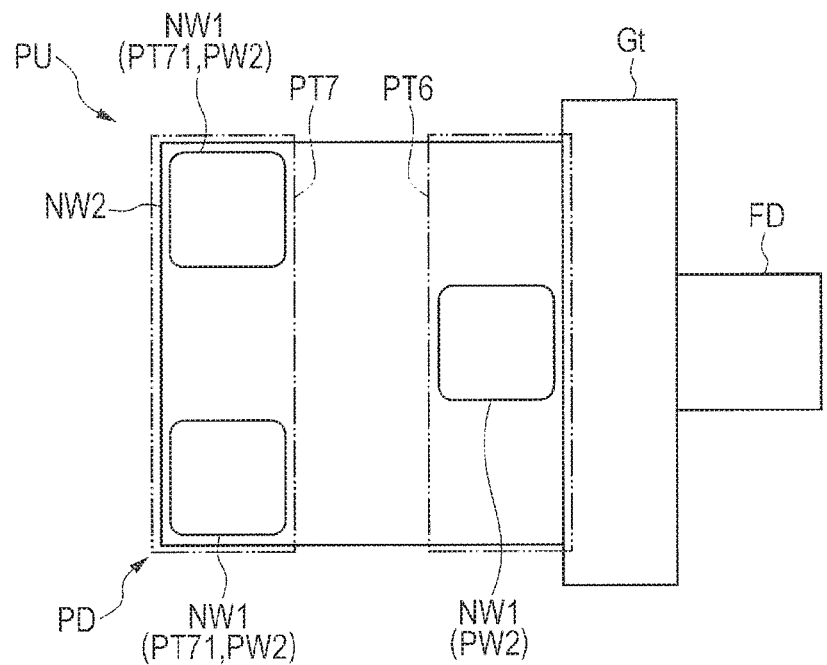
FIG. 33 is a plan view showing a configuration of a semiconductor device in a sixth modification of Embodiment 2.

FIG. 33 is a plan view showing a configuration of a semiconductor device in a sixth modification of Embodiment 2.

As shown in FIG. 33, the semiconductor device in the present sixth modification includes the three n⁻-type semiconductor regions NW1 and the three p⁻-type semiconductor regions PW2.

The semiconductor device in the present sixth modification includes, in addition to the one n⁻-type semiconductor region NW1 included in the semiconductor device (see FIG. 27) in Embodiment 2, the two n⁻-type semiconductor regions NW1 included in the semiconductor device (see FIG. 31) in the fourth modification of Embodiment 2. Accordingly, in the present sixth modification, the charge transfer efficiency with which the charges generated in the n⁻-type semiconductor regions NW1 are transferred is about the same as in Embodiment 2, but it is possible to suppress the cross talk with the adjacent pixel PU which is located opposite to the gate electrode Gt relative to the n-type semiconductor region NW2 interposed therebetween and with the pixel PU adjacent to the n-type semiconductor region NW2 in the gate width direction of the gate electrode Gt.

Note that, in the present sixth embodiment, the one n⁻-type semiconductor region NW1 faces the portion PT6 of the n-type semiconductor region NW2 which is closer to the gate electrode Gt, while the two n⁻-type semiconductor regions NW1 face the portion PT7 of the n-type semiconductor region NW2 which is opposite to the gate electrode Gt. By contrast, in the fifth modification (see FIG. 32) of Embodiment 2, the two n⁻-type semiconductor regions NW1 face the portion PT6 of the n-type semiconductor region NW2 which is closer to the gate electrode Gt, while the one n⁻-type semiconductor region NW1 faces the portion PT7 of the n-type semiconductor region NW2 which is opposite to the gate electrode Gt.

Accordingly, the charge transfer efficiency when the charges generated in the n⁻-type semiconductor regions NW1 to the floating diffusion FD is higher in the semiconductor device in the fifth modification of Embodiment 2 than in the semiconductor device in the present sixth modification. However, the effect of suppressing the crosstalk with the adjacent pixel PU which is located opposite to the gate electrode Gt relative to the n-type semiconductor region NW2 interposed therebetween is higher in the semiconductor device in the present sixth modification than in the semiconductor device in the fifth modification of Embodiment 2.

<Seventh Modification of Embodiment 2>

Figure 34:
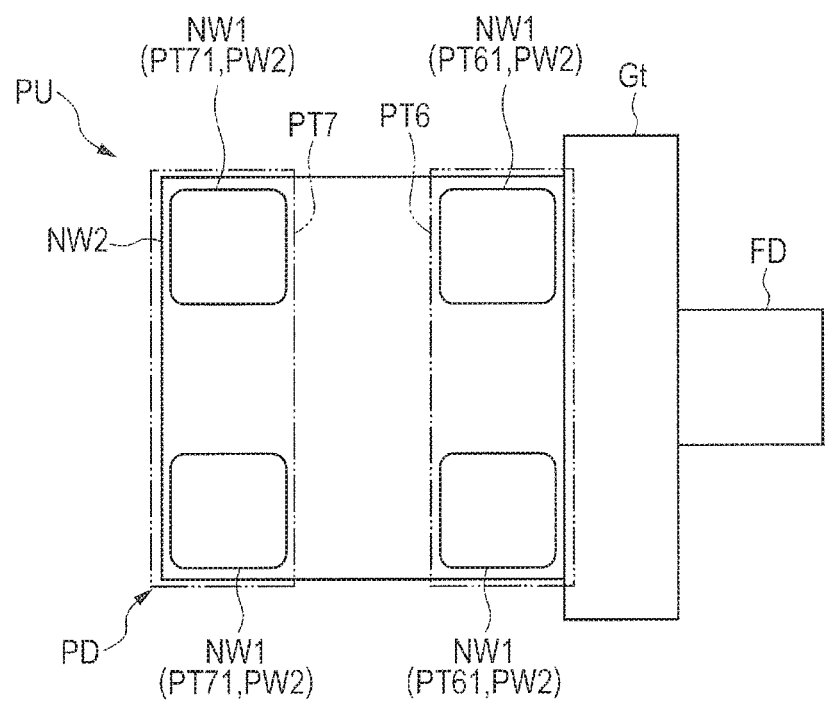
FIG. 34 is a plan view showing a configuration of a semiconductor device in a seventh modification of Embodiment 2.

FIG. 34 is a plan view showing a configuration of a semiconductor device in a seventh modification of Embodiment 2.

As shown in FIG. 34, the semiconductor device in the present seventh modification has the four n⁻-type semiconductor regions NW1 and the four p⁻-type semiconductor regions PW2. The four n⁻-type semiconductor regions NW1 are formed in the p-type well PW1 to be spaced apart from each other in plan view. On the other hand, the four p⁻-type semiconductor regions PW2 are formed respectively in the four portions PT3 of the p-type well PW1 which are located between the n-type semiconductor region NW2 and the plurality of n⁻-type semiconductor regions NW1. The n-type semiconductor region NW2 is formed in the portion PT2 (see FIG. 6) of the p-type well PW1 which is located closer to the main surface 1a (see FIG. 6) than the four n⁻-type semiconductor regions NW1. Each of the four n⁻-type semiconductor regions NW1 is included in the n-type semiconductor region NW2 in plan view.

The semiconductor device in the present seventh modification includes, in addition to the two n⁻-type semiconductor regions NW1 included in the semiconductor device (see FIG. 30) in the third modification of Embodiment 2, the two n⁻-type semiconductor regions NW1 included in the semiconductor device (see FIG. 31) in the fourth modification of Embodiment 2. Accordingly, in the present seventh modification, it is possible to increase the charge transfer efficiency with which the charges generated in the n⁻-type semiconductor regions NW1 are transferred compared to that in Embodiment 2 and suppress the cross talk with the adjacent pixel PU which is located opposite to the gate electrode Gt relative to the n-type semiconductor region NW2 interposed therebetween and with the pixel PU adjacent to the n-type semiconductor region NW2 in the gate width direction of the gate electrode Gt.

The charge transfer efficiency with which the charges generated in the n⁻-type semiconductor regions NW1 are transferred is higher in the semiconductor device in the present seventh modification than in the semiconductor device in the sixth modification of Embodiment 2. Also, the effect of suppressing the cross talk with the adjacent pixel PU which is located opposite to the gate electrode Gt relative to the n-type semiconductor region NW2 interposed therebetween is higher in the semiconductor device in the present seventh modification than in the semiconductor device in the fifth modification of Embodiment 2.

<Eighth Modification of Embodiment 2>

Figure 35:
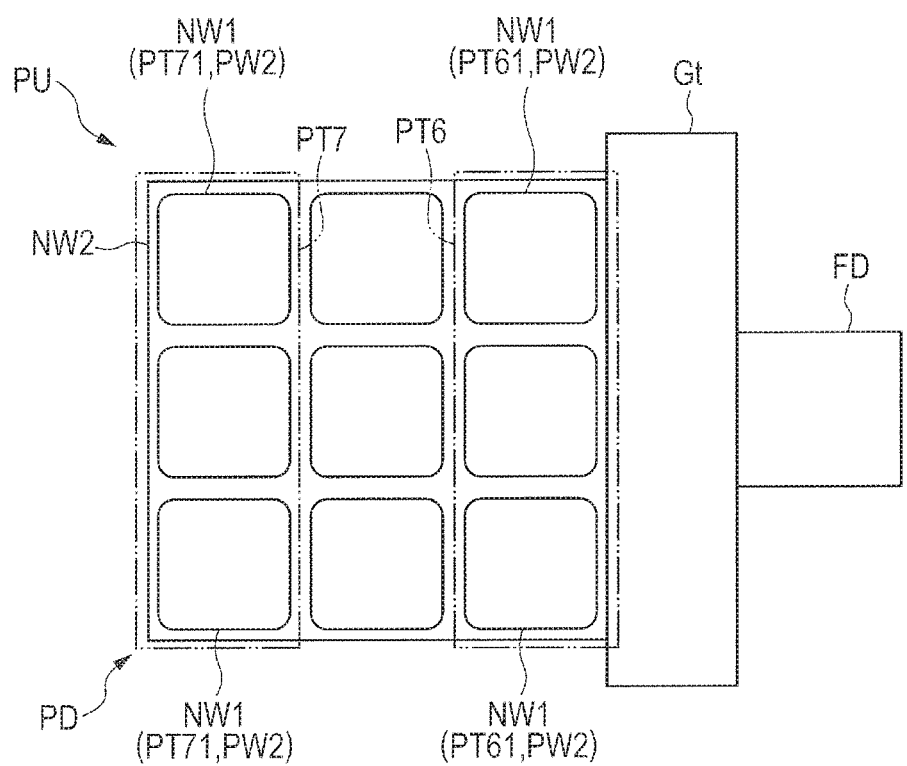
FIG. 35 is a plan view showing a configuration of a semiconductor device in an eighth modification of Embodiment

FIG. 35 is a plan view showing a configuration of a semiconductor device in an eighth modification of Embodiment 2.

As shown in FIG. 35, the semiconductor device in the present eighth modification includes the plurality of n⁻-type semiconductor regions NW1 and the plurality of p⁻-type semiconductor regions PW2, in the same manner as described in the third modification of Embodiment 2.

On the other hand, as shown in FIG. 35, in the semiconductor device in the present eighth modification, unlike in the semiconductor device in the third modification of Embodiment 2, the plurality of n⁻-type semiconductor regions NW1 are arranged in a matrix pattern in the gate length and width directions of the gate electrode Gt. That is, the plurality of n⁻-type semiconductor regions NW1 are formed in the p-type well PW1 to be spaced apart from each other in plan view. On the other hand, the plurality of p⁻-type semiconductor regions PW2 are formed respectively in the plurality of portions PT3 of the p-type well PW1 which are located between the n-type semiconductor region NW2 and the plurality of n⁻-type semiconductor regions NW1. The n-type semiconductor region NW2 is formed in the portion PT2 (see FIG. 6) of the p-type well PW1 which is located closer to the main surface 1a (see FIG. 6) than the plurality of n⁻-type semiconductor regions NW1. Each of the plurality of n⁻-type semiconductor regions NW1 is included in the n-type semiconductor region NW2 in plan view.

This can increase the charge transfer efficiency with which the charges generated in the n⁻-type semiconductor regions NW1 are transferred compared to that in Embodiment 2. In addition, since the ratio of the total area of the plurality of n⁻-type semiconductor regions NW1 to the area of the n-type semiconductor region NW2 is higher than in Embodiment 2, the internal quantum efficiency can be increased. For example, the three n⁻-type semiconductor regions NW1 face the portion PT6 of the n-type semiconductor region NW2 which is closer to the gate electrode Gt while, for example, the three n⁻-type semiconductor regions NW1 face the portion PT7 of the n-type semiconductor region NW2 which is opposite to the gate electrode Gt. This can suppress the cross talk with the adjacent pixel PU which is located opposite to the gate electrode Gt relative to the n-type semiconductor region NW2 interposed therebetween and with the pixel PU adjacent to the n-type semiconductor region NW2 in the gate width direction of the gate electrode Gt.

(Embodiment 3)

In Embodiment 1, the description has been given of the example in which the one pixel PU is formed which allows, even when incident light is incident on the portion of the p-type well PW1 which is further away from the main surface 1a, the charge transfer efficiency to be increased, while ensuring the internal quantum efficiency. On the other hand, in Embodiment 3, a description will be given of an example in which the three pixels PU are formed on which respective incident light beams in three colors having different wavelengths are incident. Note that the different wavelengths of the light beams in three colors include the wavelength when the incident light is incident on the portion of the p-type well PW1 which is closer to the main surface 1a.

A configuration of each of three pixels PU1, PU2, and PU3 included in the semiconductor device in Embodiment 3 can be the same as the configuration of the pixel PU included in the semiconductor device in Embodiment 1 except for photodiodes PD1, PD2, and PD3 and color filter layers CF1, CF2, and CF3. Accordingly, a description thereof is omitted.

<Element Structure in Pixel Region>

Figure 36:
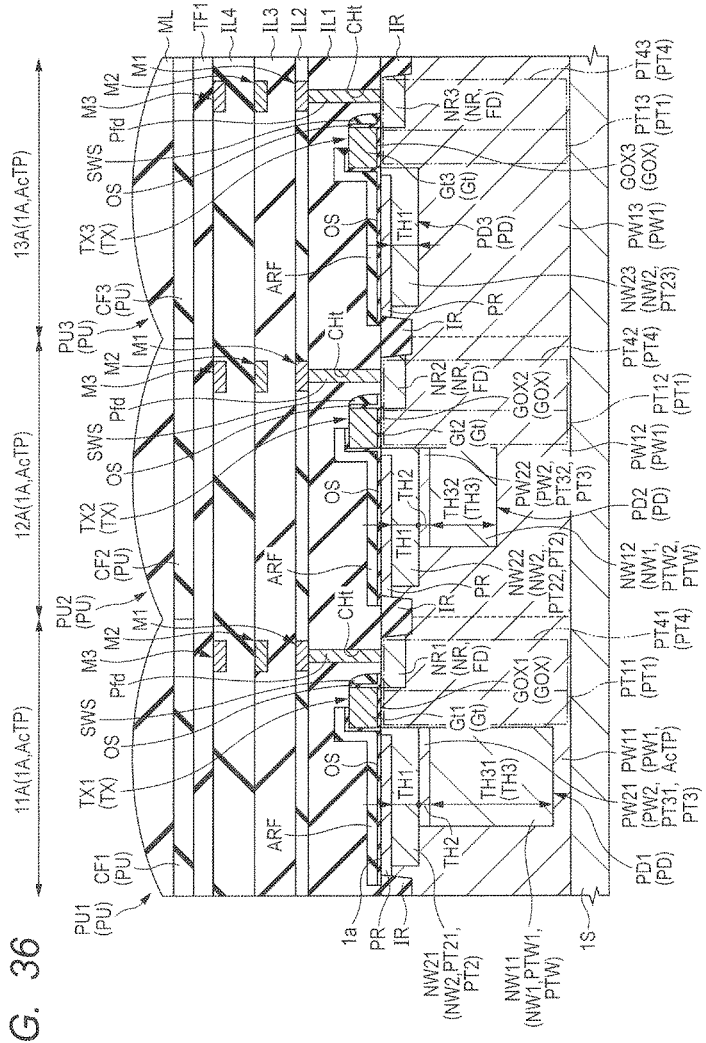
FIG. 36 is a cross-sectional view showing a configuration of a semiconductor device in Embodiment 3.

FIG. 36 is a cross-sectional view showing a configuration of the semiconductor device in Embodiment 3.

As shown in FIG. 36, the semiconductor device in Embodiment 3 includes the semiconductor substrate 1S and the active region AcTP formed as the semiconductor region in each of regions 11A, 12A, and 13A of the pixel region 1A in the semiconductor substrate 1S which is closer to the main surface 1a, similarly to the semiconductor device in Embodiment 1. In the active region AcTP, the three pixels PU are formed. In other words, the semiconductor device in Embodiment 3 has the pixels PU1, PU2, and PU3 as the three pixels PU. The pixel PU1 is formed in the region 11A, the pixel PU2 is formed in the region 12A, and the pixel PU3 is formed in the region 13A.

The wavelength of the incident light beam incident on the pixel PU2 is shorter than the wavelength of the incident light beam incident on the pixel PU1. The wavelength of the incident light beam incident on the pixel PU3 is shorter than the wavelength of the incident light beam incident on the pixel PU2. Accordingly, e.g., the red (R) incident light beam is incident on the pixel PU1, the green (G) incident light beam is incident on the pixel PU2, and the blue (B) incident light beam is incident on the pixel PU3.

The pixel PU1 has the photodiode PD1 as the photodiode PD and the color filter layer CF1 as the color filter layer CF. The pixel PU2 has the photodiode PD2 as the photodiode PD and the color filter layer CF2 as the color filter layer CF. The pixel PU3 has the photodiode PD3 as the photodiode PD and the color filter layer CF3 as the color filter layer CF. The color filter layer CF1 transmits, e.g., the red (R) light beam. The color filter layer CF2 transmits, e.g., the green (G) light beam. The color filter layer CF3 transmits, e.g., the blue (B) light beam.

The photodiode PD1 receives, e.g., the red (R) incident light beam and converts the received light beam to charges. The photodiode PD2 receives, e.g., the green (G) incident light beam and converts the received light beam to charges. The photodiode PD3 receives, e.g., the blue (B) incident light beam and converts the received light beam to charges.

The pixel PU1 has a p-type well PW11 which is a portion of the p-type well PW1, an n$^-$-type semiconductor region NW11 serving as the n$^-$-type semiconductor region NW1, and a gate electrode Gt1 serving as the gate electrode Gt. The pixel PU1 also has an n-type semiconductor region NW21 serving as the n-type semiconductor region NW2, a p$^-$-type semiconductor region PW21 serving as the p$^-$-type semiconductor region PW2, and a higher-concentration n-type semiconductor region NR1 serving as the higher-concentration n-type semiconductor region NR.

The p-type well PW11 is formed in the region 11A of the semiconductor substrate 1S which is closer to the main surface 1a. The n$^-$-type semiconductor region NW11 is formed in a portion PTW1 of the p-type well PW11 which serves as the inner portion PTW. The gate electrode Gt1 is formed over a portion PT11 of the p-type well PW11 which serves as the portion PT1 and is located on the first side (right side in FIG. 36) of the n$^-$-type semiconductor region NW11 in the gate length direction in plan view via a gate insulating film GOX1 serving as the gate insulating film GOX. The n-type semiconductor region NW21 is formed in a portion PT21 of the p-type well PW11 which serves as the portion PT2 and is located closer to the main surface 1a than the n$^-$-type semiconductor region NW11. The p$^-$-type semiconductor region PW21 is formed in a portion PT31 of the p-type well PW11 which serves as the portion PT3 and is located between the n$^-$-type semiconductor region NW11 and the n-type semiconductor region NW21. The higher-concentration n-type semiconductor region NR1 is formed in a portion PT41 of the p-type well PW11 which serves as the portion PT4 and is located opposite to the n$^-$-type semiconductor region NW11 relative to the gate electrode Gt1 interposed therebetween in plan view.

The p-type well PW11, the n$^-$-type semiconductor region NW11, the n-type semiconductor region NW21, and the p$^-$-type semiconductor region PW21 form the photodiode PD1 as the photodiode PD. The gate electrode Gt1 and the higher-concentration n-type semiconductor region NR1 form a transfer transistor TX1 as the transfer transistor TX.

The pixel PU1 in Embodiment 3 can be the same as the pixel PU in Embodiment 1. Accordingly, even when, e.g., the red (R) incident light beam incident on the pixel PU1 is incident on the portion of the p-type well PW1 which is further away from the main surface 1a, it is possible to increase the charge transfer efficiency, while ensuring the internal quantum efficiency.

The pixel PU2 has a p-type well PW12 which is a portion of the p-type well PW1, an n$^-$-type semiconductor region NW12 serving as the n$^-$-type semiconductor region NW1, and a gate electrode Gt2 serving as the gate electrode Gt. The pixel PU2 also has an n-type semiconductor region NW22 serving as the n-type semiconductor region NW2, a p$^-$-type semiconductor region PW22 serving as the p$^-$-type semiconductor region PW2, and a higher-concentration n-type semiconductor region NR2 serving as the higher-concentration n-type semiconductor region NR.

The p-type well PW12 is formed in the region 12A of the semiconductor substrate 1S which is closer to the main surface 1a. The p-type well PW12 is formed in the same layer as that of the p-type well PW11. The n$^-$-type semiconductor region NW12 is formed in a portion PTW2 of the p-type well PW12 which serves as the inner portion PTW to be away from the main surface 1a. The gate electrode Gt2 is formed over a portion PT12 of the p-type well PW12 which serves as the portion PT1 and is located on the second side (right side in FIG. 36) of the n$^-$-type semiconductor region NW12 in the gate length direction in plan view via a gate insulating film GOX2 serving as the gate insulating film GOX. The n-type semiconductor region NW22 is formed in a portion PT22 of the p-type well PW22 which serves as the portion PT2 and is located closer to the main surface 1a than the n$^-$-type semiconductor region NW12. The p$^-$-type semiconductor region PW22 is formed in a portion PT32 of the p-type well PW12 which serves as the portion PT3 and is located between the n$^-$-type semiconductor region NW12 and the n-type semiconductor region NW22. The higher-concentration n-type semiconductor region NR2 is formed in a portion PT42 of the p-type well PW12 which serves as the portion PT4 and is located opposite to the n$^-$-type semiconductor region NW12 relative to the gate electrode Gt2 interposed therebetween in plan view.

The p-type well PW12, the n$^-$-type semiconductor region NW12, the n-type semiconductor region NW22, and the p$^-$-type semiconductor region PW22 form the photodiode PD2 as the photodiode PD. The gate electrode Gt2 and the higher-concentration n-type semiconductor region NR2 form a transfer transistor TX2 as the transfer transistor TX.

A net impurity concentration in the n$^-$-type semiconductor region NW12 is lower than a net impurity concentration in the n-type semiconductor region NW22. A net impurity concentration in the p$^-$-type semiconductor region PW22 is lower than a net impurity concentration in the p-type well PW12.

It is assumed that the thickness TH3 of the n$^-$-type semiconductor region NW11 in the depth direction in the pixel PU1 is a thickness TH31 and the thickness TH3 of the n$^-$-type semiconductor region NW12 in the depth direction in the pixel PU2 is a thickness TH32. At this time, the thickness TH32 is smaller than the thickness TH31. Even in such a case, when the wavelength of the incident light beam incident on the pixel PU2 is shorter than the wavelength of the incident light beam incident on the pixel PU1 and the portion of the p-type well PW1 on which the incident light beam incident on the pixel PU2 is incident is closer to the main surface 1a than the portion of the p-type well PW1 on which the incident light beam incident on the pixel PU1 is incident, it is possible to increase the charge transfer efficiency, while ensuring the internal quantum efficiency.

Specifically, the thickness TH31 can be set to, e.g., about 3 μm and the thickness TH32 can be set to, e.g., about 1.5 μm.

On the other hand, the pixel PU3 includes a p-type well PW13 which is a portion of the p-type well PW1, a gate electrode Gt3 serving as the gate electrode Gt, an n-type semiconductor region NW23 serving as the n-type semiconductor region NW2, and a higher-concentration n-type semiconductor region NR3 serving as the higher-concentration n-type semiconductor region NR. The pixel PU3 has neither the n$^-$-type semiconductor region NW1 nor the p$^-$-type semiconductor region PW2.

The p-type well PW13 is formed in the region 13A of the semiconductor substrate 1S which is closer to the main surface 1a. The p-type well PW13 is formed in the same layer as that of the p-type well PW11. The n-type semiconductor region NW23 is formed in a portion PT23 as an upper-layer portion of the p-type well PW13. The gate electrode Gt3 is formed over a portion PT13 of the p-type well PW13 which serves as the portion PT1 and is located on a third side (right side in FIG. 36) of the n-type semiconductor region NW23 in the gate length direction in plan view via a gate insulating film GOX3 as the gate insulating film GOX. The higher-concentration n-type semiconductor region NR3 is formed in a portion PT43 of the p-type well PW13 which serves as the portion PT4 and is located opposite to the n-type semiconductor region NW23 relative to the gate electrode Gt3 interposed therebetween in plan view.

The p-type well PW13 and the n-type semiconductor region NW23 form the photodiode PD3 as the photodiode PD. The gate electrode Gt3 and the higher-concentration n-type semiconductor region NR3 form a transfer transistor TX3 as the transfer transistor TX.

The pixel PU3 has neither the n$^-$-type semiconductor region NW1 nor the p$^-$-type semiconductor region PW2. Even in such a case, when the wavelength of the incident light beam incident on the pixel PU3 is shorter than the wavelength of the incident light beam incident on the pixel PU2 and the portion of the p-type well PW1 on which the incident light beam incident on the pixel PU3 is incident is closer to the main surface 1a than the portion of the p-type well PW1 on which the incident light beam incident on the pixel PU2 is incident, it is possible to increase the charge transfer efficiency, while ensuring the internal quantum efficiency. In addition, by reducing the thickness TH32 in pixel PU2 and not forming the n$^-$-type semiconductor region NW1 in the pixel PU3, it is possible to prevent or suppress increases in dark current and white spots.

That is, in Embodiment 3, in accordance with the wavelength of light incident on the pixel PU, it is possible to increase the charge transfer efficiency, while optimizing the internal quantum efficiency, and reduce the dark current and the white spots.

<Manufacturing Method of Semiconductor Device>

In a manufacturing method of the semiconductor device in Embodiment 3, when the same step as Step S3 in FIG. 14 is performed, the n$^-$-type semiconductor region NW11 is formed in the region 11A and the n$^-$-type semiconductor region NW12 is formed in the region 12A, while the n$^-$-type semiconductor region NW1 is not formed in the region 13A. The thickness TH32 of the n$^-$-type semiconductor region NW12 in the depth direction is smaller than the thickness HT31 of the n$^-$-type semiconductor region NW11 in the depth direction.

Also, in the manufacturing method of the semiconductor device in Embodiment 3, when the same step as Step S5 in FIG. 14 is performed, the p$^-$-type semiconductor region PW21 is formed in the region 11A and the p$^-$-type semiconductor region PW22 is formed in the region 12A, while the p$^-$-type semiconductor region PW2 is not formed in the region 13A.

The manufacturing method of the semiconductor device in Embodiment 3 can be otherwise the same as the manufacturing method of the semiconductor device in Embodiment 1.

(Embodiment 4)

In Embodiment 3, the description has been given of the example in which the semiconductor device is a top-illuminated image sensor in which light is incident on the top surface of the semiconductor substrate. By contrast, in Embodiment 4, a description will be given of an example in which a semiconductor device is a back-illuminated image sensor in which light is incident on the back surface of a semiconductor substrate.

For example, in the top-illuminated image sensor, the light incident on the microlens is transmitted by an interlayer insulating film to illuminate the photodiode. The portion of the interlayer insulating film which is located over the photodiode is formed with no wiring layer, but serves as a light transmission region. However, with an increase in the number of pixels in the image sensor and with a reduction in the size thereof, the area of the light transmission region decreases. In the top-illuminated image sensor, the amount of the light incident on the photodiode may decrease.

Accordingly, a back-illuminated image sensor is proposed which allows light to be incident on the back surface of a semiconductor substrate and efficiently reach a photodiode.

<Element Structure in Pixel Region>

Figure 37:
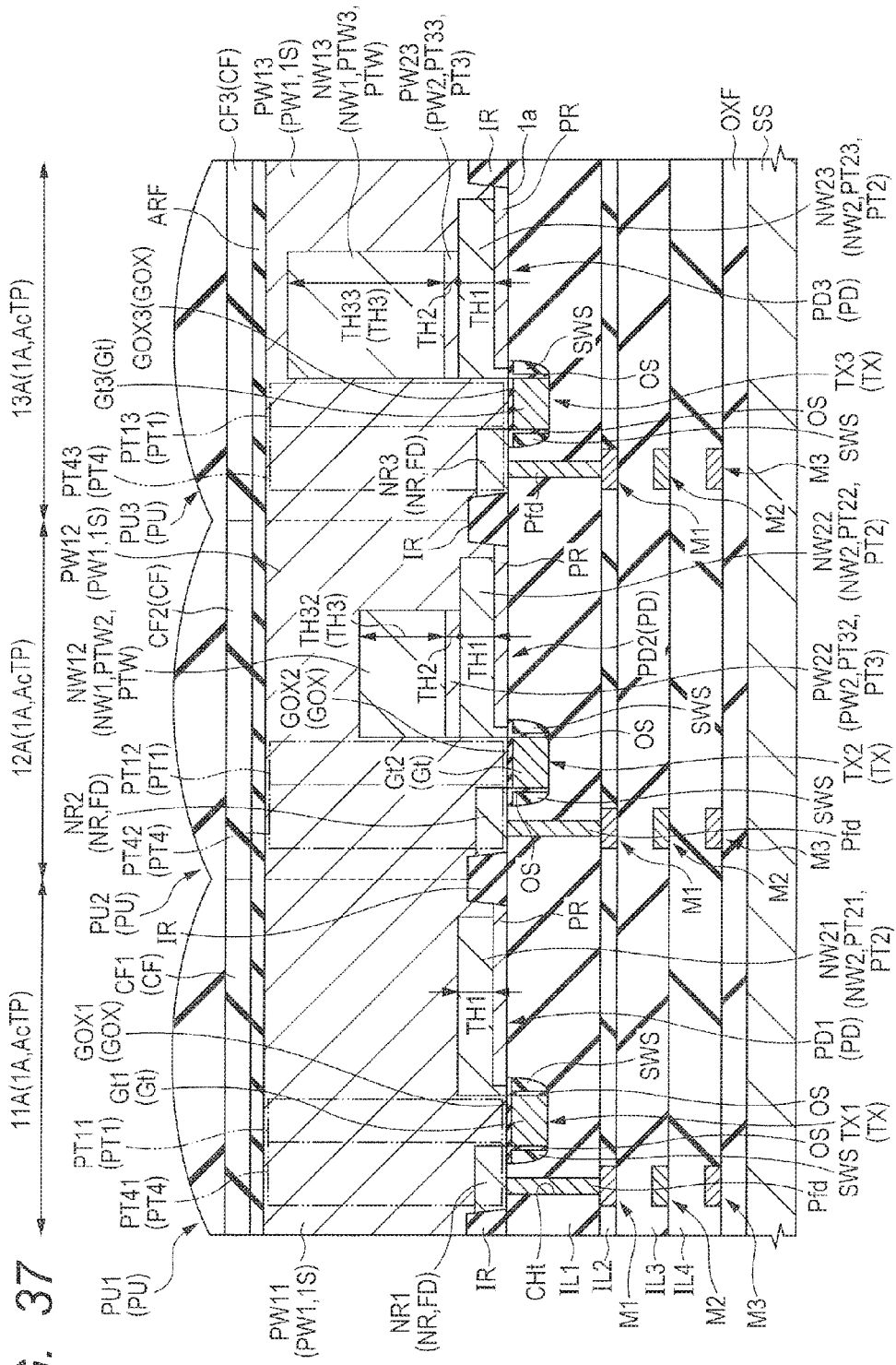
FIG. 37 is a cross-sectional view showing a configuration of a semiconductor device in Embodiment 4.

FIG. 37 is a cross-sectional view showing a configuration of the semiconductor device in Embodiment 4.

As shown in FIG. 37, the semiconductor device in Embodiment 4 is the same as the semiconductor device in Embodiment 3 in that the photodiode PD and the transfer transistor TX are formed in the semiconductor substrate 1S and the interlayer insulating films IL1 to IL4 and the wires M1 to M3 are formed closer to the main surface 1a (lower side in FIG. 37) than to the semiconductor substrate 1S. In addition, in Embodiment 4, an adhesion film OXF is formed in the layer below the interlayer insulating film IL4 and, in the layer below the adhesion film OXF, a supporting substrate SS is disposed.

Also, in embodiment 4, the thickness of the semiconductor substrate 1S is smaller than in Embodiment 1 and, over the back surface (upper surface in FIG. 37) of the semiconductor substrate 1S, the antireflection film ARF formed of, e.g., a silicon oxynitride film is formed. Over the antireflection film ARF, the microlens ML is mounted via the color filter layer CF. Thus, in Embodiment 4, unlike in Embodiment 3, the antireflection film ARF need not be formed closer to the main surface 1a than the photodiode PD. In the example shown in FIG. 37, over the side wall of the gate electrode Gt which is closer to the photodiode PD, the sidewall spacer SWS is formed via the offset spacer OS.

In the pixel region 1A thus configured, when light is incident on the microlens ML, the light incident on the microlens ML reaches the back surface of the semiconductor substrate 1S through the antireflection film ARF. Then, the light that has reached the back surface of the semiconductor substrate 1S enters the semiconductor substrate 1S to illuminate the photodiode PD.

As shown in FIG. 37, the semiconductor in Embodiment 4 has the semiconductor substrate 1S and the active region AcTP formed as the semiconductor region in each of regions 11A, 12A, and 13A of the pixel region 1A in the semiconductor substrate 1S which is closer to the main surface 1a, similarly to the semiconductor device in Embodiment 1. In the active region AcTP, the three pixels PU are formed. That is, similarly to the semiconductor device in Embodiment 3, the semiconductor device in Embodiment 4 also has the pixels PU1, PU2, and PU3 as the three pixels PU. The pixel PU1 is formed in the region 11A, the pixel PU2 is formed in the region 12A, and the pixel PU3 is formed in the region 13A.

In Embodiment 4 also, in the same manner as in Embodiment 3, the wavelength of the incident light beam incident on the pixel PU2 is shorter than the wavelength of the incident light beam incident on the pixel PU1. The wavelength of the incident light beam incident on the pixel PU3 is shorter than the wavelength of the incident light beam incident on the pixel PU2. Accordingly, e.g., the red (R) incident light beam is incident on the pixel PU1, the green (G) incident light beam is incident on the pixel PU2, and the blue (B) incident light beam is incident on the pixel PU3.

The pixel PU1 has the photodiode PD1 as the photodiode PD and the color filter layer CF1 as the color filter layer CF. The pixel PU2 has the photodiode PD2 as the photodiode PD and the color filter layer CF2 as the color filter layer CF. The pixel PU3 has the photodiode PD3 as the photodiode PD and the color filter layer CF3 as the color filter layer CF. The color filter layer CF1 transmits, e.g., the red (R) light beam. The color filter layer CF2 transmits, e.g., the green (G) light beam. The color filter layer CF3 transmits, e.g., the blue (B) light beam.

The photodiode PD1 receives, e.g., the red (R) incident light beam and converts the received light beam to charges. The photodiode PD2 receives, e.g., the green (G) incident light beam and converts the received light beam to charges. The photodiode PD3 receives, e.g., the blue (B) incident light beam and converts the received light beam to charges.

In Embodiment 4, unlike in Embodiment 3, the pixel PU3 has the p-type well PW13 which is a portion of the p-type well PW1, an n$^-$-type semiconductor region NW13 serving as the n$^-$-type semiconductor region NW1, and the gate electrode Gt3 serving as the gate electrode Gt. The pixel PU3 also has the n-type semiconductor region NW23 serving as the n-type semiconductor region NW2, a p$^-$-type semiconductor region PW23 serving as the p$^-$-type semiconductor region PW2, and the higher-concentration n-type semiconductor region NR3 serving as the higher-concentration n-type semiconductor region NR.

The p-type well PW13 is formed in the region 13A of the semiconductor substrate 1S which is closer to the main surface 1a. The n$^-$-type semiconductor region NW13 is formed in a portion PTW3 of the p-type well PW13 which serves as the inner portion PTW. The gate electrode Gt3 is formed over the main surface 1a of the portion PT13 of the p-type well PW13 which serves as the portion PT1 and is located on a fourth side (left side in FIG. 37) of the n$^-$-type semiconductor region NW13 in the gate length direction in plan view via the gate insulating film GOX3 as the gate insulating film GOX. The n-type semiconductor region NW23 is formed in the portion PT23 of the p-type well PW13 which serves as the portion PT2 and is located closer to the main surface 1a than the n$^-$-type semiconductor region NW13. The p$^-$-type semiconductor region PW23 is formed in a portion PT33 of the p-type well PT13 which serves as the PT3 and is located between the n$^-$-type semiconductor region NW13 and the n-type semiconductor region NW23. The higher-concentration n-type semiconductor region NR3 is formed in the portion PT43 of the p-type well PW13 which serves as the portion PT4 and is located opposite to the n$^-$-type semiconductor region NW13 relative to the gate electrode Gt3 interposed therebetween in plan view.

The p-type well PW13, the n$^-$-type semiconductor region NW13, the n-type semiconductor region NW23, and the p$^-$-type semiconductor region PW23 form the photodiode PD3 as the photodiode PD. The gate electrode Gt3 and the higher-concentration n-type semiconductor region NR3 form the transfer transistor TX3 as the transfer transistor TX.

The photodiode PD3 in Embodiment 4 can be the same as the photodiode PD1 in Embodiment 3, i.e., the photodiode PD in Embodiment 1. When, e.g., the blue (B) incident light beam is incident on the pixel PU3, the blue incident light beam incident on the pixel PU3 is incident on the portion of the p-type well PW13 which is further away from the main surface 1a, i.e., the upper portion of the p-type well PW13 in FIG. 37. However, by providing the photodiode PD3 in embodiment 4 as the same photodiode as the photodiode PD in Embodiment 1, even when, e.g., the blue (B) incident light beam incident on the pixel PU3 is incident on the portion of the p-type well PW13 which is further away from the main surface 1a, it is possible to increase the charge transfer efficiency, while ensuring the internal quantum efficiency.

The pixel PU2 has the p-type well PW12 which is a portion of the p-type well PW1, the n$^-$-type semiconductor region NW12 serving as the n$^-$-type semiconductor region NW1, and the gate electrode Gt2 serving as the gate electrode Gt. The pixel PU2 also has the n-type semiconductor region NW22 serving as the n-type semiconductor region NW2, the p$^-$-type semiconductor region PW22 serving as the p$^-$-type semiconductor region PW2, and the higher-concentration n-type semiconductor region NR2 serving as the higher-concentration n-type semiconductor region NR.

The p-type well PW12 is formed in the region 12A of the semiconductor substrate 1S which is closer to the main surface 1a. The p-type well PW12 is formed in the same layer as that of the p-type well PW13. The n$^-$-type semiconductor region NW12 is formed in the portion PTW2 of the p-type well PW12 which serves as the portion PTW to be away from the main surface 1a. The gate electrode Gt2 is formed over the main surface 1a of the portion PT12 of the p-type well PW12 which serves as the portion PT1 and is located on a fifth side (left side in FIG. 37) of the n$^-$-type semiconductor region NW12 in the gate length direction in plan view via the gate insulating film GOX2 serving as the gate insulating film GOX.

The n-type semiconductor region NW22 is formed in a portion PT22 of the p-type well PW12 which serves as the portion PT2 and is located closer to the main surface 1a than the n$^-$-type semiconductor region NW12. The p$^-$-type semiconductor region PW22 is formed in the portion PT32 of the p-type well PW12 which serves as the portion PT3 and is located between the n⁻-type semiconductor region NW12 and the n-type semiconductor region NW22. The higher-concentration n-type semiconductor region NR2 is formed in the portion PT42 of the p-type well PW12 which serves as the portion PT4 and is located opposite to the n⁻-type semiconductor region NW12 relative to the gate electrode Gt2 interposed therebetween in plan view.

The p-type well PW12, the n⁻-type semiconductor region NW12, the n-type semiconductor region NW22, and the p⁻-type semiconductor region PW22 form the photodiode PD2 as the photodiode PD. The gate electrode Gt2 and the higher-concentration n-type semiconductor region NR2 form the transfer transistor TX2 as the transfer transistor TX.

The net impurity concentration in the n⁻-type semiconductor region NW12 is lower than the net impurity concentration in the n-type semiconductor region NW22. The net impurity concentration in the p⁻-type semiconductor region PW22 is lower than the net impurity concentration in the p-type well PW12.

It is assumed that the thickness TH3 of the n⁻-type semiconductor region NW13 in the pixel PU3 is a thickness TH33 and the thickness TH3 of the n⁻-type semiconductor region NW12 in the pixel PU2 is a thickness TH32. At this time, the thickness TH32 is smaller than the thickness TH33. Even in such a case, when the wavelength of, e.g., the green (G) incident light beam incident on the pixel PU2 is longer than the wavelength of, e.g., the blue (B) incident light beam incident on the pixel PU3 and the portion of the PW1 on which the incident light beam incident on the pixel PU2 is closer to the main surface 1a than the portion of the p-type well PW1 on which the incident light beam incident on the pixel PU3 is incident, it is possible to increase the charge transfer efficiency, while ensuring the internal quantum efficiency.

Specifically, the thickness TH33 can be set to, e.g., about 3 μm and the thickness TH32 can be set to, e.g., about 1.5 μm.

On the other hand, in Embodiment 4, unlike in Embodiment 3, the pixel PU1 has the p-type well PW11 which is a portion of the p-type well PW1, the gate electrode Gt1 serving as the gate electrode Gt, the n-type semiconductor region NW21 serving as the n-type semiconductor region NW2, and the higher-concentration n-type semiconductor region NR1 serving as the higher-concentration n-type semiconductor region NR. The pixel PU1 has neither the n⁻-type semiconductor region NW1 nor the p⁻-type semiconductor region PW2.

The p-type well PW11 is formed in the region 11A of the semiconductor substrate 1S which is closer to the main surface 1a. The p-type well PW11 is formed in the same layer as that of the p-type well PW13. The n-type semiconductor region NW21 is formed in the portion PT21 of the p-type well PW11 which is closer to the main surface 1a. The gate electrode Gt1 is formed over the main surface 1a of the portion PT11 of the p-type well PW11 which serves as the portion PT1 and is located on a sixth side (left side in FIG. 37) of the n-type semiconductor region NW21 in the gate length direction in plan view via the gate insulating film GOX1 serving as the gate insulating film GOX. The higher-concentration n-type semiconductor region NR1 is formed in the portion PT41 of the p-type well PW11 which serves as the portion PT4 and is located opposite to the n-type semiconductor region NW21 relative to the gate electrode Gt1 interposed therebetween in plan view.

The p-type well PW11 and the n-type semiconductor region NW21 form the photodiode PD1 as the photodiode PD. The gate electrode Gt1 and the higher-concentration n-type semiconductor region NR1 form the transfer transistor TX1 as the transfer transistor TX.

The pixel PU1 has neither the n⁻-type semiconductor region NW1 nor the p⁻-type semiconductor region PW2. Even in such a case, when the wavelength of the incident light beam incident on the pixel PU1 is longer than the wavelength of the incident light beam incident on the pixel PU2 and the portion of the p-type well PW1 on which the incident light beam incident on the pixel PU1 is closer to the main surface 1a than the portion of the p-type well PW1 on which the incident light beam incident on the pixel PU2 is incident, it is possible to increase the charge transfer efficiency, while ensuring the internal quantum efficiency. In addition, by reducing the thickness TH32 in the pixel PU2 and not forming the n⁻-type semiconductor region NW1 in the pixel PU1, it is possible to prevent or inhibit increases in dark current and white spots.

That is, in Embodiment 4 also, in the same manner as in Embodiment 3, in accordance with the wavelength of light incident on the pixel PU, it is possible to increase the charge transfer efficiency, while optimizing the internal quantum efficiency, and reduce the dark current and the white spots.

<Manufacturing Method of Semiconductor Device>

In a manufacturing method of the semiconductor device in Embodiment 4, first, the same steps as Steps S1 to S6 in FIG. 14 are performed first.

When the same step as Step S3 in FIG. 14 is performed, the n⁻-type semiconductor region NW13 is formed in the region 13A and the n⁻-type semiconductor region NW12 is formed in the region 12A, while the n⁻-type semiconductor region NW1 is not formed in the region 11A. The thickness TH32 of the n⁻-type semiconductor region NW12 in the depth direction is smaller than the thickness TH33 of the n⁻-type semiconductor region NW13 in the depth direction.

Also, when the same step as Step S5 in FIG. 14 is performed, the p⁻-type semiconductor region PW23 is formed in the region 13A and the p⁻-type semiconductor region PW22 is formed in the region 12A, while the p⁻-type semiconductor region PW2 is not formed in the region 11A.

The same steps as Steps S1 to S6 in FIG. 14 can be performed in otherwise the same manner as described in the manufacturing method of the semiconductor device in Embodiment 1.

Next, as shown in FIG. 37, in the pixel region 1A, the sidewall spacers SWS are formed (Step S7 in FIG. 14). In Step S7, the sidewall spacers SWS are formed over the side wall of the gate electrode Gt which is opposite to the photodiode PD and over the side wall of the gate electrode Gt which is closer to the photodiode PD of the gate electrode Gt via the offset spacers OS.

Next, the same step as Step S8 in FIG. 14 is performed to form the higher-concentration n-type semiconductor region NR, as shown in FIG. 37. Then, the same step as Step S9 in FIG. 14 is performed to form the interlayer insulating film IL1, the contact hole CHt, and the plug Pfd, as shown in FIG. 37. Then, the same step as Step S10 in FIG. 14 is performed to form the interlayer insulating films IL2 to IL4 and the wires M1 to M3.

Next, as shown in FIG. 37, with the top surface of the interlayer insulating film IL4 in which the wires M3 are formed facing downward, the supporting substrate SS is disposed over the top surface of the interlayer insulating film IL4 via the adhesion film OXF made of, e.g., a silicon dioxide film. As a result, the semiconductor substrate 1S is fixed to the supporting substrate SS with the back surface of the semiconductor substrate 1S facing upward. Then, as shown in FIG. 37, the back surface of the semiconductor substrate 1S facing upward is ground. This can reduce the thickness of the semiconductor substrate 1S.

Then, as shown in FIG. 37, over the back surface of the semiconductor substrate 1S, the antireflection film ARF made of, e.g., a silicon oxynitride film is formed. Note that, by using a photolithographic technique and an ion implantation method, a p-type impurity such as boron (B) may also be introduced into the back surface of the semiconductor substrate 1S facing upward to form a $p^+$-type semiconductor region between the semiconductor substrate 1S and the antireflection film ARF.

Then, the same step as Step S11 in FIG. 14 is performed to form the color filter layer CF and the microlens ML over the antireflection film ARF, as shown in FIG. 37. In this manner, the semiconductor device in Embodiment 4 can be manufactured.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

What is claimed is:

1. A semiconductor device, comprising:
   a semiconductor substrate;
   a first semiconductor region having a first conductivity type and formed in a main surface of the semiconductor substrate;
   a second semiconductor region having a second conductivity type different from the first conductivity type and formed in the first semiconductor region;
   a first gate electrode formed over a first portion of the first semiconductor region which is located closer to a first side of the second semiconductor region in plan view via a first gate insulating film;
   a third semiconductor region having the second conductivity type and formed in a second portion of the first semiconductor region which is located close to the main surface than the second semiconductor region;
   a fourth semiconductor region having the first conductivity type and formed in a third portion of the first semiconductor region which is located between the second and third semiconductor regions; and
   a fifth semiconductor region having the second conductivity type and formed in a fourth portion of the first semiconductor region which is located opposite to the second semiconductor region relative to the first gate electrode interposed therebetween in plan view,
   wherein the first, second, third, and fourth semiconductor regions form a first photodiode,
   wherein the first gate electrode and the fifth semiconductor region form a first transfer transistor which transfers charges generated in the first photodiode,
   wherein a net impurity concentration in the second semiconductor region which is obtained by subtracting a concentration of an impurity having the first conductivity type from a concentration of an impurity having the second conductivity type is lower than a net impurity concentration in the third semiconductor region which is obtained by subtracting the first-conductivity-type impurity concentration from the second-conductivity-type impurity concentration, and
   wherein a net impurity concentration in the fourth semiconductor region which is obtained by subtracting the second-conductivity-type impurity concentration from the first-conductivity-type impurity concentration is lower than a net impurity concentration in the first semiconductor region which is obtained by subtracting the second-conductivity-type impurity concentration from the first-conductivity-type impurity concentration.

2. The semiconductor device according to claim 1, wherein a thickness of the third semiconductor region is smaller than a thickness of the second semiconductor region, and
wherein a thickness of the fourth semiconductor region is smaller than a thickness of the third semiconductor region.

3. The semiconductor device according to claim 1, wherein the fourth semiconductor region contains a first impurity having the second conductivity type, and
wherein the first semiconductor region contains the first impurity at a concentration lower than a concentration of the first impurity in the fourth semiconductor region or does not contain the first impurity.

4. The semiconductor device according to claim 1, wherein the first gate electrode is formed over the first portion of the first semiconductor region which is located close to the first side than the second semiconductor region in a first direction in plan view via the first gate insulating film, and
wherein the net impurity concentration in the fourth semiconductor region which is obtained by subtracting the second-conductivity-type impurity concentration from the first-conductivity-type impurity concentration is lower than a net impurity concentration in a fifth portion of the first semiconductor region which is obtained by subtracting the second-conductivity-type impurity concentration from the first-conductivity-type impurity concentration, the fifth portion facing the first gate electrode in a second direction perpendicular to the main surface and facing the fourth semiconductor region in the first direction.

5. The semiconductor device according to claim 1, wherein the second semiconductor region is included in the third semiconductor region in plan view.

6. The semiconductor device according to claim 5, wherein the second semiconductor region faces a sixth portion of the third semiconductor region which is located on the first side.

7. The semiconductor device according to claim 5, wherein the first gate electrode is formed over the first portion of the first semiconductor region which is located close to the first side than the second semiconductor region in a third direction in plan view via the first gate insulating film, and
wherein the second semiconductor region faces a middle portion of the third semiconductor region in the third direction.

8. The semiconductor device according to claim 5, wherein the second semiconductor region faces a seventh portion of the third semiconductor region which is located on a side opposite to the first side.

9. The semiconductor device according to claim 5, wherein a plurality of the second semiconductor regions are formed in the first semiconductor region to be spaced apart from each other in plan view,
wherein a plurality of the fourth semiconductor regions are formed respectively in a plurality of the third portions of the first semiconductor region which are located between the third semiconductor region and the second semiconductor regions, wherein the third semiconductor region is formed in the second portion of the first semiconductor region which is located closer to the main surface than the second semiconductor regions, and wherein the second semiconductor regions are included in the third semiconductor region in plan view.

10. The semiconductor device according to claim 1, wherein the first semiconductor region is formed in a first region of the semiconductor substrate which is close to the main surface, the semiconductor device further comprising:

a sixth semiconductor region having the first conductivity type and formed in a second region of the semiconductor substrate which is close to the main surface;

a seventh semiconductor region having the second conductivity type and formed in the sixth semiconductor region;

a second gate electrode formed over an eighth portion of the sixth semiconductor region which is located close to a second side than the seventh semiconductor region in plan view via a second gate insulating film;

an eighth semiconductor region having the second conductivity type and formed in a ninth portion of the sixth semiconductor region which is located closer to the main surface than the seventh semiconductor region;

a ninth semiconductor region having the first conductivity type and formed in a tenth portion of the sixth semiconductor region which is located between the seventh and eighth semiconductor regions; and a tenth semiconductor region having the second conductivity type and formed in an eleventh portion of the sixth semiconductor region which is located opposite to the seventh semiconductor region relative to the second gate electrode interposed therebetween in plan view, wherein the sixth, seventh, eighth, and ninth semiconductor regions form a second photodiode, wherein the second gate electrode and the tenth semiconductor region form a second transfer transistor which transfers charges generated in the second photodiode, wherein the first photodiode receives first incident light and converts the first incident light to charges, wherein the second photodiode receives second incident light having a wavelength shorter than a wavelength of the first incident light and converts the second incident light to charges, wherein a net impurity concentration in the seventh semiconductor region which is obtained by subtracting the first-conductivity-type impurity concentration from the second-conductivity-type impurity concentration is lower than a net impurity concentration in the eight semiconductor region which is obtained by subtracting the first-conductivity-type impurity concentration from the second-conductivity-type impurity concentration, wherein a net impurity concentration in the ninth semiconductor region which is obtained by subtracting the second-conductivity-type impurity concentration from the first-conductivity-type impurity concentration is lower than a net impurity concentration in the sixth semiconductor region which is obtained by subtracting the second-conductivity-type impurity concentration from the first-conductivity-type impurity concentration, and wherein a thickness of the seventh semiconductor region is smaller than a thickness of the second semiconductor region.

11. A method of manufacturing a semiconductor device, comprising the steps of:

(a) providing a semiconductor substrate;

(b) forming a first semiconductor region having a first conductivity type in a main surface of the semiconductor substrate;

(c) forming a second semiconductor region having a second conductivity type different from the first conductivity type in the first semiconductor region;

(d) forming a gate electrode over a first portion of the first semiconductor region which is located close to a first side than the second semiconductor region in plan view via a gate insulating film;

(e) forming a third semiconductor region having the second conductivity type in a second portion of the first semiconductor region which is located closer to the main surface than the second semiconductor region and forming a fourth semiconductor region having the first conductivity type in a third portion of the first semiconductor region which is located between the second and third semiconductor regions; and (f) forming a fifth semiconductor region having the second conductivity type in a fourth portion of the first semiconductor region which is located opposite to the second semiconductor region relative to the gate electrode interposed therebetween in plan view, wherein the first, second, third, and fourth semiconductor regions form a photodiode, wherein the gate electrode and the fifth semiconductor region form a transfer transistor which transfers charges generated in the photodiode, wherein a net impurity concentration in the second semiconductor region which is obtained by subtracting a concentration of an impurity having the first conductivity type from a concentration of an impurity having the second conductivity type is lower than a net impurity concentration in the third semiconductor region which is obtained by subtracting the first-conductivity-type impurity concentration from the second-conductivity-type impurity concentration, and wherein a net impurity concentration in the fourth semiconductor region which is obtained by subtracting the second-conductivity-type impurity concentration from the first-conductivity-type impurity concentration is lower than a net impurity concentration in the first semiconductor region which is obtained by subtracting the second-conductivity-type impurity concentration from the first-conductivity-type impurity concentration.

12. The method of manufacturing the semiconductor device according to claim 11, wherein a thickness of the third semiconductor region is smaller than a thickness of the second semiconductor region, and wherein a thickness of the fourth semiconductor region is smaller than a thickness of the third semiconductor region.

13. The method of manufacturing the semiconductor device according to claim 11, wherein the step (b) includes ion-implanting a first impurity having the first conductivity type into the main surface of the semiconductor substrate to form the first semiconductor region, wherein the step (c) includes ion-implanting a second impurity having the second conductivity type into a fifth portion of the first semiconductor region to form the second semiconductor region, wherein the step (e) includes ion-implanting a third impurity having the second conductivity type into the second portion to form the third semiconductor region, and wherein the step (b) includes ion-implanting the first impurity into the third portion, the step (c) includes ion-implanting the second impurity into the third portion such that an amount of the second impurity ion-implanted into the third portion is smaller than an amount of the second impurity ion-implanted into the fifth portion, and the step (e) includes ion-implanting the third impurity into the third portion such that an amount of the third impurity ion-implanted into the third portion is smaller than an amount of the third impurity ion-implanted into the second portion to form the fourth semiconductor region in the third portion.

14. The method of manufacturing the semiconductor device according to claim 13, wherein the step (e) includes the steps of:
(e1) ion-implanting the third impurity into the second portion; and
(e2) ion-implanting a fourth impurity having the first conductivity type into the third portion, and wherein the step (b) includes ion-implanting the first impurity into the third portion, the step (c) includes ion-implanting the second impurity into the third portion such that the amount of the second impurity ion-implanted into the third portion is smaller than the amount of the second impurity ion-implanted into the fifth portion, the step (e1) includes ion-implanting the third impurity into the third portion such that the amount of the third impurity ion-implanted into the third portion is smaller than the amount of the third impurity ion-implanted into the second portion, and the step (e2) includes ion-implanting the fourth impurity into the third portion to form the fourth semiconductor region in the third portion.

15. The method of manufacturing the semiconductor device according to claim 11, wherein the step (d) includes forming the gate electrode over the first portion of the first semiconductor region which is located close to the first side than the second semiconductor region in a first direction in plan view via the gate insulating film, and wherein the net impurity concentration in the fourth semiconductor region which is obtained by subtracting the second-conductivity-type impurity concentration from the first-conductivity-type impurity concentration is lower than a net impurity concentration in a sixth portion of the first semiconductor region which is obtained by subtracting the second-conductivity-type impurity concentration from the first-conductivity-type impurity concentration, the sixth portion facing the gate electrode in a second direction perpendicular to the main surface and facing the fourth semiconductor region in the first direction.

* * * * *